United States Patent
Tsuchida et al.

(10) Patent No.: US 7,394,243 B2
(45) Date of Patent: Jul. 1, 2008

(54) PROXIMITY SENSOR

(75) Inventors: Hiroyuki Tsuchida, Kyoto (JP);
Yasushi Matsuoka, Kyoto (JP);
Chikashi Niimi, Kyoto (JP); Kazuhiro Hayashi, Kyoto (JP); Kazuaki Miyamoto, Kyoto (JP); Hiroyuki Fujinaga, Kyoto (JP); Toru Aoki, Kyoto (JP); Arata Nakamura, Kyoto (JP);
Kazushi Tanase, Kyoto (JP); Koro Kitajima, Kyoto (JP); Giichi Konishi, Kyoto (JP); Masayuki Kono, Kyoto (JP); Takashi Otsuka, Kyoto (JP);
Masayuki Kitanaka, Kyoto (JP);
Masahiko Shibayama, Kyoto (JP);
Yukio Yamaguchi, Kyoto (JP)

(73) Assignee: Omron Corporation, Kyoto-Shi (JP)

( * ) Notice: Subject to any disclaimer, the term of this patent is extended or adjusted under 35 U.S.C. 154(b) by 955 days.

(21) Appl. No.: 10/471,558

(22) PCT Filed: Mar. 15, 2002

(86) PCT No.: PCT/JP02/02472

§ 371 (c)(1),
(2), (4) Date: Sep. 12, 2003

(87) PCT Pub. No.: WO02/075763

PCT Pub. Date: Sep. 26, 2002

(65) Prior Publication Data

US 2006/0059056 A1    Mar. 16, 2006

(51) Int. Cl.
G01R 33/12 (2006.01)
G01B 7/14 (2006.01)
(52) U.S. Cl. .............................. 324/207.15; 324/207.13; 324/239; 324/258

(58) Field of Classification Search ..................
324/207.11–207.13, 207.24–207.26, 207.15,
324/234, 239, 257–258; 73/514.16, 514.31,
73/514.39
See application file for complete search history.

(56) References Cited

U.S. PATENT DOCUMENTS 5,801,530 A    9/1998    Crosby et al.

FOREIGN PATENT DOCUMENTS

| DE | 19 15 044 A1 | 10/1970 |
| DE | 32 28 524 A1 | 2/1984 |
| GB | 2067295 A  * | 7/1981 |
| JP | 51-36683 Y2  | 9/1976 |

(Continued)

*Primary Examiner*—Bot LeDynh
(74) *Attorney, Agent, or Firm*—Foley & Lardner LLP

(57) ABSTRACT

A proximity sensor 717 comprising a combination of an arbitrarily selected one of a plurality of types of detection end modules 707, a plurality of types of output circuit modules 709 and a plurality of types of outer shell cases 711. The detection end module 707 includes an integrated arrangement having a detection coil assembly (705, 701, 702) with the detection characteristic self-completed by a mask conductor 700 for reducing the conductor detection sensitivity in a specific peripheral area where the outer shell case is assumed to exist, and a detection circuit assembly (703) with the coil of the detection coil assembly as a resonance circuit element. The characteristics of the proximity sensor are completely adjusted before shipment. As a result, the adjustment of the characteristics which otherwise might be required each time is eliminated even in the case of the combination with an outer shell case of a different material. Thus, the commodity design and production are facilitated for a great variety of commodity specifications.

18 Claims, 60 Drawing Sheets

FOREIGN PATENT DOCUMENTS

| | | |
|---|---|---|
| JP | 62-49691 | 10/1987 |
| JP | 63-105422 A | 5/1988 |
| JP | 03-058839 | 6/1991 |
| JP | 03-058840 | 6/1991 |
| JP | 4-2022 A | 1/1992 |
| JP | 5-89756 A | 4/1993 |
| JP | 5-144355 A | 6/1993 |
| JP | 2001-155604 A | 6/2001 |

* cited by examiner

| | Distance range × 1 | | | | Distance range × 1.5 | | | | Distance range × 2 | | | |
|---|---|---|---|---|---|---|---|---|---|---|---|---|
| | Shielded | | Unshielded | | Shielded | | Unshielded | | Shielded | | Unshielded | |
| | Reference frequency | Different frequency | Reference frequency | Different frequency | Reference frequency | Different frequency | Reference frequency | Different frequency | Reference frequency | Different frequency | Reference frequency | Different frequency |
| M8 | ○ | — | ○ | — | ○ | — | ○ | — | ○ | — | ○ | — |
| M12 | ○ | ○ | ○ | ○ | ○ | ○ | ○ | ○ | ○ | ○ | ○ | ○ |
| M18 | ○ | ○ | ○ | ○ | ○ | ○ | ○ | ○ | ○ | ○ | ○ | ○ |
| M30 | ○ | ○ | ○ | ○ | ○ | ○ | ○ | ○ | ○ | ○ | ○ | ○ |

Fig. 46

|  |  | Distance range magnification | | |
|---|---|---|---|---|
|  |  | ×1 | ×1.5 | ×2 |
|  |  | Detection distance (mm) | | |
| M8 | Shielded | 1.5 | 2 | 2 |
|  | Unshielded | 2 | 4 | 4 |
| M12 | Shielded | 2 | 3 | 4 |
|  | Unshielded | 5 | 8 | 8 |
| M18 | Shielded | 5 | 7 | 8 |
|  | Unshielded | 10 | 14 | 16 |
| M30 | Shielded | 10 | 10 | 15 |
|  | Unshielded | 18 | 20 | 30 |

Fig. 47

| | Short body | | | | | | Long body | | | | | |
|---|---|---|---|---|---|---|---|---|---|---|---|---|
| | Stainless steel | | Brass | | Stainless steel | | Brass | | | | | |
| | Shielded | Unshielded | Shielded | Unshielded | Shielded | Unshielded | Shielded | Unshielded | | | | |
| M8 | ○ | ○ | – | – | ○ | ○ | – | – | | | | |
| M12 | ○ | – | ○ | ○ | ○ | – | ○ | ○ | | | | |
| M18 | ○ | – | ○ | ○ | ○ | – | ○ | ○ | | | | |
| M30 | ○ | – | ○ | ○ | ○ | – | ○ | ○ | | | | |

| | PNP open collector output | | | | NPN open collector output | | | |
|---|---|---|---|---|---|---|---|---|
| | NO | | NC | | NO | | NC | |
| | DC10-30V | DC10-55V | DC10-30V | DC10-55V | DC10-10V | DC10-55V | DC10-30V | DC10-55V |
| M8 | O | — | O | — | O | — | O | — |
| M12 | O | O | O | O | O | O | O | O |
| M18 | O | O | O | O | O | O | O | O |
| M30 | O | O | O | O | O | O | O | O |

(b)

| | DC two-line | | | | NPN voltage output | | PNP voltage output | |
|---|---|---|---|---|---|---|---|---|
| | NO | | NC | | NO | NC | NO | NC |
| | Not self-diagnosed | Self-diagnosed | Not self-diagnosed | Self-diagnosed | DC10-30V | DC10-30V | DC10-30V | DC10-30V |
| M8 | O | — | O | — | O | O | O | O |
| M12 | O | O | O | — | O | O | O | O |
| M18 | O | O | O | — | O | O | O | O |
| M30 | O | O | O | — | O | O | O | O |

Fig. 49

| | Prewire 2m | Prewire 5m | Special cable 2m | Connector relay M12 | M12 connector 4pin | Connector relay M8 | M8 connector 4pin |
|---|---|---|---|---|---|---|---|
| M8 | ○ | ○ | ○ | ○ | ○ | ○ | ○ |
| M12 | ○ | ○ | ○ | ○ | ○ | — | — |
| M18 | ○ | ○ | ○ | ○ | ○ | — | — |
| M30 | ○ | ○ | ○ | ○ | ○ | — | — |

Fig. 50

| Item | Unit | Sensor 1 | Sensor 2 | Sensor 3 |
|---|---|---|---|---|
| Detection method | | HF oscillation type | HF oscillation type | HF oscillation type |
| Shape | | Cylindrical type | Cylindrical type | Cylindrical type |
| Series | | Type E2E | Type E2E | Type E2E |
| Catalog type | | Type E2E-X3D1S | Type E2E-X2ME1 | Type E2E-X10T1 |
| Standard price | (Yen) | ¥7,900 | ¥5,900 | ¥13,300 |
| Power supply/output type | | DC two-line | DC three-line | AC-DC two-line |
| Size | | M12 | M8 | M30 |
| Provisional drawing No. CAD file | | 38 | 40 | 42 |
| Shielded/unshielded | | Shielded type | Unshielded type | Shielded type |
| Connection method | | Cord lead type | Cord lead type | Cord lead type |
| Standard cord length | (m) | 2 | 2 | 2 |
| Rated detection distance (maximum) | (mm) | 3 | 2 | 10 |
| Rated detection distance (minimum) | (mm) | 0 | 0 | 0 |
| Rated detection distance change | (%) | ± 10 | ± 10 | ± 10 |
| Set distance (maximum) | (mm) | 2.4 | 1.6 | 8 |
| Set distance (minimum) | (mm) | 0 | 0 | 0 |
| Hysteresis distance | (%) | 10 | 10 | 10 |
| Detected object | | Magnetic metal | Magnetic metal | Magnetic metal |
| Standard detected object | | Iron 12 × 12 × 1 mm | Iron 12 × 12 × 1 mm | Iron 30 × 30 × 1 mm |
| Rated source voltage | | DC 12 to 24 V ripple (p-p) 10% or less | DC 12 to 24 V ripple (p-p) 10% or less | DC24 - 240V, AC48 - 240V |
| Operating voltage range | | DC10 - 30V | DC10 - 40V | DC20 - 264V, AC40 - 264V |
| ⋅ ⋅ ⋅ | ⋅ ⋅ ⋅ | ⋅ ⋅ ⋅ | ⋅ ⋅ ⋅ | ⋅ ⋅ ⋅ |

| Item | Unit | Detection end module 1 | Detection end module 2 | Detection end module 3 |
|---|---|---|---|---|
| Size | | M8 | M12 | M30 |
| Shielded/unshielded | | Shielded | Shielded | Unshielded |
| Rated detection distance (maximum) | (mm) | 1.5 | 2 | 18 |
| Rated detection distance (minimum) | (mm) | 0 | 0 | 0 |
| | (%) | ±10 | ±10 | ±10 |
| Set distance (maximum) | (mm) | 1.2 | 1.6 | 14 |
| Set distance (minimum) | (mm) | 0 | 0 | 0 |
| Hysteresis distance | (%) | 10 | 10 | 10 |
| Detected object | | Magnetic metal | Magnetic metal | Magnetic metal |
| ‥ | ‥ | ‥ | ‥ | ‥ |

(b)

| Item | Unit | Outer shell case 1 | Outer shell case 2 | Outer shell case 3 |
|---|---|---|---|---|
| Size | | M12 | M8 | M30 |
| Shielded/unshielded | | Shielded type | Unshielded type | Shielded type |
| Case material | | Brass | SUS303 | Brass |
| ‥ | ‥ | ‥ | ‥ | ‥ |

(c)

| Item | Unit | Output circuit module 1 | Output circuit module 2 | Output circuit module 3 |
|---|---|---|---|---|
| Power supply/output type | | DC two-line | DC three-line | DC three-line |
| Rated source voltage | | DC 12 to 24 V rippled (p-p) 10 % or less | DC 12 to 24 V rippled (p-p) 10 % or less | DC 12 to 24 V rippled (p-p) 10 % or less |
| Operating voltage range | | DC10 - 30V | DC10 - 30V | DC10 - 55V |
| Control output, output status | | NPN output | NPN output | PNP open collector output |
| Operation status | | NO | NO | NC |
| ‥ | ‥ | ‥ | ‥ | ‥ |

Fig. 52

| Outer diameter | Case material | Shield | Detection distance | Output status | Connecting line | Connection method | Length | Environment | Special |
|---|---|---|---|---|---|---|---|---|---|
| Not designated | Not designated | Not designated | Not designated | Not designated | Not designated | Not designated | Not designated | Not designated | Not designated |
| M8 | SUS | Shielded | 0–1.5mm | Two-line with pole | DC two-line | Prewire | 2m | General environment | Self-diagnosed |
| M12 | Brass | Unshielded | 2–3mm | Two-line without pole | DC three-line | Special cable | 5m | | Different frequency |
| M18 | | | 4–5mm | NPN open collector | | Connector relay M12 | | | |
| M30 | | | 6–10mm | NPN open collector | | M12 connector 4 pin | | | |
| | | | 11–14mm | NPN voltage | | Connector relay M8 | | | |
| | | | 15–18mm | PNP voltage | | M8 connector 4 pin | | | |
| | | | 19–20mm | | | | | | |
| | | | 20 mm or more | | | | | | |

Fig. 55

Search result

Return

| Type | Dimension | Shield | Detection distance | Operation status | Output status | Connection | Standard price | Standard stock | Delivery time |
|---|---|---|---|---|---|---|---|---|---|
| E2E-X7D1 | M18 | Shield | 7mm | NO | DC two-line | Cord lead | ¥7,000 | ◎ | Delivered next day |
| E2E-X14MD1 | M18 | Unshielded | 14mm | NC | DC two-line | Cord lead | ¥7,000 | ◎ | Delivered next day |
| E2E-X7D2 | M18 | Shield | 7mm | NO | DC two-line | Cord lead | ¥7,000 | | Shipped 5 days after |
| E2E-X14MD2 | M18 | Unshielded | 14mm | NC | DC two-line | Cord lead | ¥7,000 | | Shipped 5 days after |

Order commodity to ○○ Co., Ltd.

Fig. 56

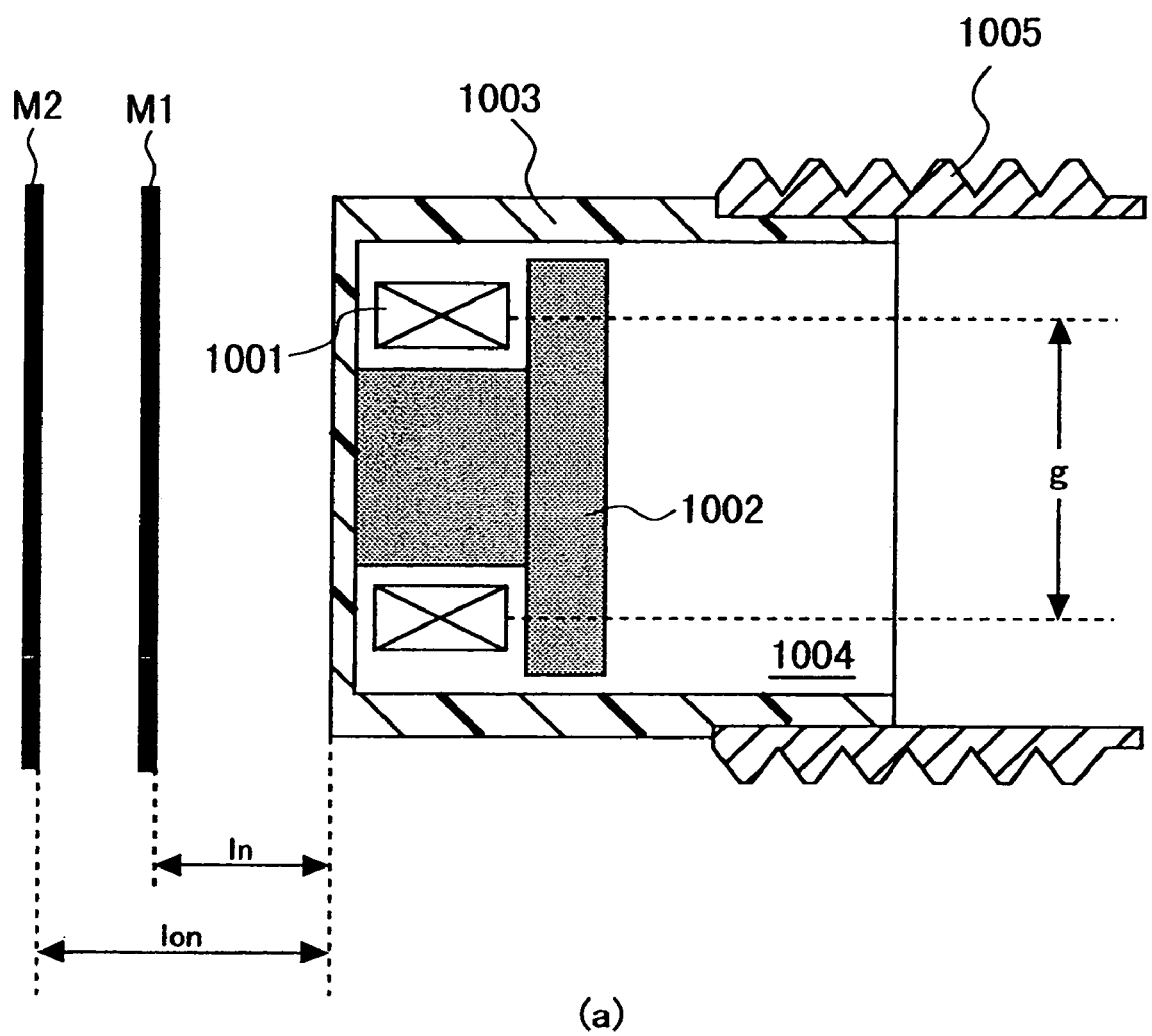
(a)
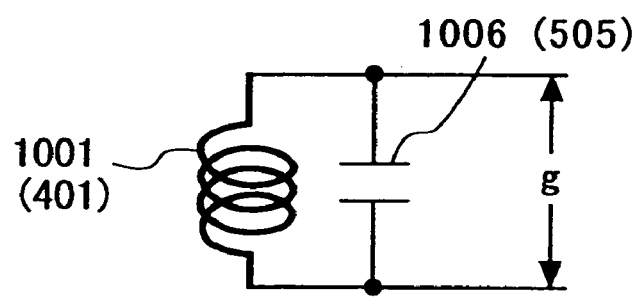
(b)
Fig. 58

PROXIMITY SENSOR

This application is a national stage filing under 35 U.S.C. 371 of International Application No. PCT/JP02/02472 filed 15 Mar., 2002, which claims priority to Japanese Patent Application No. 2001-75117 filed 15 Mar., 2001, the contents of which are incorporated herein by reference.

TECHNICAL FIELD

The present invention relates to a proximity sensor of induction type for detecting the approach of a metal object or the like in a contactless fashion, through a magnetic field, or in particular to a proximity sensor and modules used for the proximity sensor realized in a wealth of production lines while reducing the production cost.

BACKGROUND ART

The basic component elements of a proximity sensor include a detection coil assembly having a coil and a core, an oscillation circuit unit, an output circuit unit and an outer shell case for accommodating these elements. In order to meet the users' demand for a wide range of product specifications in versatile way, the makers are required to reduce the cost by concentrating the basic component parts as far as possible.

In promoting the cost reduction by concentration of the component parts of a proximity sensor, various problems unique to the proximity sensor are posed from the viewpoints of both magnetic and electric circuits.

With regard to the magnetic circuit, for example, the cost reduction by the concentration of component parts poses the following problems in respect of the characteristics and structure of the detection coil assembly.

The proximity sensor of induction type has a detection coil assembly responsive to the approach of a metal. This detection coil assembly includes a coil and a ferrite core. The approach of a metal is detected utilizing the change in the characteristic of the detection coil assembly. The body case (outer shell case) of the proximity sensor is formed of any of various materials including brass, stainless steel and resin due to the variety of the operating environments. The detection performance of the proximity sensor changes also with the outer diameter of the detection coil assembly. For this reason, many variations of the detection coil assembly of cylindrical type having different outer diameters are prepared including M8 (about 8 mm in outer diameter), M12 (about 12 mm in outer diameter) and M30 (about 30 mm in outer diameter).

The detection characteristic of the detection coil assembly of the proximity sensor of induction type is affected to a large measure by the variations in the material and the dimensions of the body case (outer shell case), the plating thickness of the body case and the relative assembly positions of the detection coil assembly and the body case. As a result, the various problems are encountered as described below.

(1) To provide products of different materials, shapes and sizes of the body case, the detection coil assembly and the oscillation circuit are required to be designed both individually and as need arises. This leads to an increased number of design steps and an increased cost on the one hand and an increased parts cost due to the difficulty of parts concentration on the other. The production line is also required to be designed individually, thereby requiring a plurality of lines and steps.

(2) To eliminate the variations of the detection distance, the relative positions of the detection coil assembly and the body case are required to be accurate, the quality such as the dimensional accuracy of the body case must be improved, and an ingenious method of adjusting the detection distance is required, thereby leading to a higher parts cost and an increased number of production steps and production cost.

The above-mentioned problem points of the proximity sensor of induction type will be discussed in more detail below with reference to several specific examples of the detection coil assembly.

Detection Coil Assembly According to Prior Art 1:

FIG. 23 shows a structure of the detection coil assembly of shielded type (which is defined as the one capable of being buried in a metal on which it is mounted) having a metal body case.

In this drawing, numeral 101 designates a cylindrical body case (outer shell case) of a metal such as brass or stainless steel, numeral 101a a male screw formed on the outer peripheral surface of the body case, numeral 102 a ferrite core, numeral 103 a coil making up a detection coil, and numeral 104 an insulating internal case in the shape of a bottomed cylinder for accommodating the core 102 and the coil 103.

In the detection coil assembly of this structure, the detection characteristic of the detection coil assembly varies to a large measure depending on the material of the body case 101 located on the outer periphery of the coil 103 and the core 102. This is probably because the body case 101 is also located in the magnetic field formed by the coil 103.

The detection characteristic of the detection coil assembly according to the prior art 1 is shown in the graph of FIG. 24. This graph is plotted based on the measurement data of the detection coil assembly of M8 shielded type. The abscissa represents the detection distance (mm) and the ordinate the conductance g (μS) of the detection coil. The conductance of the detection coil increases with the approach of a metal object. The proximity sensor operates on the principle that a detection signal is generated by utilizing the change in the conductance g of the detection coil. As apparent from this graph, variations of the material of the body case 101 including resin (nonmetal), brass and stainless steel are seen to greatly change the conductance characteristic (i.e. detection characteristic) correspondingly. From this, it will be understood that the circuit constants (the constants and the threshold value of the oscillation amplitude of the oscillation circuit, etc.) of the detection circuit are required to be changed in accordance with the material of the body case 101, thereby making it difficult to concentrate the parts.

FIG. 25 shows a structure of a detection coil assembly of unshielded type having a metal body case (defined as the one not suitable for use in the form buried in a mounting metal and having a longer detection distance than the shielded type).

In this drawing, numeral 107 designates a cylindrical body case (outer shell case) of a metal such as brass or stainless steel, numeral 107a a male screw formed on the outer peripheral surface of the body case, numeral 102 a ferrite core, numeral 103 a coil making up a detection coil, and numeral 108 a coil case in the shape of a bottomed cylinder made of resin for accommodating the coil 103 and the core 102. As apparent from the drawing, the resin coil case 108 has a structure protruded forward of the metal body case 107.

In the detection coil assembly of this structure, the difference in material of the body case 107 located rearward of the coil 103 and the core 102 greatly changes the detection characteristic of the detection coil assembly.

The detection characteristic of the detection coil assembly according to the prior art 2 is shown in the graph of FIG. 26. This graph is plotted based on the measurement data of the detection coil assembly of M8 unshielded type. The abscissa represents the detection distance (mm), and the ordinate the conductance g (μS) of the detection coil. The approach of a metal object increases the conductance g of the detection coil. The proximity sensor operates on the principle that a detection signal is generated utilizing the change of the conductance g of the detection coil. As apparent from this graph, the different materials including resin (nonmetal), brass and stainless steel of the body case 107 are known to result in correspondingly quite different conductance characteristics (i.e. different detection characteristics). From this, it will be understood that the circuit constants (the constants, the threshold value of the oscillation amplitude of the oscillation circuit, etc.) of the detection circuit are required to be changed in accordance with the material of the body case 107, thereby making it difficult to concentrate the parts.

Next, from the viewpoint as an electrical circuit, the reduction in cost by concentration of component parts encounters the following problem due to the configuration of the oscillation circuit and the output circuit as well as the characteristic and structure of the detection coil assembly.

As described already, the oscillation conditions of the oscillation circuit including the coil of the induction-type proximity sensor change with the approach of a metal object. By detecting the change of the oscillation conditions, therefore, a metal object is detected. In the proximity sensor of induction type, the detection performance also changes with the outer diameter of the coil of the detection coil assembly. Therefore, variations of proximity sensor having different outer diameters are prepared. As a result, the oscillation circuit constant is determined for each coil outer diameter used or the detection distance adjusted.

On the other hand, assume a sensor application at the production site, etc. in which the presence or absence of a metal work is detected and various actuators are controlled by this detection signal. The configuration of the power line and the signal line connected to the proximity sensor is divided into DC three-line type, DC two-line type and AC two-line type to suit various situations. Also, the output status is classified into NPN or PNP type, voltage output or current output type, detection-related drive type or nondetection-related drive type, etc. In commercializing a proximity sensor, therefore, many circuit variations are prepared in accordance with the power form and output status of the respective proximity sensors. In keeping with the demand for a compact proximity sensor, the latest trend is toward concentration of the oscillation circuit, the power supply, the output circuit, etc. into a one-chip IC.

With this background, in designing a proximity sensor, an attempt to renew a given function (such as an increased detection distance, a reduced circuit current consumption, a lower voltage for driving the power supply driven, etc.) is accompanied by the need of remaking all the circuits of the proximity sensor into a one-chip IC. In addition, to meet the great commodity variations, the constants of the parts built around the IC and the coil constant require redesigning. As a result, the following various problems present themselves.

(1) The development cost of a new commodity is tremendously high.
(2) The commodities meeting the operating conditions of the user of the proximity sensor cannot be provided immediately.
(3) The vast commodity variations and the resulting multi-item scant production, which increases the production cost, the management cost and the parts cost, lead to a higher overall production cost.
(4) The replacement design and the acquisition work in case of suspension of the parts production are vast in amount.
(5) In the case where a quality problem shared by various products arises, the requirements for all the commodities cannot be quickly met.

The above-mentioned problem points of the proximity sensor of induction type will be explained in more detail with reference to several specific examples of the oscillation and output circuits.

Proximity Sensor Circuit According to Prior Art 1:

FIG. 27 shows a circuit configuration of a proximity sensor of DC three-line type. In this drawing, numeral 200 designates a metal object (such as a metal work), numeral 201 a custom IC, numeral 202 an oscillation circuit, numeral 203 an integration circuit, numeral 204 a discrimination circuit, numeral 205 a logic circuit, numeral 206 an output control circuit, numeral 207 a constant voltage circuit, numeral 208 a power reset circuit, numeral 209 a shorting protection circuit, numeral 210 a display circuit, numeral 211 a detection coil, numeral 212 a capacitor making up a resonance circuit, numeral 213 a regulation circuit, numeral 214 a capacitor making up an integration circuit, numeral 215 an output transistor, numeral 216 a light-emitting element, numeral 217 a first power terminal, numeral 218 a second power terminal, and numeral 219 a signal output terminal.

Proximity Sensor Circuit According to Prior Art 2:

FIG. 28 shows a circuit configuration of a proximity sensor of DC two-line type. In this drawing, numeral 220 designates a metal object (such as a metal work), numeral 221 a custom IC, numeral 222 an oscillation circuit, numeral 223 an integration circuit, numeral 224 a discrimination circuit, numeral 225 a logic circuit, numeral 226 an output control circuit, numeral 227 a constant voltage circuit, numeral 228 a power reset circuit, numeral 229 a shorting protection circuit, numeral 230 a display circuit, numeral 231 a detection coil, numeral 232 a capacitor making up a resonance circuit, numeral 233 a regulation circuit, numeral 234 a capacitor making up an integration circuit, numeral 235 an output transistor, numerals 236, 237 light-emitting elements, numeral 238 a first power terminal, and numeral 239 a second power terminal.

The prior art 1 and the prior art 2 described above share substantially all the circuit elements except for the difference in power system. As a representative of the two, therefore, the configuration and operation of the circuit elements of the prior art 2 shown in FIG. 28 will be explained below.

The detection coil 231 is a solid copper wire or twisted Litz wire wound by an appropriate number of turns. The resonance capacitor 232 is connected in parallel to the detection coil 231 and makes up a LC parallel resonance circuit, which is connected to the oscillation circuit 222. The custom IC 221 is an IC (integrated circuit) with the main circuits of the proximity sensor built in one chip. This custom IC 221 has built therein the oscillation circuit 222, the integration circuit 223, the discrimination circuit 224, the logic circuit 225, the output control circuit 226, the constant voltage circuit 227, the power reset circuit 228, the shorting protection circuit 229 and the display circuit 230. The regulation circuit 223 includes a plurality of resistors combined. By changing the resistance value of a part of the resistors by replacement or by laser trimming or otherwise, the gain of the oscillation circuit 222 is changed, thereby making it possible to adjust the detection sensitivity of the proximity sensor. The integration capacitor 234 is combined with the integration circuit 223 to make up a CR integration circuit. The output transistor 235 generates a large drive current based on the control signal (CONT) output from the custom IC 221. Numeral 236 designates an operation indication lamp for indicating the output operating conditions of the proximity sensor. Numeral 237 designates a setting indication lamp indicating a set position which assures positive detection against any variations of the detection distance due to the operating environment. Numerals 238, 239 designate power supply terminals led out of the proximity sensor through a cord and a connector. This case involves a two-line proximity sensor, and therefore the first power terminal 238 doubles as an output terminal.

FIG. 29 shows an example of a specific circuit configuration of the oscillation circuit, the integration circuit and the discrimination circuit according to the prior art 2 shown in FIG. 28. FIG. 30 is an operation time chart for the circuits shown in FIG. 29.

As shown in these diagrams, the oscillation voltage ((b) of FIG. 30) of the oscillation circuit 222 is smoothed by the integration circuit 223. The output ((c) of FIG. 30) thus smoothed is binarized by being compared with the reference voltages C and D of the discrimination circuit 224, thereby producing the detection signals E and F in binary form ((d), (e) of FIG. 30).

These detection signals E, F are sent to the output control circuit 226 through the logic circuit 225, and controls the output transistor 235 thereby to turn on/off the output 238 of the proximity sensor ((f) of FIG. 30), while at the same time turning on/off the operation indication lamp 236 and the setting indication lamp 237 ((g), (h) of FIG. 30).

The oscillation circuit 222 has such a characteristic that the oscillation amplitude thereof is changed substantially linearly in accordance with the distance by which a metal object approaches. As long as the metal object 230 has not approached, the oscillation amplitude A ((b) of FIG. 30) is sufficiently large, and the binarized detection signals E, F are off ((d), (e) of FIG. 30). With the approach of the metal object 230, the oscillation amplitude A and the integration output B are reduced gradually with the distance covered by the approach. In the case where the integration output B is reduced to or below the reference voltage C, the detection signal E is turned on. In the case where the integration output B is reduced to or below the reference voltage D, on the other hand, the detection signal F is turned on. The detection signals E, F are logically processed in the logic circuit 225 shown in FIG. 28 and sent to the output control circuit 226. After that, the output control circuit 226 operates to drive the output transistor 235.

The constant voltage circuit 227 is supplied with power from the power terminals 238, 239 and thus generates a constant voltage output while at the same time driving each internal circuit. On the other hand, a minimum required voltage is kept in the power terminal to drive the circuit when the output is turned on. The power reset circuit 228 prohibits the output during the period from the time when power is supplied from an external source to the time when the constant voltage output is stabilized. The shorting protection circuit 229, with the output terminal 238 thereof connected directly to the power supply, detects that an excess current has flowed in the output transistor 235, and activates the power reset circuit 238, thereby prohibiting the output.

The assumption of the circuit configuration described above will further facilitate the understanding of the problem points encountered in the process of cost reduction. As described above, the detection distance of the proximity sensor depends to a large measure on the outer diameter of the coil 231, and therefore many models of proximity sensors having different outer diameters are required to be prepared. Also, with regard to the specification of power supply and output, preparation of many models is required including DC or AC, three-line type (FIG. 27) or two-line type (FIG. 28), NPN or PNP, normally open or normally closed, cord output or connector output, etc. to meet the requirements of the users of the proximity sensor. Further, in accordance with the environment in which the proximity sensor is used, various models are required to be prepared including the metal case or resin case, brass or stainless steel, or short body or long body.

Conventionally, products with many combinations of these specifications have been designed and produced each time. It has been common practice, therefore, for the makers to supply a vast number of types of products. Under these circumstances, additional demand which may come from many users for an increased detection distance, a reduced product cost or an improved quality for each commodity is becoming more and more difficult to meet on the part of the makers.

In response to a demand for an increased detection distance, for example, the oscillation circuit is required to be designed for each of the custom ICs 201, 221 having different power specifications. Further, the capacitance value of the resonance capacitor 232 for determining the oscillation circuit constants, the resistance value of the regulation circuit 233 and the capacitance value of the integration capacitor 234 for determining the integration time constant are required to be designed for each coil having a different outer diameter specification. The resultant new addition of several types of custom IC would increase the external IC parts by several tens of types. Furthermore, the detection characteristic of the proximity sensor is considerably affected by the material of the body case. Even in the case where the specification is the same for the shielded type with the outer diameter M18 having the rated detection distance of 7 mm, for example, the metal case and the resin case produce different detection characteristics. To regulate them to the same detection distance, therefore, the oscillation constant is unavoidably different. This simple fact will facilitate the understanding of the difficulty of reducing the production cost through the concentration of the parts while maintaining the great variety of product specifications.

These problems of the conventional configuration derived from the magnetic circuit and the electrical circuit described above have various inconvenient effects on the production process of the proximity sensor.

FIG. 31 is a diagram showing the steps of the conventional production process of a proximity sensor of shielded type (which can be used in the form buried in a mounting metal) having a metal body case.

In this drawing, the first step (A) is to produce a detection end assembly 304 by assembling the coil 301, the ferrite 302 and the parts package board 303 integrally. In the next step (B), the coil 301 and the parts package board 303 are soldered on the detection end assembly 304. In the next step (C), the detection end assembly 304 that has been soldered is subjected to an operation check test (distance inspection, etc.) and the external appearance inspection. In the next step (D), the coil case 305 is filled with epoxy resin. In the next step (E), the detection end assembly 304 completed just now is accommodated in position in the coil case 305 filled with epoxy resin. In the next step (F), the resin is hardened by being left to stand for a predetermined length of time at room temperature, for example, and a detection end assembly 307 with a coil case is thus completed. In the next step (G), the operation test to adjust the distance is conducted on the detection end assembly 307 with the coil case completed in the preceding step. This distance adjustment is carried out by conducting the operation test while the detection end assembly 307 having the coil case is mounted in a dummy case 307*a*, and the adjustment is carried out based on the test result by replacing the chip resistor or otherwise. In the next step (H), the cord 308 is soldered to the detection end assembly 307 with the coil case thereby to complete the detection end assembly 309 with the cord. In the next step (I), the detection end assembly 309 with the cord, the cylindrical metal body case 310 and the cord clamp 311 are assembled integrally thereby to produce a semi-finished proximity sensor 312. In the next step (J), resin is injected in the semi-finished proximity sensor 312 and hardened thereby to produce a completed proximity sensor product 313. In the next step (K), the withstanding voltage test and the characteristic test are conducted to produce a tested final product 314.

In the fabrication process described above, the detection distance is adjusted in step (G) with the proximity sensor inserted in the dummy case 307a having the same material and the same shape as the metal body case actually mounted. The difference between the actual and dummy cases in the material, the plating thickness and the position of the metal case or the coil often causes a difference between the detection distance determined by adjustment of the detection distance and the actual detection distance measured with a metal case mounted thereon. As a result, a nonconforming product deteriorates the yield and sometimes requires the repair work. In addition, to cope with the difference in the material among metal cases, different dummy cases must be prepared, often wastefully requiring an increased number of dummy cases and frequent setup jobs.

Also, in view of the fact that the IC is configured in the form including the oscillation circuit and the output circuit, difference output circuits generates jobs of setup change (due to different power supplies) inefficiently in spite of the fact that the oscillation circuit remains the same.

Also, in the step of adjusting the detection distance with the dummy case 307a, the adjust resistance value is read by applying a terminal with a variable resistor to the adjust resistance wiring of the substrate having the circuits including the oscillation circuit mounted thereon. Due to the device difference and the resistance difference between different terminal-device connections, however, a difference develops between the actually read resistance value and the actually required resistance value. To fill up this gap, a correction value is determined. Since the correction value varies due to the variations of parts, ICs and the assemblies (position difference between the coil and the core, position difference between the core and the case, etc.), however, the correction values must be changed inefficiently for each part lot and each product lot. In addition, the difference in output status generates frequent jobs of setup change for a deteriorated production efficiency.

In the detection circuit adjust step, an adjust resistance value reading equipment is introduced. Due to variations between equipments, however, the adjustment is inconveniently made impossible for an assembly of a different model than the originally intended model.

Further, in the detection distance adjust step, the adjust resistance value reading equipment is affected by noises from other devices. Since a correction value is determined taking the particular noises into account, the correction value is inefficiently required to be changed each time of equipment movement or equipment part change.

This invention has been achieved in view of the above-described problem points of the conventional proximity sensor, and the object thereof is to provide the aforementioned type of sensor which permits simple commodity design and production against a great variety of commodity specifications.

DISCLOSURE OF THE INVENTION

A detection end module used for the proximity sensor according to this invention is an integration of a detection coil assembly including a coil and a core and a detection circuit assembly including an oscillation circuit with the coil of the detection coil assembly as a resonance circuit element. The detection coil assembly has incorporated therein a mask conductor for reducing the conductor detection sensitivity in a specific peripheral area where the outer shell case is assumed to exist. Also, the detection circuit assembly is designed to output a predetermined form of signal corresponding to the oscillation conditions of the oscillation circuit as an object detection signal from the proximity sensor. In this way, an output stage circuit is configured appropriately using the object detection signal output from the detection circuit assembly, so that the proximity sensor product can be prescribed arbitrarily.

The "proximity sensor" is classified into the one (proximity switch) in which the approach of an object of detection is determined and the result of determination is output as a binary signal and the one in which the approach of an object of detection is output in other forms such as an analog signal or a coded signal representing the distance to the object of detection.

With this configuration, the relation between the distance and the detection output remains substantially unchanged regardless of the presence or absence or the difference in shape or material of the outer shell case. Thus, the need of the mechanical and electrical design conducted individually in accordance with the outer shell case in the prior art is eliminated, and common parts that can be shared by various specifications of proximity sensor are employed. In this way, the concentration of parts is promoted, and the fabrication cost can be produced while maintaining a wealth of product lines.

With a detection end module according to a preferred embodiment of the invention, the mask conductor is arranged in a coil case for accommodating the coil, as a conductive cylindrical or annular member surrounding the coil and the core.

With a detection end module according to another preferred embodiment of the invention, the mask conductor makes up a conductive closing plate for partitioning the back of the coil and the core in the coil case accommodating the coil and the core.

In the case where the mask conductor is arranged in the coil case as described above, the wall of the coil case prevents or suppresses the intrusion of water into the mask conductor, thereby contributing to a superior anticorrosiveness of the mask conductor. Thus, the detection end module can according to these embodiments of the invention finds an especially suitable application in an environment of the food industry, for example, which is always exposed to water.

In a detection end module according to still another preferred embodiment of the invention, the mask conductor is a conductive cylindrical or annular member surrounding the coil and the core and located outside the insulating coil case accommodating the coil and the core. The wording "outside the insulating coil case" is indicative of the situation in which the mask conductor is not exposed to the interior of (inner wall surface) of the coil case. Therefore, the mask conductor, even if buried in the wall of the coil case, should be interpreted as located "outside the insulating coil case".

Assume that the mask conductor is arranged in the coil case, and a shock or the like force from an external source develops a partial crack in the coil case 403 and exposes the mask conductor. In such a case, electrostatic discharge in some form or other may inconveniently affect the sensor internal circuit through the mask conductor. According to this embodiment, however, even in the case where a partial cracking develops in the coil case, most portion of the coil case between the mask conductor and the sensor internal circuit remains as an insulating member. As a result, the discharge can be prevented between the sensor internal circuit and the mask conductor. Thus, the detection end module according to this embodiment will find suitable applications especially in a risky environment in which the coil case is exposed to some mechanical stress, such as the metal machining industry and the carrier industry.

In a detection end module according to a preferred embodiment of the invention, the detection circuit assembly incorporates an adjust circuit capable of adjusting the oscillation conditions of the oscillation circuit after being integrated as a detection end module.

In a detection end module according to a preferred embodiment of the invention, the detection circuit assembly includes a discrimination circuit adapted to switch on when the oscillation reaches a specified value, and the output of the discrimination circuit is output externally as an object detection signal.

In a detection end module according to a preferred embodiment of the invention, the detection circuit assembly incorporates a circuit for outputting an analog signal corresponding to the oscillation conditions, and the output of this circuit is output externally as an object detection signal.

In a detection end module according to a preferred embodiment of the invention, the detection circuit assembly incorporates a constant voltage circuit for stabilizing the source voltage supplied from an external source.

In a detection end module according to a preferred embodiment of the invention, a coil, a core and a detection circuit assembly are accommodated in a bottomed cylindrical container made of an insulating material and integrated with resin.

According to another aspect of the invention, there is provided a detection end module characterized by comprising a detection coil assembly including a coil and a core with the detection characteristic self-completed by a mask conductor and a detection circuit assembly integrated with the detection coil assembly with the coil of the detection coil assembly as a resonance circuit element, wherein the characteristics are completely adjusted before shipment.

In this aspect of the invention, a product having a superior detection accuracy can be developed also by selling the detection end module having the guaranteed characteristic to external customers. Specifically, the characteristic, once adjusted, is not changed by the shape or material of the body case or the mounting member, and therefore the purchaser can fabricate a proximity sensor according to this/her own company's specification without adjusting the characteristic thereof.

Next, the proximity sensor according to this invention is characterized in that a detection coil assembly having a coil and a core, a detection circuit assembly having an oscillation circuit with the coil as a resonance circuit element for outputting an object detection signal corresponding to the oscillation conditions of the oscillation circuit and a conductor mask for reducing the effect of the outer shell case on the detection characteristic are integrated with each other to make up a detection end module, which is electrically connected with an output circuit module having built therein an output circuit for driving an output element based on the object detection signal.

A proximity sensor according to a preferred embodiment of the invention further comprises an output circuit module support member for supporting the output circuit module, a cylindrical outer shell case having the detection end module mounted at an end thereof and the output circuit module support member mounted at the other end thereof thereby to hold the detection end module and the output circuit module in spaced relation with each other, and a connecting member interposed between the detection end module and the output circuit module for electrically connecting the two modules.

In the proximity sensor according to this invention, the detection end module and the output circuit module constitute independent members. In the case where these two modules are integrated through the outer shell case, therefore, consideration is necessary of the manner in which the output circuit module is supported with respect to the outer shell case. According to the preferred embodiment described above, the output circuit module is supported on the outer shell case through the output circuit module support member. Alternatively, the output circuit module has such a configuration that a member for mounting the output circuit module on the output circuit module support member is mounted on the circuit board in advance.

This aspect of the invention can produce the following effects:

(1) By changing or adjusting the connecting member, the detection end module, the output circuit module and the output circuit module support member of the same type can be used for any length of the outer shell case.

(2) In the case where a flexible connecting member of an appropriate length (a connecting member such as a harness providing freedom to the space between the detection end module and the output circuit module) is used, the connecting member of the same type can be used without regard to the length of the outer shell case.

(3) The output circuit is generally easily affected by the electrical noises intruding from outside through the cord on the one hand and easily generates heat through the output on/off operation. This aspect of the invention, in which the detection circuit assembly included in the detection end module and the output circuit included in the output circuit module are arranged in spaced relation with each other, can suppress the effects of the electrical noises and the heat on the detection circuit assembly.

(4) In view of the fact that the output circuit module is arranged at an end of the outer shell case, the output circuit module can be easily provided with an indication lamp (LED or the like) for indicating the operating condition of the proximity sensor in such a configuration that the indication lamp can be visually recognized from an end of the outer shell case.

Next, a method of fabricating a proximity sensor according to this invention is characterized by comprising the step of selecting one of a plurality of types of detection end modules each constituting an integrated arrangement including a detection coil assembly having a coil and a core, a detection circuit assembly having an oscillation circuit with the coil as a resonance circuit element thereof for outputting an object detection signal corresponding to the oscillation condition of the oscillation circuit and a conductor mask for reducing the effect of the outer shell case on the detection characteristic, the step of selecting one of a plurality of types of output circuit modules each having built therein an output circuit for driving the output element based on the object detection signal, and the step of connecting the two modules electrically to each other.

According to this method of fabricating a proximity sensor, various types of proximity sensor products can be prescribed based on combinations between the detection end module and the output circuit module, and therefore the production cost can be reduced on the one hand and the commodity can be prepared rapidly while at the same time supplying a wealth of product lines.

A method of fabricating a proximity sensor according to another aspect of the invention is characterized by comprising the step of selecting one of a plurality of types of detection end modules each constituting an integrated arrangement including a detection coil assembly having a coil and a core, a detection circuit assembly having an oscillation circuit with the coil as a resonance circuit element thereof for outputting an object detection signal corresponding to the oscillation condition of the oscillation circuit and a conductor mask for reducing the effect of the outer shell case on the detection characteristic, the step of selecting one of a plurality of types of outer shell cases that can be combined with the detection end module, and the step of mounting the outer shell case on the detection end module.

In this method of fabricating a proximity sensor, various types of proximity sensor products can be produced based on combinations of the detection end module and the outer shell case. While presenting a wealth of product lines satisfactorily, therefore, the production cost can be reduced on the one hand and the commodity can be prepared rapidly on the other. Also, the detection characteristic of the detection end module is not substantially affected by the selected outer shell case. Thus, the need of sensitivity adjustment for adaptation to the outer shell case is eliminated, thereby reducing the production cost while at the same time making it possible to prepare commodities rapidly.

A method of fabricating a proximity sensor according to still another aspect of the invention is characterized by comprising the step of selecting one of a plurality of types of detection end modules each constituting an integrated arrangement including a detection coil assembly having a coil and a core, a detection circuit assembly having an oscillation circuit with the coil as a resonance circuit element thereof for outputting an object detection signal corresponding to the oscillation condition of the oscillation circuit and a conductor mask for reducing the effect of the outer shell case on the detection characteristic, the step of selecting one of a plurality of types of output circuit modules having built therein an output circuit for driving an output element based on the object detection signal, the step of selecting one of a plurality of types of outer shell cases that can be combined with the detection end module, and the step of electrically connecting the detection end module and the output circuit module to each other and mounting the outer shell case on the detection end module.

In this method of fabricating a proximity sensor, various types of proximity sensor products can be prepared based on combinations of the detection end module, the output circuit module and the outer shell case. Therefore, while presenting a wealth of product lines, the production cost can be reduced on the one hand and the preparation of commodities can be quickened on the other. Also, the detection characteristic of the detection end module is not substantially affected by the selected outer shell case. Thus, the need of sensitivity adjustment for adaptation to the outer shell case is eliminated, thereby reducing the production cost while at the same time making it possible to prepare commodities rapidly.

A method of fabricating a proximity sensor according to yet another aspect of the invention is characterized by comprising the step of preparing a detection end module constituting an integrated arrangement including a detection coil assembly having a coil and a core, a detection circuit assembly having an oscillation circuit with the coil as a resonance circuit element thereof for outputting an object detection signal corresponding to the oscillation condition of the oscillation circuit and a conductor mask for reducing the effect of the outer shell case on the detection characteristic, the step of preparing a plurality of types of outer shell cases that can be combined with the detection end module, the step of selecting one of the plurality of types of the outer shell cases prepared, and the step of mounting the selected outer shell case on the detection end module.

As indicated by the wording "preparing a detection end module", the production process of the detection end module is not emphasized in the proximity sensor fabrication method according to this aspect. Specifically, this aspect of the invention can be said to provide a fabrication method suitable to a case in which a detection end module is acquired as a finished product from another company and mounted internally with the outer shell case are. This method also eliminates the need of sensitivity adjustment of the detection end module for adaptation to the selected outer shell case and therefore the production cost can be reduced while at the same time quickening the product shipment.

A method of fabricating a proximity sensor according to a preferred embodiment of the invention is characterized by comprising:

a first step for preparing a detection end module constituting an integrated arrangement including a detection coil assembly having a coil and a core, a detection circuit assembly having an oscillation circuit with the coil as a resonance circuit element thereof for outputting an object detection signal corresponding to the oscillation condition of the oscillation circuit and a conductor mask for reducing the effect of the outer shell case on the detection characteristic, an output circuit module having built therein an output circuit for driving an output element based on the object detection signal, an output circuit module support member having a through hole for receiving the output circuit module and supporting the output circuit module, a cylindrical outer shell case with the detection end module mounted at the forward end thereof and the output circuit module support member mounted at the rear end thereof thereby to hold the detection end module and the output circuit module in spaced relation with each other, and a flexible connecting member interposed between the detection end module and the output circuit module for electrically connecting the two modules to each other;

a second step for electrically connecting the detection end module and the output circuit module to each other through a connecting member;

a third step for mounting the detection end module connected with the output circuit module at the forward end of the outer shell case;

a fourth step for inserting the output circuit module protruded partly or wholly from the rear end of the outer shell case, into the through hole of the output circuit module support member;

a fifth step for mounting the output circuit module support member with the output circuit module inserted therethrough, at the rear end of the outer shell case; and a sixth step for mounting the output circuit module on the output circuit module support member.

In the conventional proximity sensor, the detection circuit assembly and the output circuit assembly are configured on a single substrate, which is fixed on a coil case or the like. Therefore, the substrate could be handled easily during the production of the proximity sensor. In the case where the output circuit module of the proximity sensor according to this invention is connected to the detection end module through a flexible connecting member (harness or the like with variable connection interval), on the other hand, the connecting member or the connected portion between the connecting member and the output circuit module may be damaged by a force which may be exerted on them. In such a case, it is necessary to fully consider in what steps the proximity sensor should be assembled. The embodiment described below has been conceived from this point of view, and makes it possible to properly assemble a proximity sensor with the detection end module and the output circuit module connected to each other by a flexible connecting member.

For deepening the understanding, the third and subsequent steps of the method of fabricating a proximity sensor according to this embodiment will be explained more specifically. In the stage immediately after the third step, the output circuit module is connected to other members only through a flexible connecting member and therefore unstably supported. In the fourth step, the output circuit module support member is not yet mounted on the outer shell case, and therefore the output circuit module can be easily inserted into the through hole.

In the fifth step, the output circuit module support member is mounted on the outer shell case with the output circuit module inserted into the through hole, and therefore no unreasonable force is exerted on the connecting member. In the case where the output circuit module support member is mounted on the outer shell case before the detection end module connected with the output circuit module through the connecting member, the output circuit module is inserted from the forward end of the outer shell case, while being inserted into the through hole of the output circuit module support member on the opposite side (rear end). This is a somewhat difficult method to employ, and if this method is employed, an unreasonable force may be exerted on the connecting member. By the way, the sixth step may be executed at the same time as or before the fifth step.

A method of fabricating a proximity sensor according to a more preferred embodiment of the invention further comprises a seventh step for injecting a filling resin into the outer shell case after mounting the detection end module on the outer shell case, mounting the output circuit module support member on the outer shell case and mounting the output circuit module on the output circuit module support member, and an eighth step for soldering the electric cord to the portion of the output circuit module protruded outward, after the filling resin is hardened.

In this aspect of the invention, the filling resin fixes the output circuit module and the connecting member immovably in the outer shell case before the electric cord is soldered to the output circuit module. Therefore, the flexible connecting member or the connected portion between the connecting member and the substrate is not damaged by the force exerted by the connection of the electric cord.

Next, a system for producing a proximity sensor according to the invention comprises a detection coil assembly including a coil and a core with the detection characteristic thereof self-completed by a mask conductor, a detection circuit assembly with the coil of the detection coil assembly as a resonance circuit element, an output circuit assembly having a power element for driving a load, and a control circuit assembly for controlling the operation of an output stage circuit in accordance with the oscillation condition of the oscillation circuit, wherein the detection coil assembly and the detection circuit assembly are integrated with each other to constitute a detection end module, the output circuit assembly constitutes an output circuit module according to the product specification such as the output form or the source voltage, and the control circuit assembly is built in on the detection end module side or the output stage module side collectively, or appropriately dividedly on the detection end module side and the output stage module side, whereby one detection end module is combined with one output circuit module selected from a group of output circuit modules corresponding to the particular detection end module, thereby making it possible to prepare an ordered product.

With the proximity sensor production system described above, the production cost can be reduced and a commodity can be prepared rapidly at the same time while maintaining a wealth of product lines in satisfactory fashion.

In studying the invention in terms of an embodiment more specifically, the detection characteristic of the detection coil assembly configured of a coil, a ferrite core accommodating the coil and a cylindrical mask conductor of brass, copper or aluminum is not easily affected (less affected) by the variations in the material or dimensions of the body case, the plating thickness of the body case or the relative positions for assembly between the sensor portion and the body case. Even in the case where the body case is different (in material or shape), therefore, the proximity sensor of the same performance is realized with the same detection end module. As a result, various effects are produced, i.e. (1) The number of design steps and the cost are reduced; (2) A high detection performance is obtained regardless of the material of the body case; (3) The parts can be concentrated for a reduced parts cost; (4) Production becomes possible on the same line and through the same process; (5) Variations in the detection distance are reduced; and (6) The relative positions of the sensor portion and the body case for assembly are simplified, and the method of adjusting the detection distance can be simplified.

Also, the provision of the cylindrical mask conductor produces the effect of improving the performance of the proximity sensor. For example, the effect of the surrounding metal (the change in the detection characteristic under the effect of the metal of the mounting portion) can be reduced as compared with the conventional structure, and the distance free of mutual interference (the interference between proximity sensors may cause a malfunction) is shortened.

Further, in the case where the cylindrical mask conductor is grounded at a stable potential, the effect of shielding against external noises is obtained. Therefore, the protective measures against noises conventionally employed (shield plate, or vapor-deposited film on the ferrite core) are eliminated, thereby reducing the parts cost and the number of production steps.

Next, a method of supporting the model selection as a business technique for sales of the proximity sensor described above will be explained. According to this invention, there is provided a method of supporting the model selection of the proximity sensor configured of a detection end module constituting an integrated arrangement including a detection coil assembly having a coil and a core, a detection circuit assembly having an oscillation circuit with the coil as a resonance circuit element for outputting an object detection signal corresponding to the oscillation condition of the oscillation circuit, and a conductor mask for reducing the effect of the outer shell case on the detection characteristic, an output circuit module having built therein an output circuit for driving an output element based on the object detection signal, and an outer shell case for accommodating the detection end module and the output circuit module, the method comprising: the step of preparing, in the storage unit of a server, a data base having registered therein the specifications of the models and the information for identifying the models of the proximity sensor adapted to be configured by a combination of selected one of a plurality of types of detection end modules, selected one of a plurality of types of output circuit modules, and selected one of a plurality of types of outer shell cases; the step of causing the customer to input a part or the whole of the specifications and conditions required for specifying a model of the proximity sensor through a terminal unit communicating with the server; and the step of presenting, to the customer through the terminal unit, the information for identifying the model of the proximity sensor satisfying the specifications and the conditions input by the customer.

In the conventional proximity sensor, the detection circuit and the output circuit are generally constructed on a single circuit board, which in turn is integrated with the detection coil to make up a composite part. In the case where even one of the detection coil, the detection circuit and the output circuit is changed in specification, therefore, the specification of the composite part as a whole becomes different, and therefore the composite part is required to be designed individually. This constitutes a stumbling block to increasing the number of models of the proximity sensors for which orders from the customer can be received.

In the method of supporting the model selection of the proximity sensor according to the invention, in contrast, a proximity sensor can be produced by variously combining the detection end module, the output circuit module and the outer shell case prepared independently of each other. Therefore, a far greater number of the proximity sensor models for which the customer orders can be received can be obtained than the number of types of the detection end module, the number of types of the output circuit module and the number of types of the outer shell case.

Further, even in the case where a model for which an order has been received is low in demand or has never been ordered, i.e. even in the case where a given combination of the detection end module, the output circuit module and the outer shell case used for such a model is rare, each of these modules and outer case are usable for constructing other models. These modules and outer shell case in stock, therefore, have no special effect on the maintenance cost, production cost or the production lead time. Thus, even such a rare model can be readily offered to the customers, and an order for a very small number of proximity sensors (even one proximity sensor) which may be received can be met (accepted) without any problem.

In addition, the detection end module used for the method of supporting the model selection according to the embodiment is configured substantially free of the effect of the outer shell case that otherwise might have on the detection characteristic. The detection end module, therefore, need not be individually adjusted in accordance with the material of the outer shell case associated therewith. As a result, the detection end module can be placed in stock as a complete product in process, and a proximity sensor meeting the specification ordered by the customer can be rapidly assembled.

In the model selection supporting method according to the invention, the specifications registered in the data base are all or part of the technically possible combinations of the detection end module, the output circuit module and the outer shell case. Specifically, technically impossible combinations, combinations technically possible but unrequited due to the reason on the part of the supplier of the proximity sensor are not required to be registered.

The specifications and conditions required for specifying the model of the proximity sensor are input in the form of concrete specifications for each of a plurality of specification items prepared in advance (selection from choices, input of arbitrary phrase, etc.) or in the form of indirect information (such as applications of the proximity sensor) for roughly determining the contents of the specification.

The "specifications and conditions" may additionally include those for the connecting method. The specifications and conditions based on the cord lead type (pre-wire) or the connector type, the specifications and conditions based on the cord material and cord length for the cord lead type, and the specifications and conditions based on the connector type for the connector type, are some specific examples.

The model selection supporting method according to the invention may further comprise the step of giving a guide on the method of purchasing the proximity sensor as a step after or as a substep in a given step or before the step of inputting the specifications and conditions.

In the step of giving a guide on the purchase method, the information on the stores where the particular proximity sensor is available can be supplied, for example. Also, after the information for identifying the model satisfying the specifications and conditions desired by the customer is presented through the customer's terminal device, the proposal for purchase of the model thus presented may be received. Also, a guide on the method of purchase proposal may be given through electronic mail, telephone, facsimile or ordinary mail.

In the model selection supporting method according to a preferred embodiment of the invention, the step of presenting the information for identifying one of a plurality of models of the proximity sensor meeting the specifications and conditions input by the customer includes the substep of presenting a list of the particular models through the terminal device of the customer and causing the customer to select one or a plurality of the models included in the list.

According to this aspect, the customer can input only the specifications and conditions considered important for his/her intended application, and subsequently can specify and select the desired one of the models presented in the list. As compared with the case in which all the specifications and the conditions required for specifying one model are input, therefore, the time and labor consumed for the input operation can be saved and the model can be easily selected.

More preferably, in the case where the presented model list includes a model in stock for market production, the list is presented in a way permitting the customer to identify the particular model.

The wording "in a way permitting the customer to identify the particular model" applies to a case, for example, in which a character, a figure, a symbol or a color specifying the model in stock is indicated in the list. In this way, the customer is informed whether a model presented in the list is in stock (that can be acquired earliest) or a model produced on order (that can be acquired several days later), and can select taking this fact into consideration.

Preferably, in the step of causing the customer to input the specifications and conditions, only a part of the specifications and the conditions required for specifying a model can be input, and the list contains other than the part of the specifications and conditions that can be input for each model, as well as the information for identifying the models of a plurality of proximity sensors satisfying the specifications and conditions input by the customer.

The "other than the part of the specifications and conditions that can be input" are preferably those specifications and conditions normally considered not important from the viewpoint of model selection. Assume, for example, that the "normally open" and "normally close" operating conditions are both prepared in almost all cases regardless of the contents of the other specifications. One of these operating conditions can be determined in the last stage. In such a case, the step of causing the customer to input the specifications and conditions preferably prohibits the input of the conditions "normally open" or "normal close". As a result, the customer can concentrate his/her attention more on the process of inputting only the specifications closely related to his/her intended applications in the step of causing him/her to input the specifications and the conditions.

Also, the model selection supporting method according to the invention preferably further comprises the step of receiving an information presentation request from a customer through the terminal unit with regard to the model of the proximity sensor offered as satisfying the specifications and conditions input by the customer, and the step of presenting the information including the data indicating the characteristics of the model of the proximity sensor and/or the drawing indicating the dimensions of the proximity sensor through the terminal unit in response to the customer request.

According to this aspect of the invention, the customer can immediately check the detailed information on the models presented in the list, and therefore can accurately and smoothly select the desired model.

The model data base described above is suitably produced by a method of model data base production according to this invention. A model data base production method according to the invention is for registering the specifications of each of a plurality of models of proximity sensors each comprising: a detection end module constituting an integrated arrangement including a detection coil assembly having a coil and a core, a detection circuit assembly having an oscillation circuit with the coil as a resonance circuit element for outputting an object detection signal corresponding to the oscillation condition of the oscillation circuit, and a conductor mask for reducing the effect of the outer shell case on the detection characteristic; an output circuit module having built therein an output circuit for driving an output element based on the object detection signal; and an outer shell case for accommodating the detection end module and the output circuit module;

the method comprising the step of preparing, in a storage unit of a computer, the specification data of each of a plurality of types of detection end modules, the specification data of each of a plurality of types of outer shell cases and the specification data of each of a plurality of types of output circuit modules, the step of preparing, in a storage unit of a computer, the combination prohibit information for designating an improper one of the combinations between the detection end module and the outer shell case, and the step of combining the specification data of each detection end module, the specification data of each outer shell case and the specification data of each output circuit module by a computer, except for the combinations specified by the combination prohibit information, and producing a model data base for registering the specification of each model of the proximity sensor adapted to be configured by combinations of selected one of a plurality of types of detection end modules, selected one of a plurality of types of outer shell cases and selected one of a plurality of types of output circuit modules.

In the method of producing a model data base for a proximity sensor according to the invention, a data base on a vast number of models of the proximity sensors can be produced rapidly and accurately. In the conventional proximity sensor, in contrast, any difference in any of the basic specifications including the outer diameter, the detection distance and the output form is always accompanied by an individually designed part, and therefore a model data base cannot be automatically produced based on the combinations of the parts that can be shared by many models. According to the model data base production method for the proximity sensor according to the invention comprising a detection end module, a output circuit module and an outer shell case that can be combined with a considerable freedom, however, the model data base for the proximity sensor can be produced by executing a computer program.

In the model data base production method for the proximity sensor according to this invention, specification data on the connecting method may be further prepared and added to produce a model data base by execution of a computer program.

BRIEF DESCRIPTION OF THE DRAWINGS

FIG. 46 is a diagram showing a specification list, in table form, of the detection end modules prepared in the model selection support system.

FIG. 47 is a diagram showing the correspondence, in table form, between the distance range magnification and the detection distance.

FIG. 48 is a diagram showing a specification list, in table form, of the body case prepared in the model selection support system.

FIG. 49 is a diagram showing a specification list, in table form, of the output circuit module prepared in the model selection support system.

FIG. 50 is a diagram showing a specification list, in table form, of the connection method prepared in the model selection support system.

FIG. 51 is a diagram showing, in table form, the contents of the data for each sensor model stored in the model specification data base.

FIG. 52 is a diagram showing, in table form, the contents of the detection end module specification data, the body case specification data and the output circuit module specification data for producing the model specification data base.

FIG. 55 is a diagram showing, in table form, a list of the specification contents prepared for each specification item displayed on the model select screen.

FIG. 56 is a diagram showing an example of the search result screen displayed on the customer's computer.

FIG. 58 is a diagram for explaining the configuration of the detection circuit assembly of the conventional proximity sensor and the terms used in the graph.

BEST MODE FOR CARRYING OUT THE INVENTION

Preferred embodiments of the invention will be explained below in detail with reference to the accompanying drawings.

The main feature of the proximity sensor according to the invention lies in that it is fabricated using a detection end module having a novel configuration. The detection end module has an integrated structure including a detection coil assembly including a coil and a core and a detection circuit assembly including an oscillation circuit with the coil of the detection coil assembly as a resonance circuit element.

The detection coil assembly incorporates a mask conductor for reducing the conductor detection sensitivity in a specific peripheral area where an outer shell case (body case) of a metal is assumed to be located. In addition, the detection circuit assembly is configured to output a signal of a predetermined form corresponding to the oscillation condition of the oscillation circuit as an object detection signal of the proximity sensor.

As a result, a signal of the desired form can be output from the proximity sensor by configuring an output stage circuit appropriately using the object detection signal output from the detection circuit assembly.

As will be explained in detail later, the mask conductor is formed of a good conductor such as brass, copper or aluminum. The shape of the mask conductor can be a cylinder or a ring surrounding the detection coil assembly.

Figure 1:
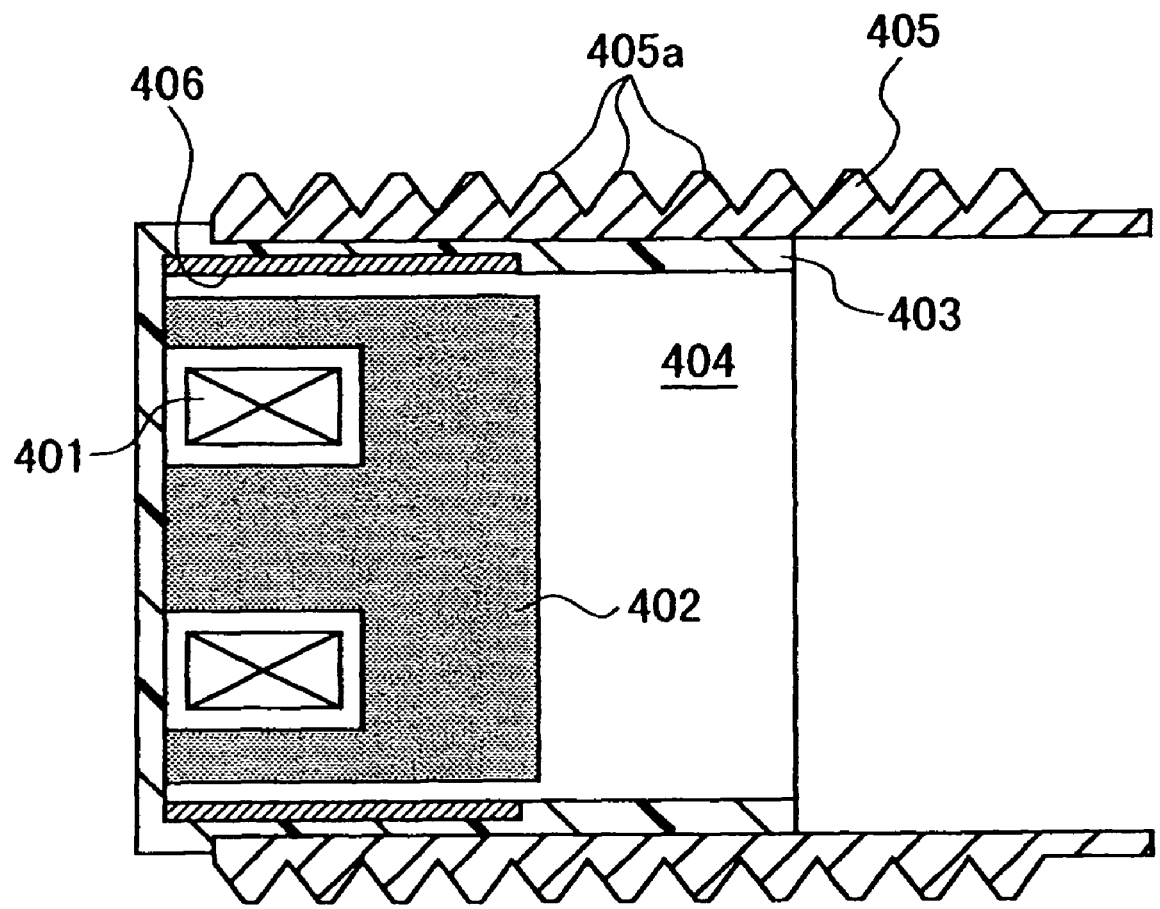
FIG. 1 is a diagram for explaining the structure of the detection coil assembly according to an embodiment.

FIG. 1 shows a detection coil assembly 404 making up a component part of the detection end module according to an embodiment (first embodiment) of the invention, together with a body case (outer shell case) 405. The detection coil assembly 404 is intended as the shielded type and accommodates a coil 401 and a ferrite core 402 in a coil case 403 in the form of bottomed cylinder. In the case shown, the coil case 403 is formed of an insulating material of resin. The cylindrical body case 405 is fitted under pressure on the outer periphery of the detection coil assembly 404. The body case 405 can be formed of a metal material such as brass or stainless steel or resin or the like. The material of the coil case 403 is an insulating material such as resin.

A mask conductor 406 for reducing the conductor detection sensitivity in a specific peripheral area where the metal body case 405 is assumed to exist is arranged on the inner peripheral surface of the coil case 403 surrounding the coil 401 and the ferrite core 402. The mask conductor 406 according to the first embodiment is cylindrical in shape, and is formed of a good conductor such as brass, copper or aluminum as a material. The cylindrical mask conductor 406 has a total length almost equal to the ferrite core 402 and is arranged pressured to the extreme end of the forward end portion (left side in the drawing) of the coil case 403. Also, the forward end surface (left side in the drawing) of the body case 405 is slightly retreated from the forward end surface of the cylindrical mask conductor 406.

In the case under consideration, the cylindrical mask conductor 406 is formed with a stepped portion on the inner peripheral surface of the coil case 403 and fitted thereon. Nevertheless, this stepped portion may be done without. The cylindrical mask conductor 406 may be arranged by being inserted into the coil case 403 or molded by being inserted into the coil case 403. As another alternative, instead of using the coil case 403, an insulating material may be used to integrate the coil 401, the ferrite core 402, the cylindrical mask conductor 406 and the substrate on which the detection end module is mounted. By the way, by grounding the cylindrical mask conductor 406 to a steady potential (ground), the effect of shielding against external noises can be obtained.

Figure 2:
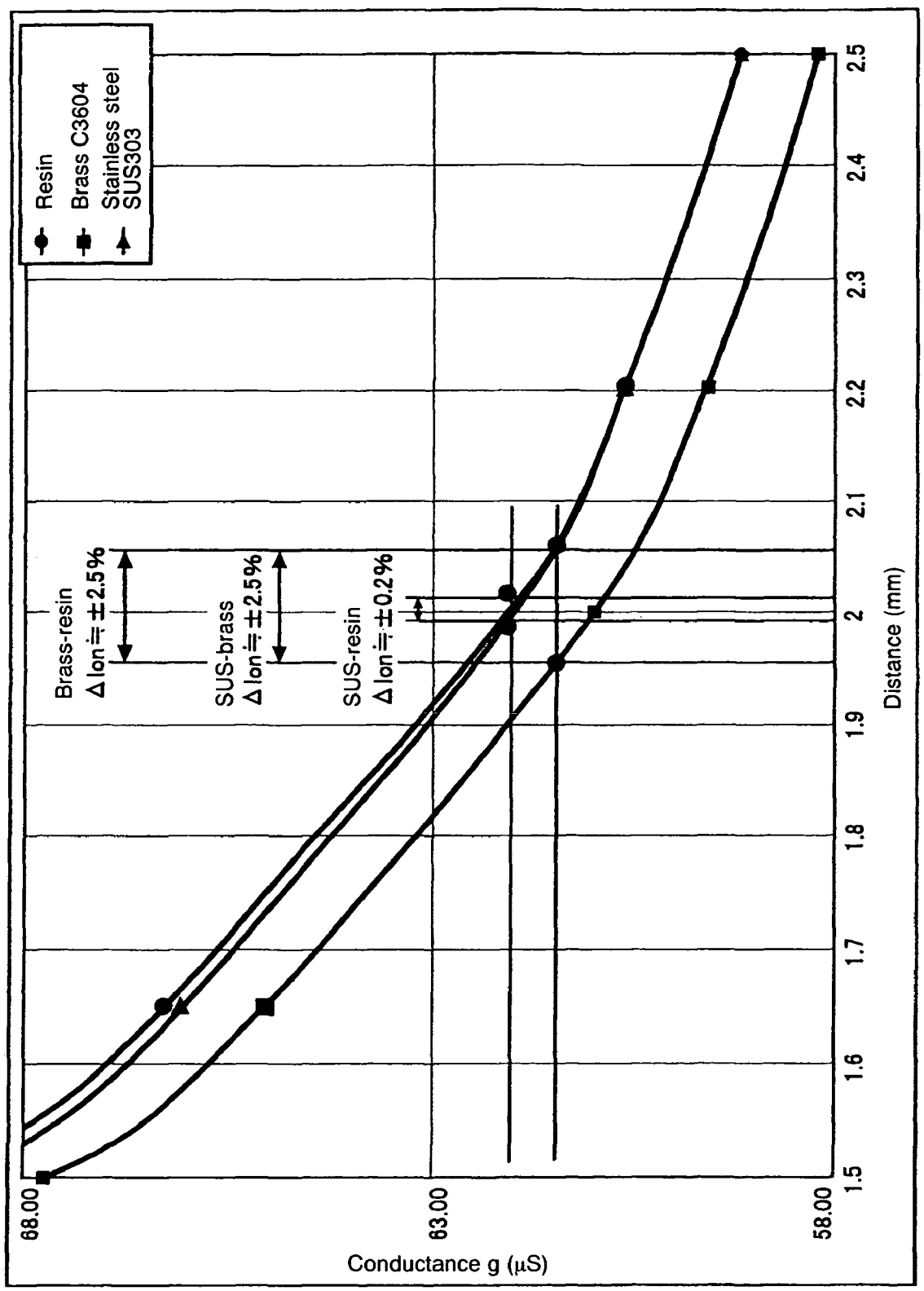
FIG. 2 is a graph showing the detection characteristic of the detection coil assembly according to the first embodiment (shielded type, cylindrical mask conductor).

A graph showing the detection characteristic of the detection coil assembly according to the first embodiment is shown in FIG. 2. This graph is plotted based on the measurement data of the detection coil assembly of M8 shield type. The abscissa represents the detection distance (mm) and the ordinate the conductance g (μS) of the detection coil. For the detail (contents, the meaning of the terms, etc.) of the graph, see the comments made at the end of "BEST MODE FOR CARRYING OUT THE INVENTION".

Figure 23:
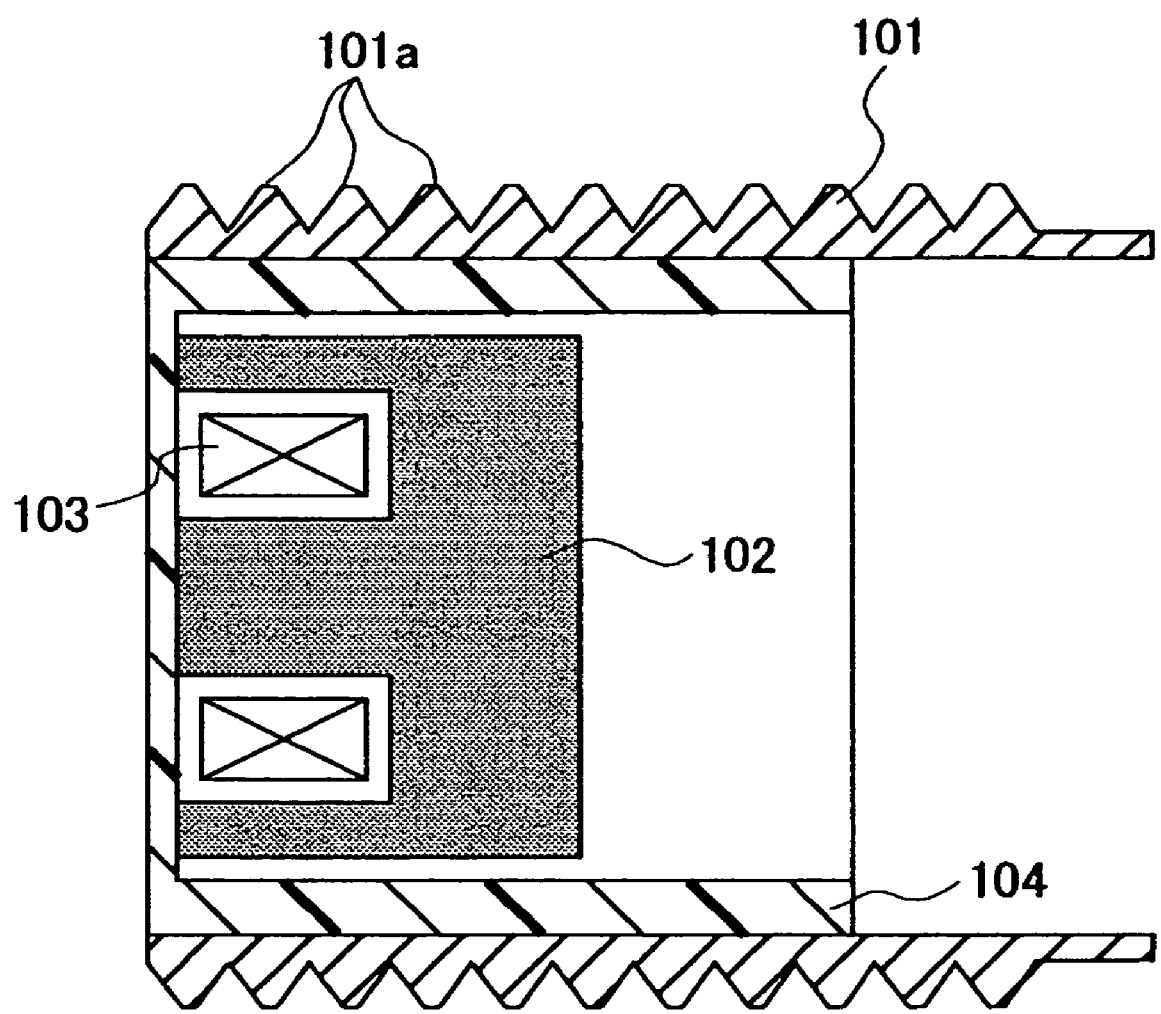
FIG. 23 is a diagram for explaining the structure of the detection coil assembly according to the prior art 1.
Figure 24:
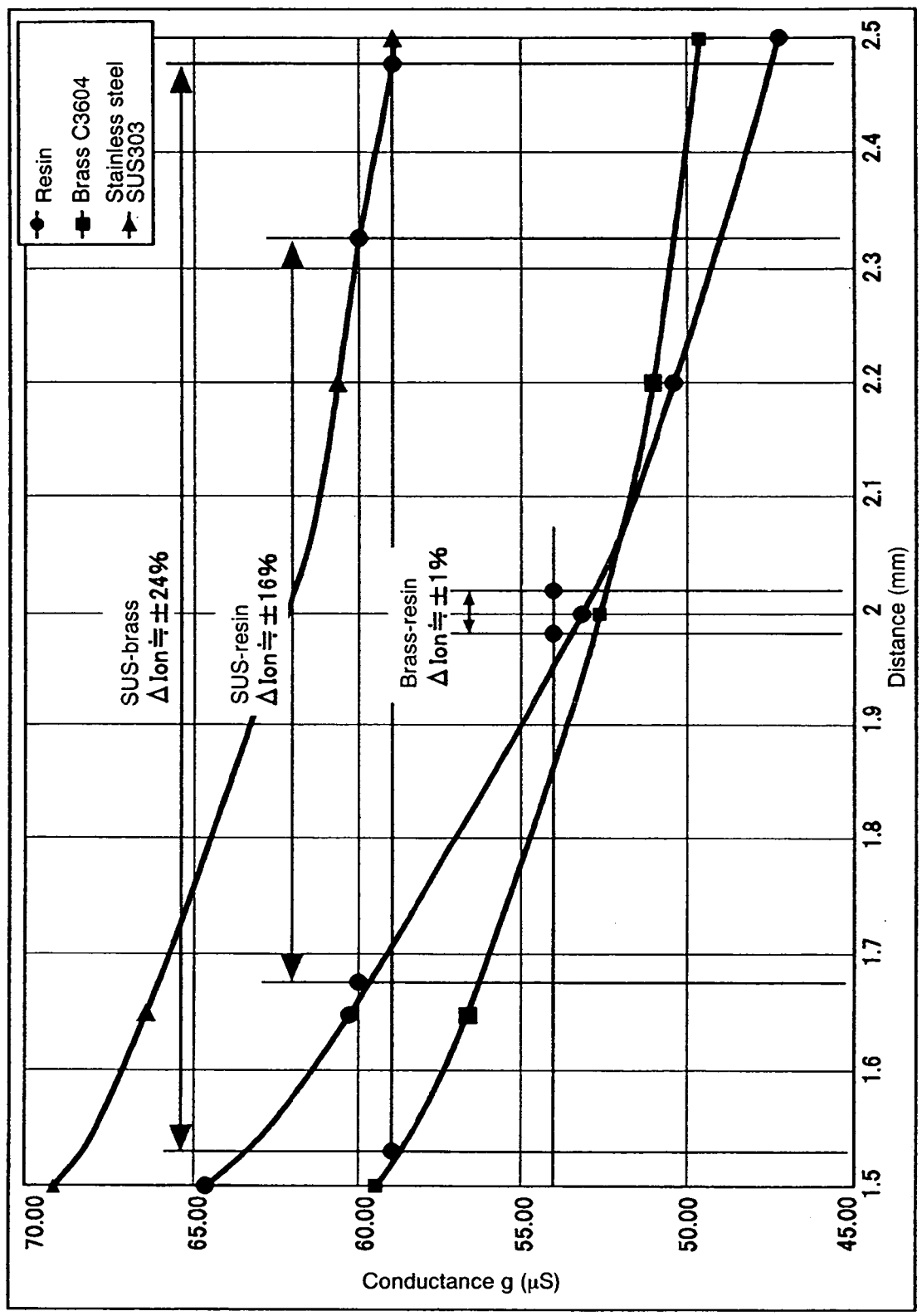
FIG. 24 is a graph showing the detection characteristic of the detection coil assembly according to the prior art 1 (shielded type, no cylindrical member).

As shown in this drawing, the use of a different material including resin (nonmetal), brass or stainless steel changes the conductance characteristic (i.e. the detection characteristic) of the detection coil assembly 404 accordingly. As apparent from the comparison with the detection characteristic according to the prior art 1 shown in FIG. 24, however, it will be understood that the change width of the detection characteristic of the detection coil assembly according to this embodiment is much smaller than the change width of the detection characteristic of the detection coil assembly (FIG. 23) according to the prior art 1 having no mask conductor 406. This is estimated due to the fact that the provision of the cylindrical mask conductor 406 reduces the conductor detection sensitivity in a limited area where the case body 405 exists.

As a result, the detection characteristic of the detection coil assembly 404 is less affected by the variations in the material, shape, size and plating thickness of the body case 405 or the variations in the relative positions of assembly between the detection coil assembly 404 and the body case 405. Even for a different material or shape of the body case 405, therefore, a proximity sensor with a small difference of the detection characteristic can be realized with the same detection end module (described in detail later).

The resulting various effects include: (1) The number of design steps and the cost are reduced; (2) The parts can be concentrated for a reduced parts cost; (3) The proximity sensors of different models can be produced on the same production line and by the same process; (4) The variations in detection distance can be reduced; (5) the relative positions for assembly of the sensor portion and the body case can be easily set; and (6) the method of adjusting the detection distance can be simplified.

Also, the provision of the cylindrical mask conductor 406 produces the effect of an improved performance of the proximity sensor. For example, the effect of the surrounding metal (the detection characteristic change due to the effect of the metal of the mounting portion) can be reduced as compared with the conventional structure or the distance limit causing the mutual interference (such as a malfunction caused by mutual interference of the proximity sensors) is reduced.

Further, in the case where the cylindrical mask conductor 406 is grounded to the steady potential, the effect of shielding against the external noises can be obtained. Thus, the noise-suppression measures (the shield plate or vapor-deposited film on the ferrite core) conventionally employed are not required, thereby making it possible to reduce the parts cost and the number of production steps.

Figure 32:
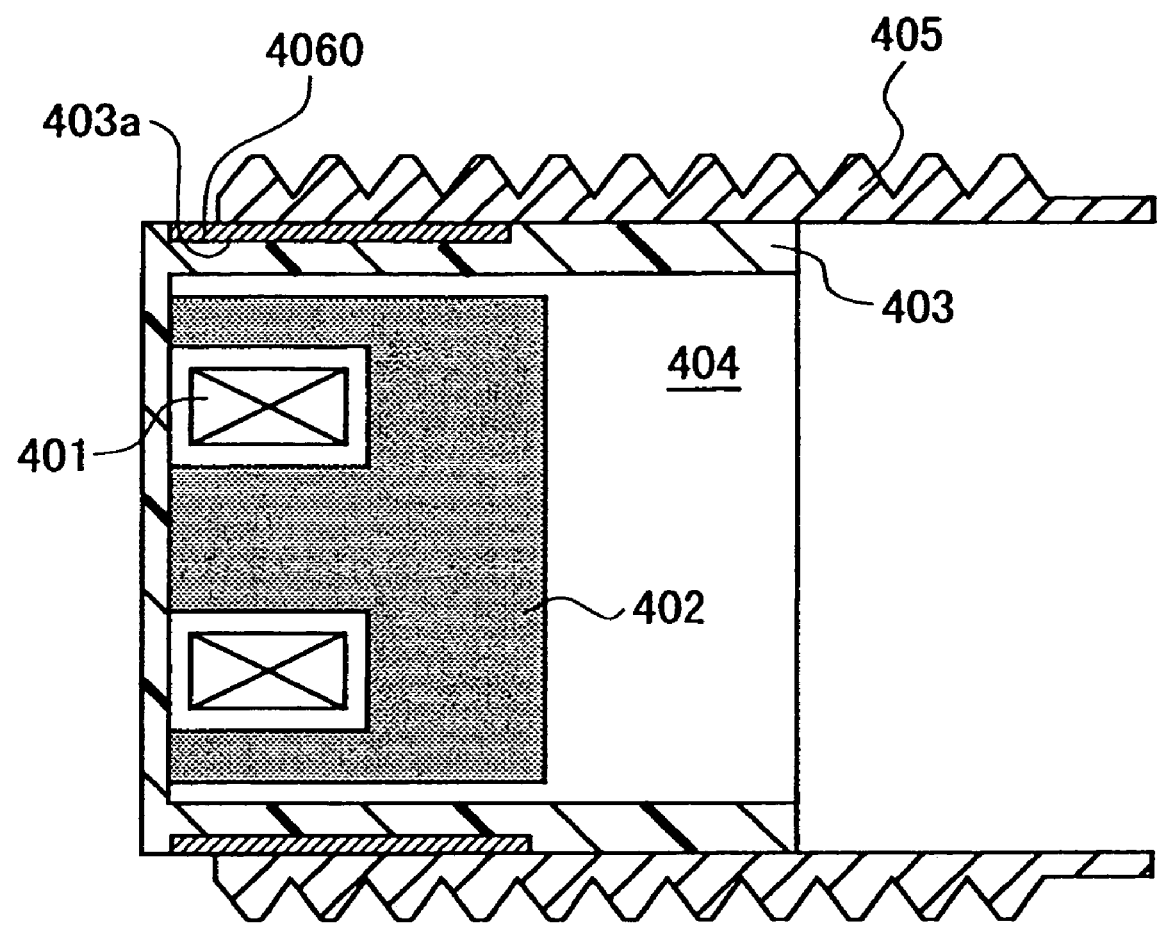
FIG. 32 is a diagram showing the detection coil assembly according to a modification of the first embodiment.

FIG. 32 shows the detection coil assembly according to a modification of the first embodiment. In the first embodiment described above, the cylindrical mask conductor 406 is arranged on the inside (inner peripheral surface) of the coil case 403. Nevertheless, the mask body can be arranged outside the coil case 403 as a cylindrical mask conductor 4060 as shown in the same drawing.

The cylindrical mask conductor 4060 shown in this modification has a slightly larger inner diameter than the cylindrical mask conductor 406 described above, and fitted on the stepped portion 403a formed on the outer peripheral surface of the coil case 403. The total length and the position of the forward end portion (slightly forward) with respect to the end surface of the body case 403 are substantially the same as those of the mask conductor 406.

On the other hand, the body case 405 is pressure fitted on the outer periphery of the detection coil assembly 404 in such a manner as to expose the forward end portion of the outer peripheral surface slightly while covering the greater part of the outer peripheral surface of the cylindrical mask conductor 4060. The detection characteristic of the detection coil assembly 404 in this embodiment is substantially similar to that shown in FIG. 2, and therefore will not be described again.

In the case where the mask conductor is arranged on the inner periphery of the coil case 403, assume that the coil case 403 partially develops a cracking and the mask conductor is exposed by an external shock. In such a case, some electrostatic discharge may affect the internal circuits of the sensor inconveniently through the mask conductor. As long as the mask conductor 4060 is arranged outside the coil case, however, the discharge between the internal circuits of the sensor and the mask conductor can be prevented as the coil case 403 making up an insulating member remains in almost all the parts between the mask conductor and the detection circuit assembly, even in the case where the coil case 403 develops a partial cracking.

The cylindrical mask conductor 4060 may be buried in the coil case 403 in such a manner as to cover the entire outer peripheral surface thereof. In this case, a high anticorrosiveness of the mask conductor 4060 can be obtained as well as the anti-discharge effect described above.

In this embodiment, the cylindrical mask conductor 4060 is fitted on the stepped portion 403a on the outer periphery of the coil case 403. Nevertheless, this stepped portion may be done without. Also, the cylindrical mask conductor 4060 may be fixedly bonded on the coil case 403 or integrally formed with the coil case 403. Further, in place of the coil case 403, the substrate mounted on the detection end module may be molded (with resin, for example) integrally by an insulating material with the coil 401, the ferrite core 402 and the cylindrical mask conductor 4060.

Also with regard to the cylindrical mask conductor 4060, the effect of shielding against external noises can be achieved by grounding it to a steady potential (ground).

Figure 3:
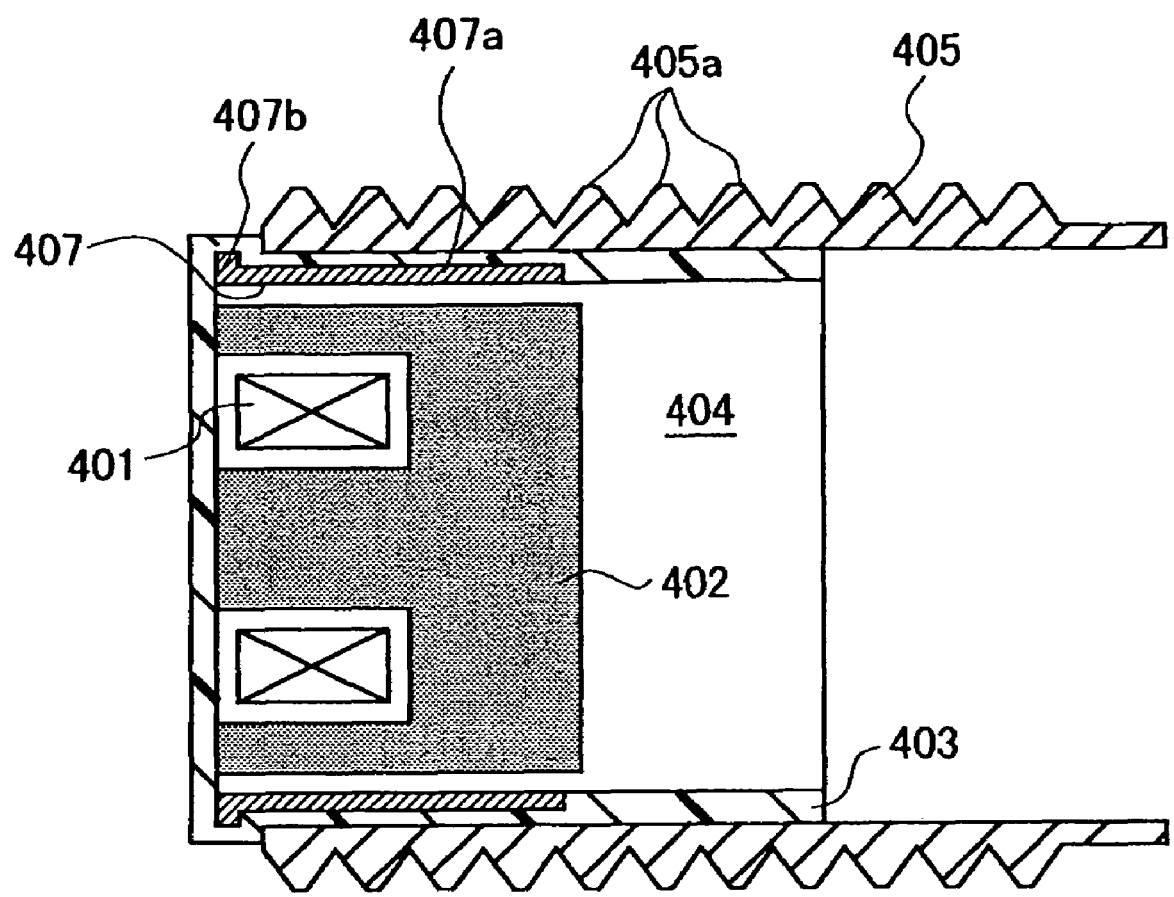
FIG. 3 is a diagram for explaining the structure of the detection coil assembly according to the second embodiment.

FIG. 3 shows the detection coil assembly 404 according to an embodiment (second embodiment) together with the body case 405. Substantially the same component parts as those of the first embodiment shown in FIG. 1 are designated by the same reference numerals, respectively, and will not be described again. With regard to the shape of the coil case 403, on the other hand, there is some difference between the first and second embodiments due to the configuration difference of the mask conductors (406, 407). However, no specific explanation of this point will be required for those skilled in the art.

The difference of the second embodiment from the first embodiment lies in the configuration of the mask conductor 407. The mask conductor 407 is configured as a flanged cylinder having an annular flange portion 407b on the outer periphery at the forward end portion of the cylindrical body 407a. The material of this mask conductor 407 is the same as that of the mask conductor 406.

The flanged mask conductor 407 may be configured of two different independent members (flanged portion and the cylindrical portion). Also, the stepped portion formed on the inner peripheral surface of the coil case 403, on which the flanged mask conductor 407 is fitted, may be done without. In this case, only the annular flange portion 407a may be fitted on the stepped portion. Also, the flanged mask conductor 407, like the mask conductor 406 shown in the first embodiment, may be formed by insert molding or integral molding. Further, the shielding function may be provided in a similar fashion (by grounding).

Figure 4:
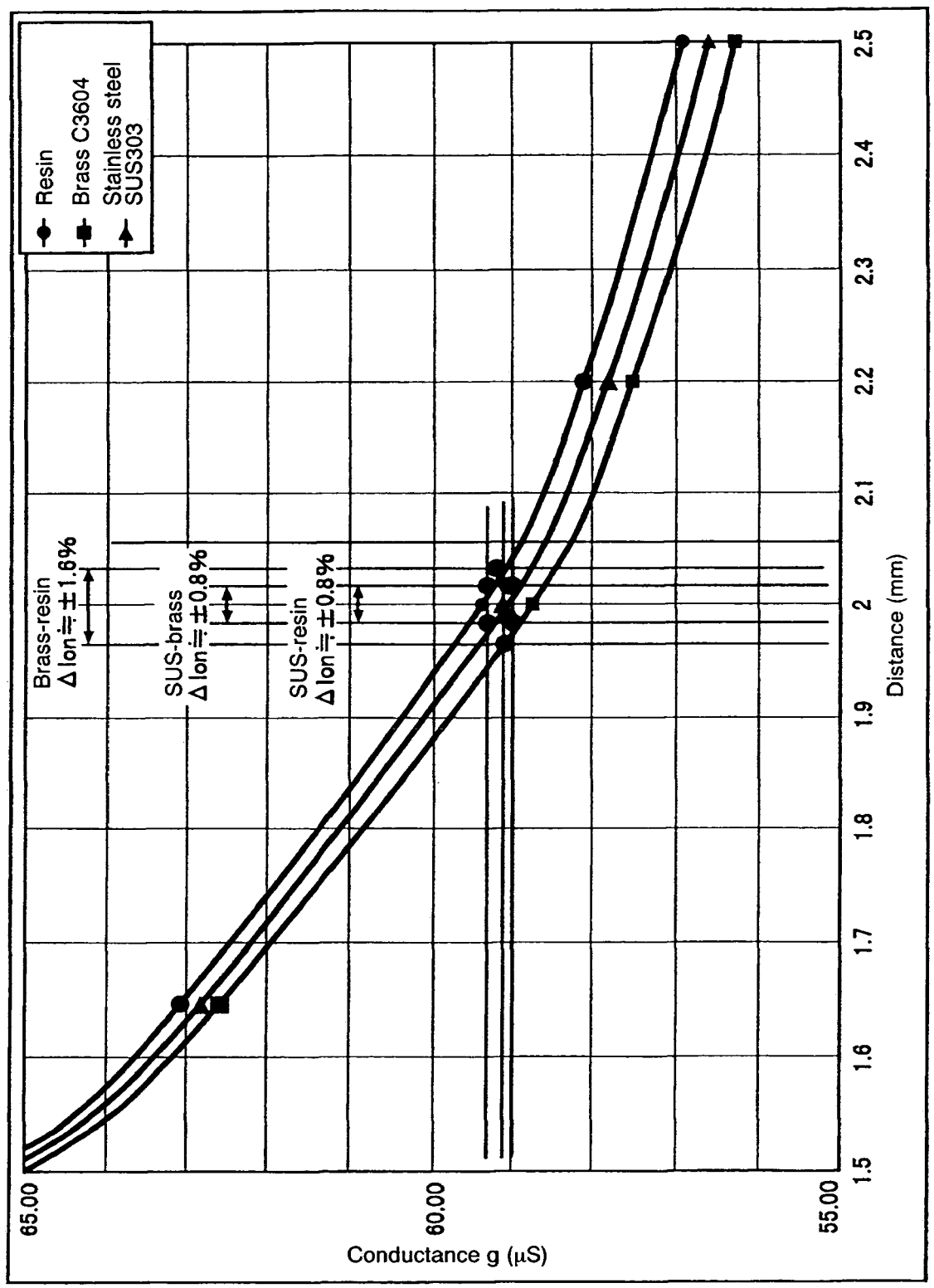
FIG. 4 is a graph showing the detection characteristic of the detection coil assembly according to the first embodiment (shielded type, flanged mask conductor).

A graph representing the detection characteristic of the detection coil assembly according to the second embodiment is shown in FIG. 4. As shown in this drawing, also according to the second embodiment, the difference of the material of the body case 405, which may be resin (nonmetal), brass or stainless steel, changes the conductance characteristic (detection characteristic) accordingly. The width of the change of the detection characteristic, however, is seen to be much smaller than that of the detection coil assembly according to the prior art 1 (See FIGS. 23, 24) having no mask conductor. According to this second embodiment, however, it will be understood that the variation of the detection characteristic is further reduced as compared with the detection coil assembly 404 according to the first embodiment shown in FIG. 2 by forming the annular flange 407b on the outer periphery at the forward end portion of the flanged mask conductor 407.

Figure 33:
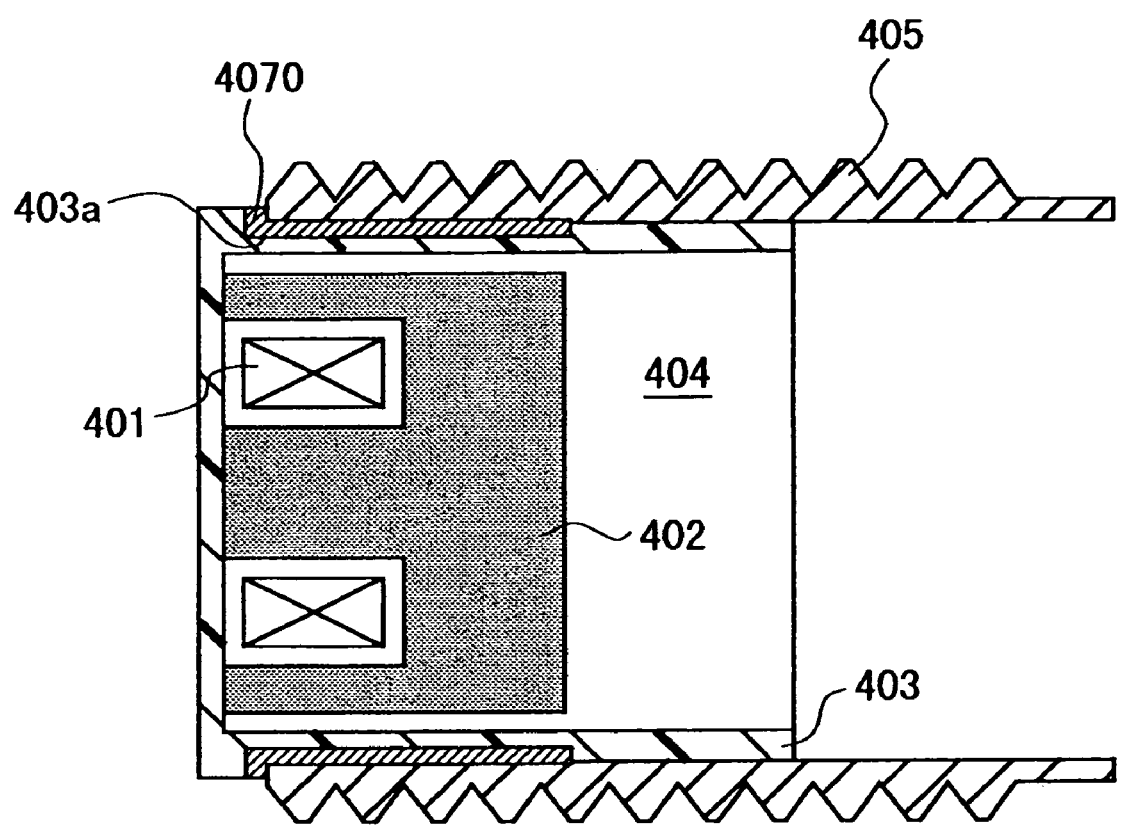
FIG. 33 is a diagram showing the detection coil assembly according to a modification of the second embodiment.

FIG. 33 shows the detection coil assembly according to a modification of the second embodiment. As shown in this drawing, according to the second embodiment, the flanged mask conductor can be arranged on the outside of the coil case 403.

The flanged mask conductor 4070 according to this modification is fitted on the stepped portion 403a formed on the outer peripheral surface of the coil case 403. The total length of the flanged mask conductor 4070 and the position of the forward end (which is slightly forward) relative to the end surface of the body case 403 is substantially similar to that of the flanged mask conductor 407.

The body case 405, on the other hand, is pressure fitted on the outer periphery of the detection coil assembly 404 in such a manner as to cover the outer peripheral surface of the flanged mask conductor 4070 while at the same time exposing the outer peripheral surface of the flange 407b.

The detection characteristic of the detection coil assembly 404 according to this modification is substantially similar to that shown in FIG. 4. Also, the effects obtained by providing the mask conductor on the outer periphery of the coil case and the applications thereof are considered similar to those explained above with reference to the modification of the first embodiment, and therefore will not be described again.

Figure 5:
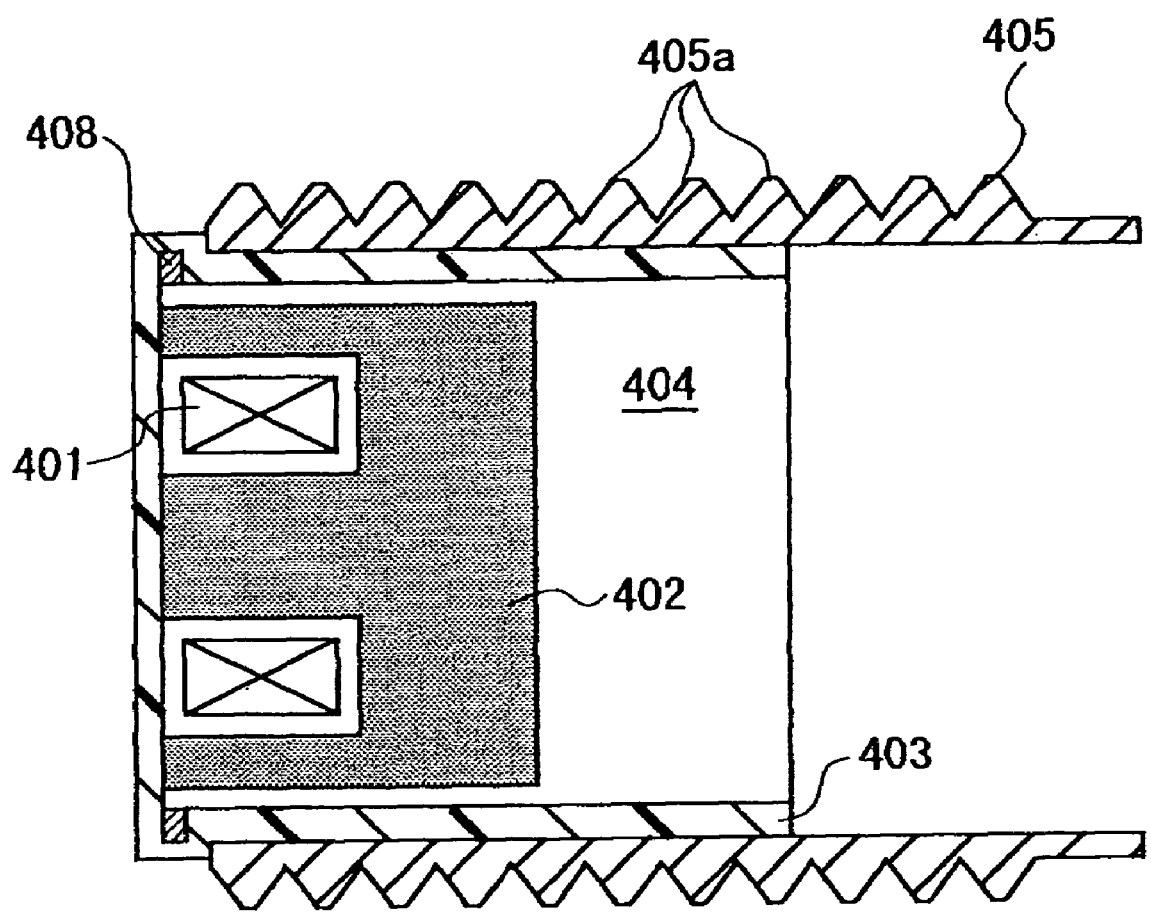
FIG. 5 is a diagram for explaining the structure of the detection coil assembly according to a third embodiment.

FIG. 5 shows the detection coil assembly 404 according to still another embodiment (third embodiment) with the body case 405. Similar component parts to those of the first and second embodiments described above are denoted by the same reference numerals, respectively, and will not be described again.

The third embodiment is different from the first and second embodiments in the configuration of the mask conductor 408. The mask conductor 408 according to the third embodiment is configured as an annular mask conductor 408.

This annular mask conductor 408 is fitted on the stepped portion formed at the forward end portion of the inner peripheral surface of the coil case 403. Like in the first and second embodiments, this stepped portion may be done without. Also, the annular mask conductor 408, like the mask conductors 406, 407 shown in the first and second embodiments, can be formed by insert molding or integral molding. Further, the seal function can be provided similarly (by grounding).

Though not shown as a characteristic graph, also according to the third embodiment, the variation width of the detection characteristic due to the difference in the material of the body case 405 is much smaller than that of the detection coil assembly according to the prior art 1 having no mask conductor. This is also estimated to be derived from the provision of the annular mask conductor 408 which reduces the reduced conductor detection sensitivity in the area where the case body 405 is present.

Figure 34:
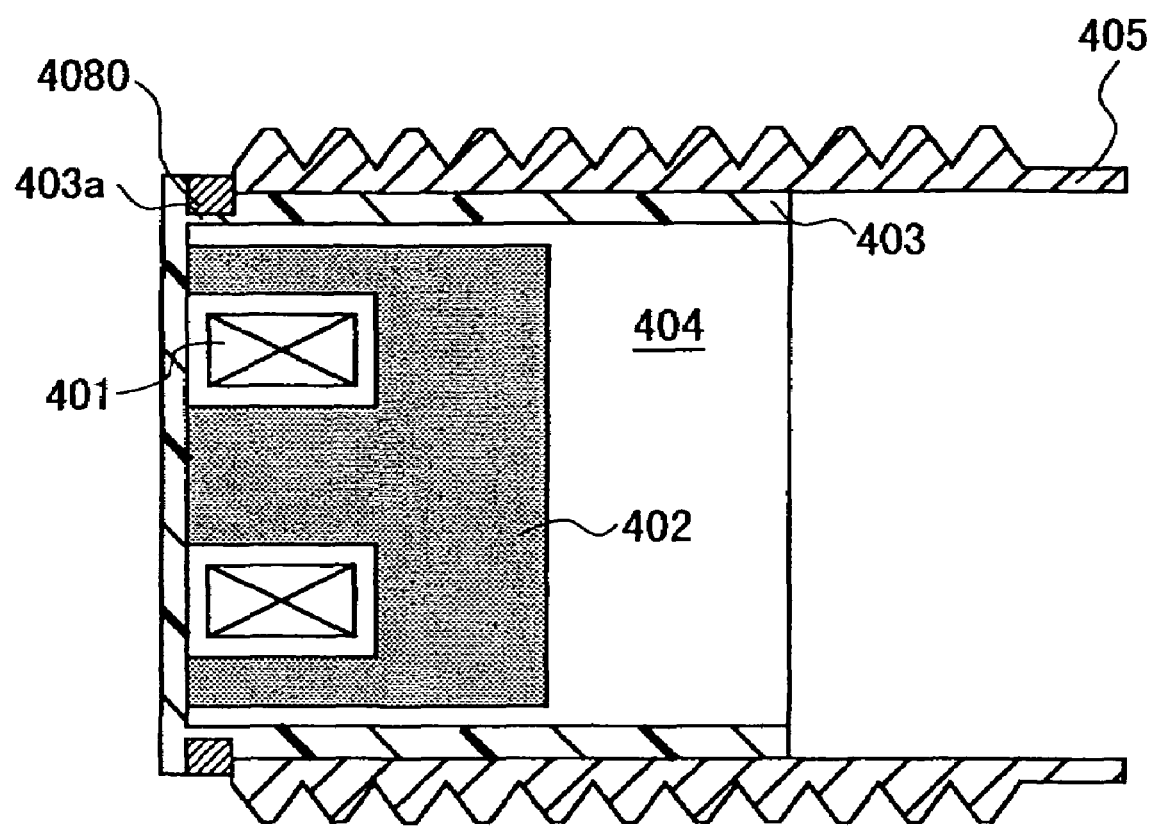
FIG. 34 is a diagram showing the detection coil assembly according to a modification of the third embodiment.

FIG. 34 shows this detection coil assembly according to a modification of the third embodiment. As shown in this drawing, also according to the third embodiment, the annular mask conductor can be arranged outside of the coil case 403.

The annular mask conductor 4080 according to this modification is fitted on the stepped portion (fitting portion 403a) formed at the forward end portion on the outer peripheral surface of the coil case 403. The body case 405, on the other hand, is fitted under pressure on the outer periphery of the detection coil assembly 404 without covering the outer peripheral surface of the annular mask conductor 4080.

The detection characteristic of the detection coil assembly 404 according to this embodiment is substantially similar to that of the third embodiment. Also, the provision of the mask conductor on the outer periphery of the coil case is considered to produce the same effect as and provide a similar application to the modification of the first embodiment described above.

Figure 6:
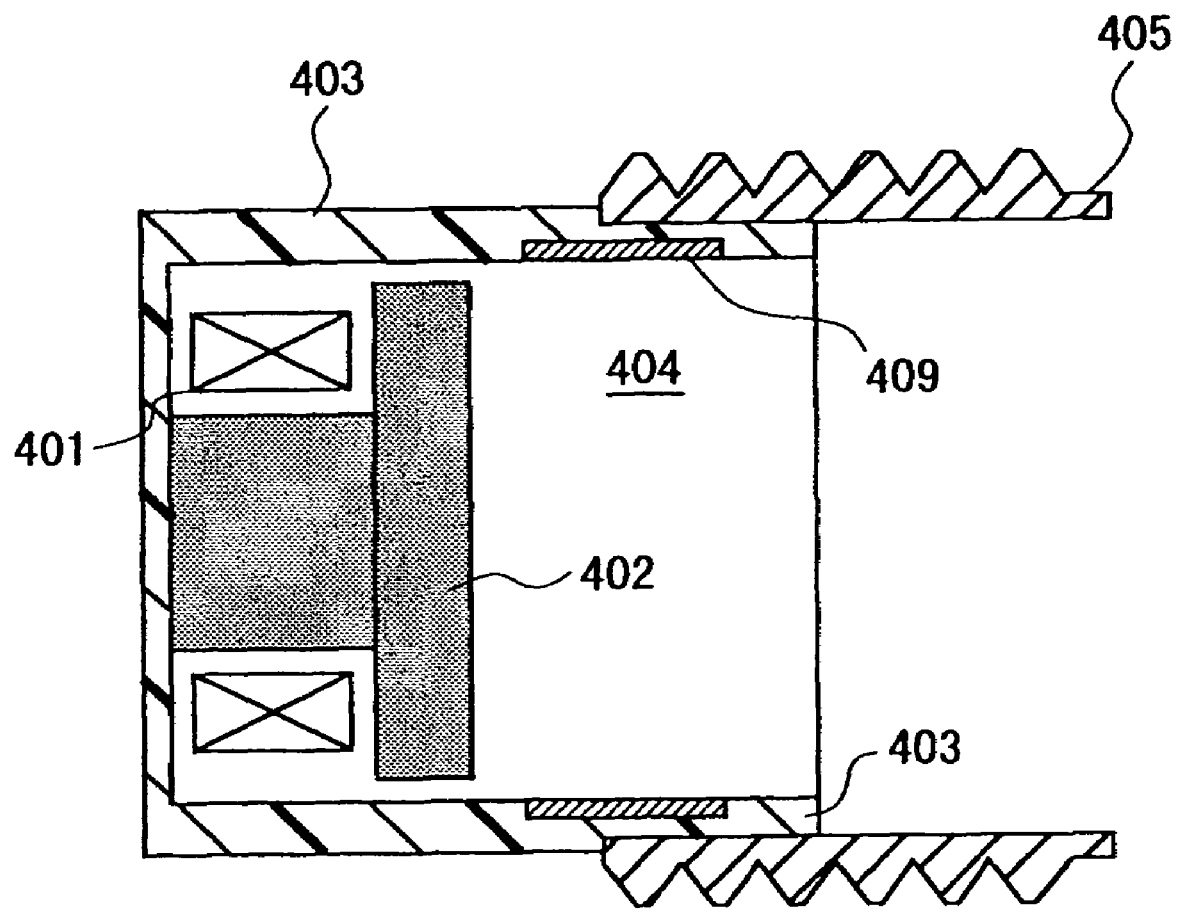
FIG. 6 is a diagram for explaining the structure of the detection coil assembly according to a fourth embodiment.

FIG. 6 shows the detection coil assembly 404 according to another embodiment (fourth embodiment) with the body case 405. This detection coil assembly 404 is intended as a unshielded type, and as apparent in comparison with the first to third embodiments described above, is so configured that the outer shell case 405 is fitted under pressure on the rear end portion of the coil case 403 in such a manner as to expose the greater part of the outer peripheral surface of the coil case 403. Also, the ferrite core 402 used in this modification has a T-shaped cross section. In the absence of the ferrite core 402 outside of the coil 403, the shield effect is lower. Nevertheless, the detection distance (detection performance) is improved over the first to third embodiments. The material of the coil 401, the ferrite core 402, the coil case 403 and the body case 405 is similar to those in the first to third embodiments.

According to the fourth embodiment, the cylindrical mask conductor 409 is used. The mask conductor 409 is located behind the coil 401 and the ferrite core 402 and arranged on the inner peripheral surface of the coil case 403 with the forward end portion thereof located forward of the forward end of the coil case 405. The material of the mask conductor 409 is similar to that in the first to third embodiments.

The stepped portion on the inner peripheral surface of the coil case 403 on which the cylindrical mask conductor 409 is fitted may be done without. The cylindrical mask conductor 409, like the mask conductor (406, 407, 408) according to the first to third embodiments, can be formed by insert molding or integral molding. Further, the shield function can also be attached similarly (by grounding).

Figure 7:
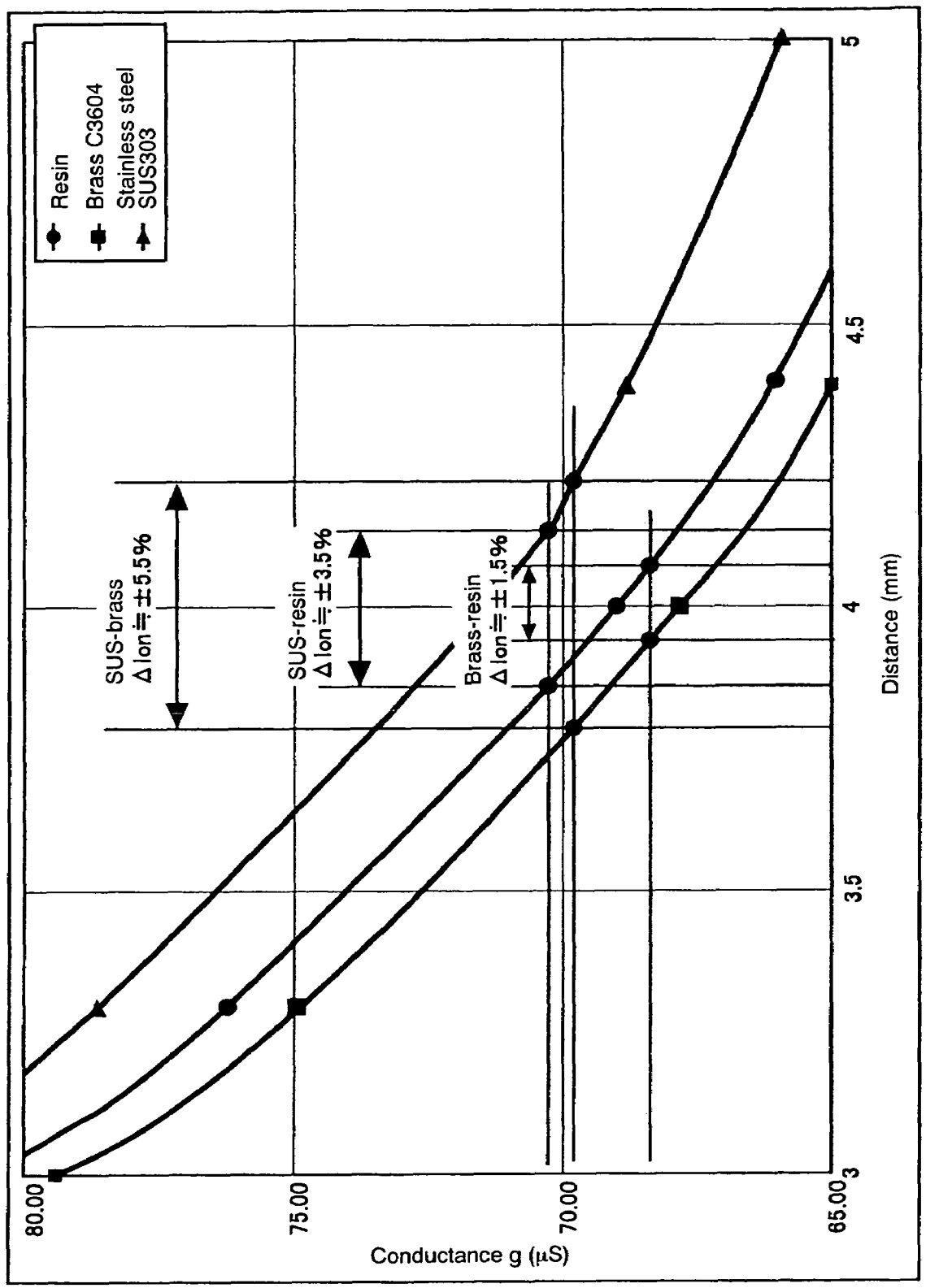
FIG. 7 is a graph showing the detection characteristic of the detection coil assembly according to the fourth embodiment (unshielded type, cylindrical mask conductor).
Figure 25:
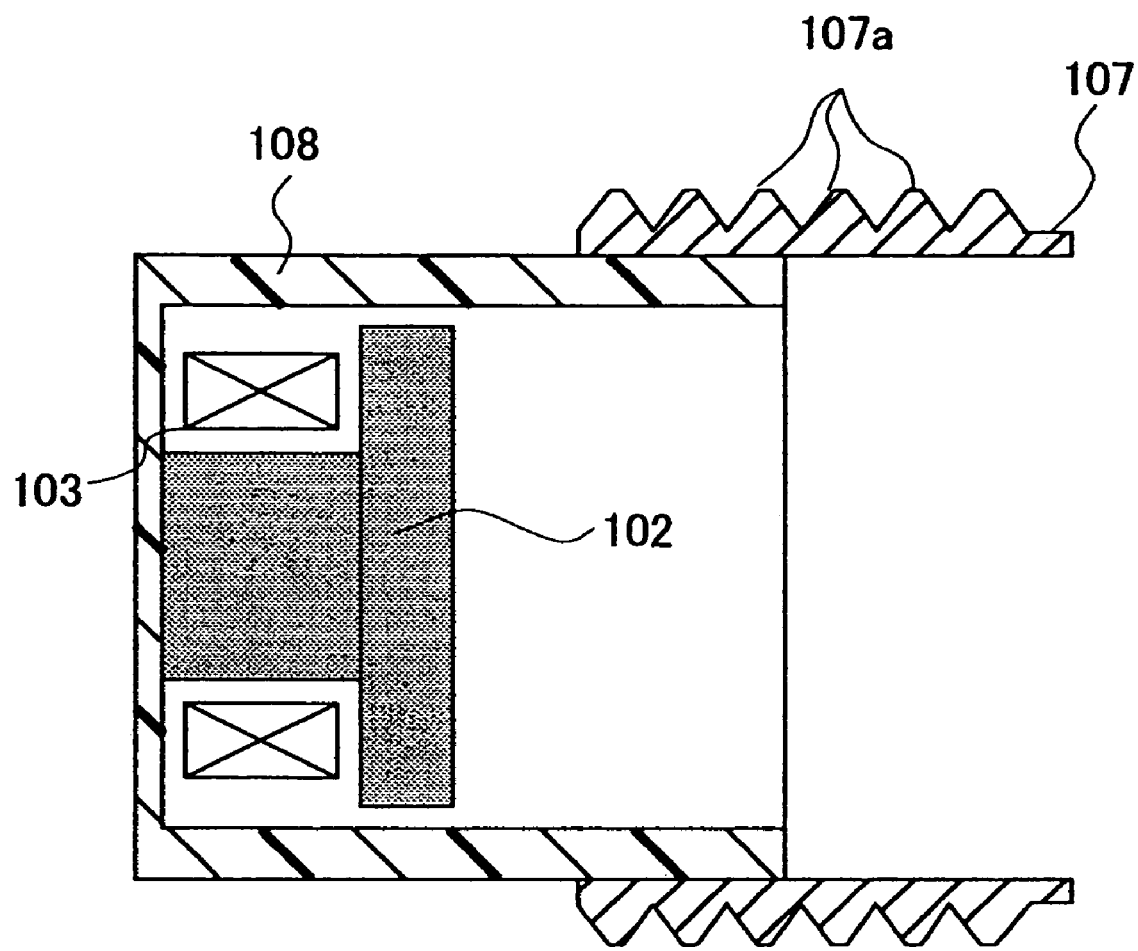
FIG. 25 is a diagram for explaining the structure of the detection coil assembly according to the prior art 2.
Figure 26:
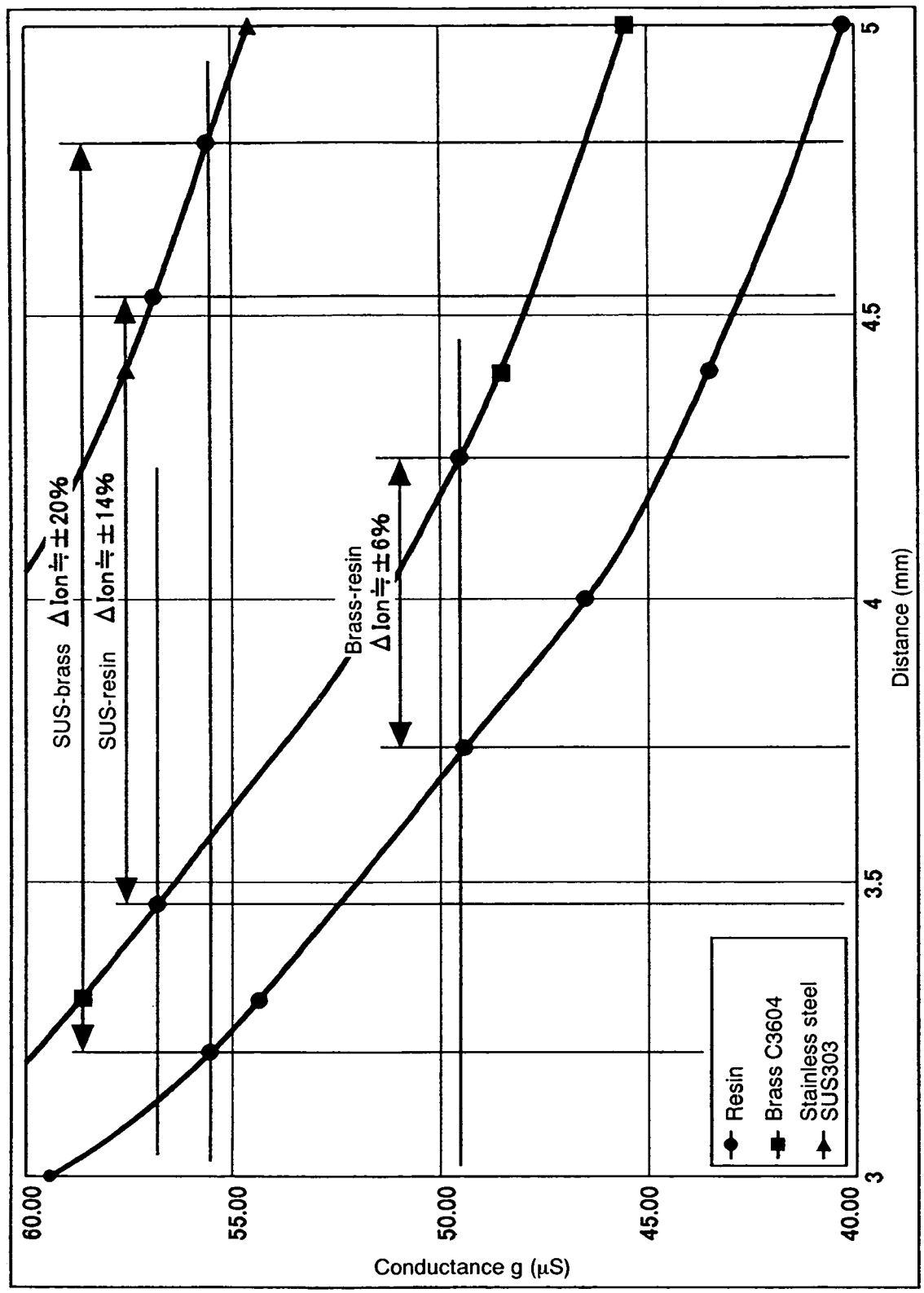
FIG. 26 is a graph showing the detection characteristic of the detection coil assembly according to the prior art 2 (unshielded type, no cylindrical member).

The detection characteristic of the detection coil assembly according to the fourth embodiment is shown in the graph of FIG. 7. As shown in this drawing, also according to the fourth embodiment, the variations of the material of the body case 405 including resin (nonmetal), brass and stainless steel result in the variations of the conductance characteristic (detection characteristic). As apparent from the comparison with the detection characteristic of the prior art 2 shown in FIG. 26, the variations of the detection characteristic according to this embodiment are much smaller than those of the detection coil assembly (FIG. 25) of the prior art 2.

Figure 35:
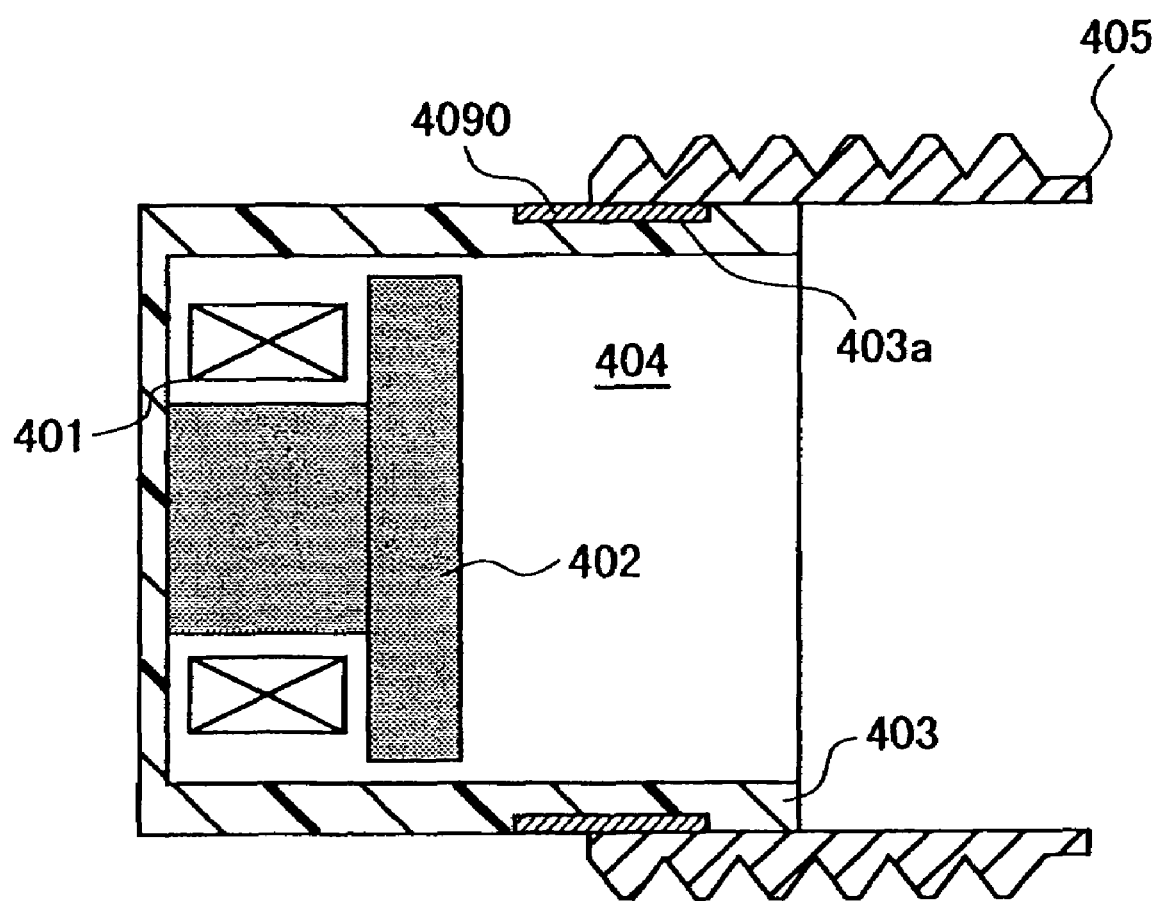
FIG. 35 is a diagram showing the detection coil assembly according to a modification of the fourth embodiment.

FIG. 35 shows the detection coil assembly according to a modification of the fourth embodiment. As shown in this drawing, also according to this fourth embodiment, the cylindrical mask conductor 4090 may be arranged on the outside of the coil case 403.

The cylindrical mask conductor 4090 according to this modification is fitted on the stepped portion 403a formed on the outer peripheral surface of the coil case 403. The position of the cylindrical mask conductor 4090 relative to the coil and the core is substantially the same as that of the cylindrical mask conductor 409 described above. The body case 405, on the other hand, is fitted under pressure on the outer periphery of the detection coil assembly 404 in such a manner as to cover at least one half of the outer peripheral surface of the cylindrical mask conductor 4090 with the forward end of the outer peripheral surface thereof exposed.

By the way, the detection characteristic of the detection coil assembly 404 according to this embodiment is substantially the same as that shown in FIG. 7. Also, the effect of and applications derived from the provision of the mask conductor on the outer periphery of the coil case are considered similar to those of the modification of the first embodiment described above.

Figure 8:
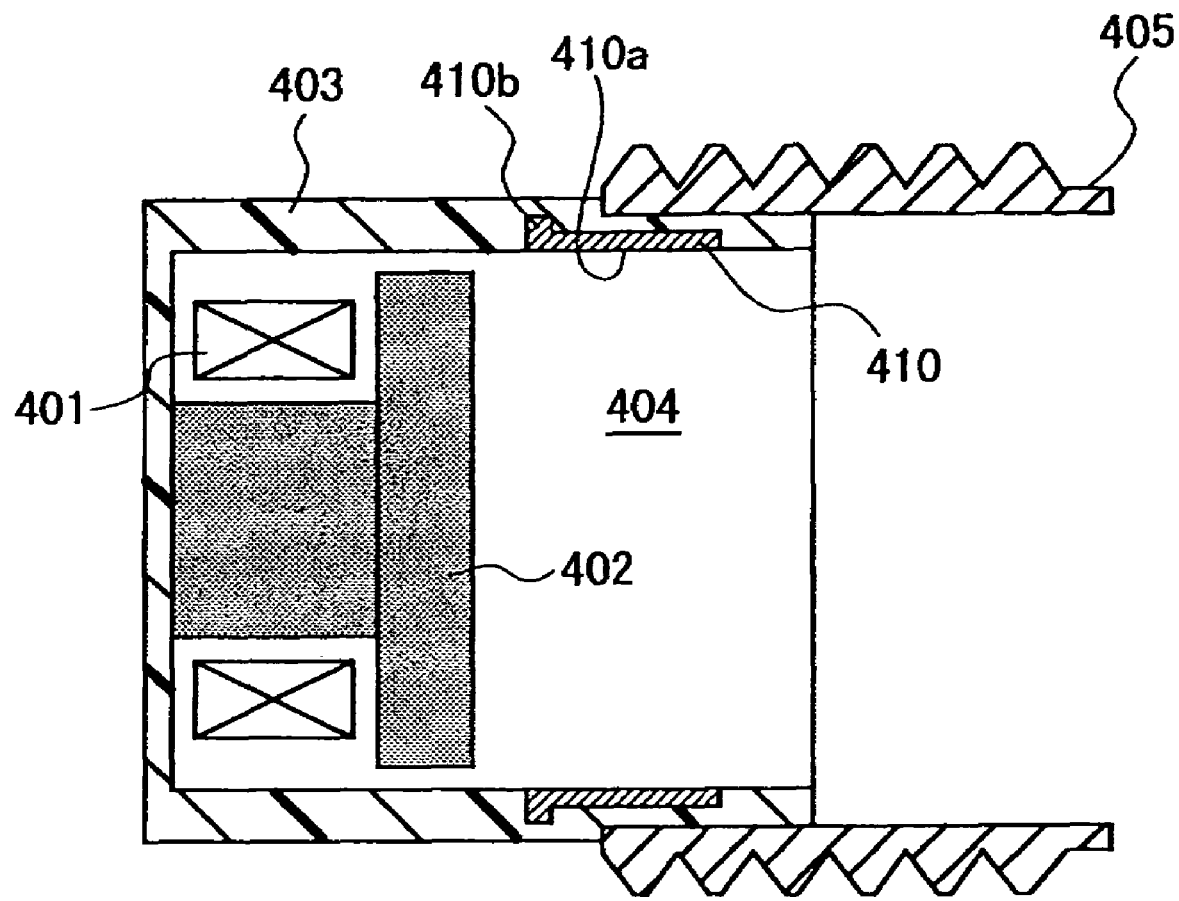
FIG. 8 is a diagram for explaining the structure of the detection coil assembly according to a fifth embodiment.

FIG. 8 shows the detection coil assembly 404 according to yet another embodiment (fifth embodiment) with the body case 405. This detection coil assembly is also intended as an unshielded type like the fourth embodiment shown in FIG. 6. Substantially the same component parts as those of the fourth embodiment are designated by the same reference numerals, respectively, and will not be described.

The fifth embodiment is different from the fourth embodiment in the configuration of the mask conductor 410. The mask conductor 410 according to the fifth embodiment is configured as a flanged cylinder having an annular flange 410b on the outer periphery at the forward end portion of the cylindrical body 410a.

This flanged mask conductor 410 may be configured of two different independent members (a flanged portion and a cylindrical portion). Also, the stepped portion formed on the inner peripheral surface of the coil case 403 and fitted with the flanged mask conductor 410 may be done without. Like the mask conductor 409 according to the fourth embodiment, the flanged mask conductor 410 may be formed by insert molding or integral molding. Further, the shielding function can be obtained in similar fashion (by grounding).

Figure 9:
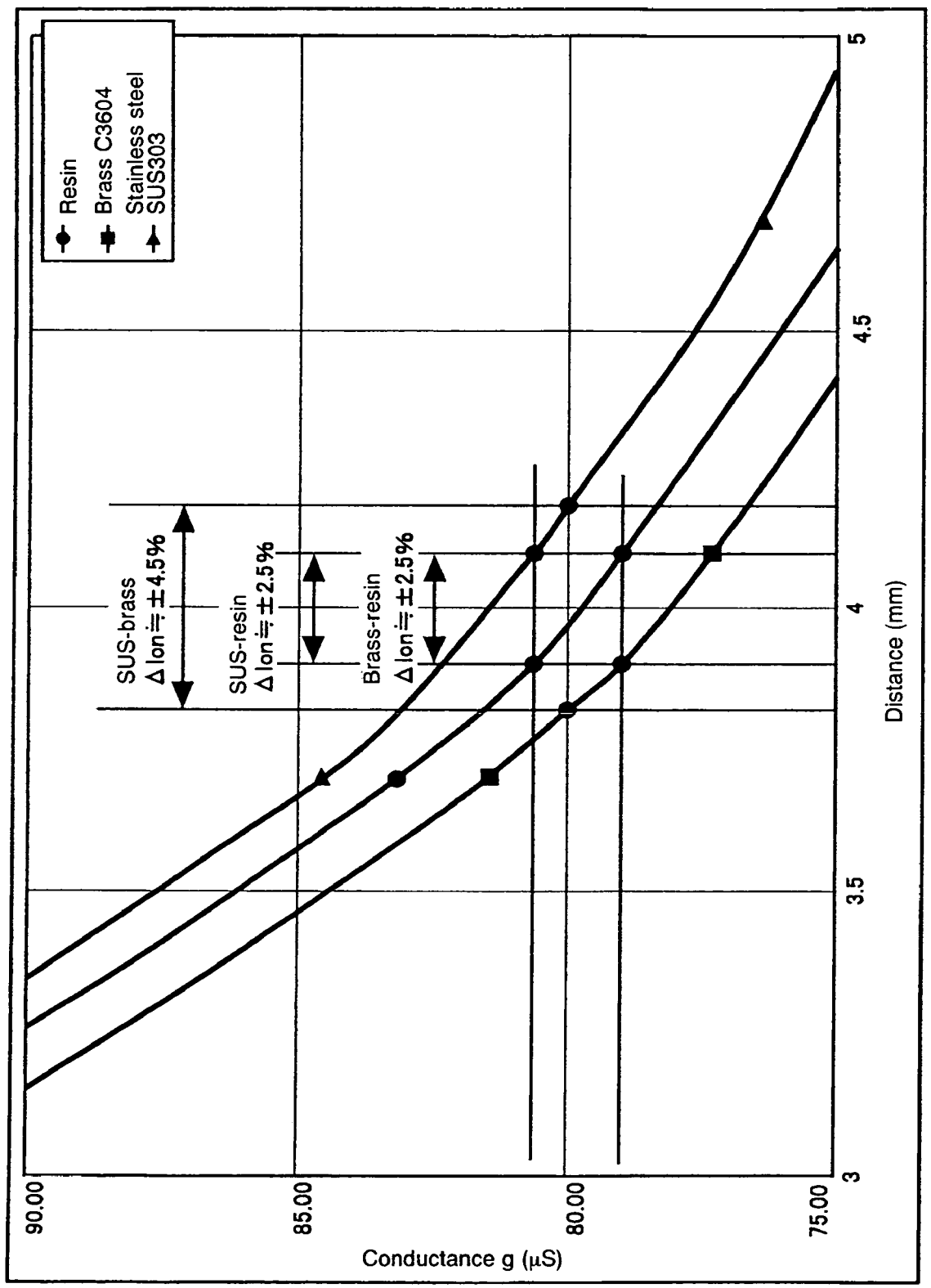
FIG. 9 is a graph showing the detection characteristic of the detection coil assembly according to the fifth embodiment (unshielded type, flanged mask conductor).

The detection characteristic of the detection coil assembly according to the fifth embodiment is shown in the graph of FIG. 9. As shown in this drawing, also in the fifth embodiment, different materials of the body case 405 including resin (nonmetal), brass and stainless steel change the conductance characteristic (detection characteristic) correspondingly. The variation width of the detection characteristic, however, is much smaller than that of the detection coil assembly (See FIGS. 25, 26) according to the prior art 2 lacking the mask conductor. Any way, it will be understood that according to the fifth embodiment, the variation width has been further reduced than for the detection characteristic of the fourth embodiment shown in FIG. 7 by forming the annular flange 410b on the outer periphery at the forward end portion of the flanged mask conductor 410.

Figure 36:
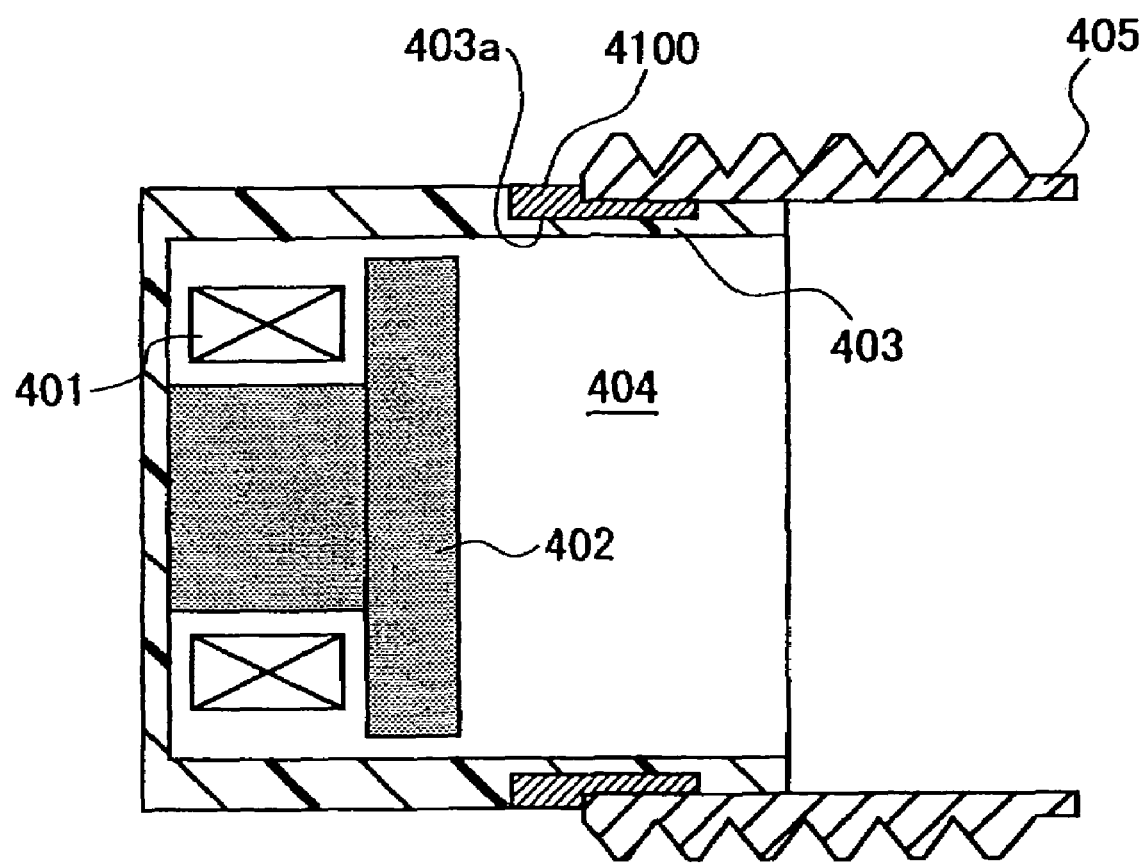
FIG. 36 is a diagram showing the detection coil assembly according to a modification of the fifth embodiment.

FIG. 36 shows a detection coil assembly according to a modification of the fifth embodiment. As shown in the drawing, also in this fifth embodiment, the flanged mask conductor is formed on the outside of the coil case 403.

The flanged mask conductor 4100 according to this modification is fitted on the stepped portion 403a formed on the outer peripheral surface of the coil case 403. The position of the flanged mask conductor 4070 relative to the coil and the core is substantially the same as that of the flanged mask conductor 410. The body case 405, on the other hand, is fitted under pressure on the outer periphery of the detection coil assembly 404 in such a manner as to cover the outer peripheral surface of the flanged mask conductor 4100 while exposing the outer peripheral surface of the flange portion 407b.

The detection characteristic of the detection coil assembly 4100 according to this embodiment is substantially the same as that of the embodiment shown in FIG. 9. Also, the effects of and the applications derived from the fact that the mask conductor is formed on the outer periphery of the coil case are considered similar to those for the modification of the first embodiment described above.

Figure 10:
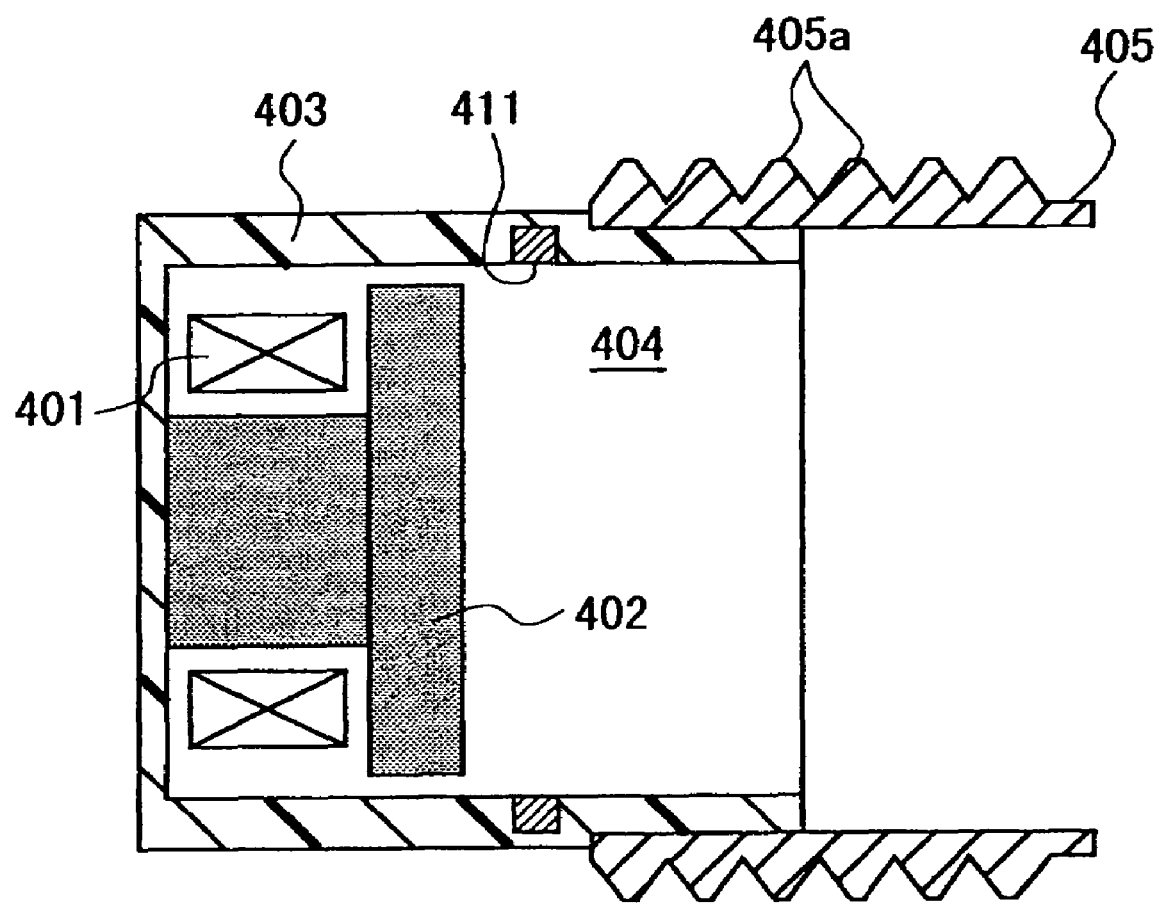
FIG. 10 is a diagram for explaining the structure of the detection coil assembly according to a sixth embodiment.

FIG. 10 shows the detection coil assembly 404 according to a further embodiment (sixth embodiment) together with the body case 405. In similar fashion to the aforementioned cases, substantially the same component parts as those of the fourth and fifth embodiments are designated by the same reference numerals, respectively, and will not be described again.

The difference of the sixth embodiment from the fourth and fifth embodiments lies in the configuration of the mask conductor 411. Specifically, the mask conductor 411 according to the sixth embodiment is configured as an annular mask conductor 411.

By the way, the annular mask conductor 411 has such a structure that it is fitted on the stepped portion formed on the inner peripheral surface of the coil case 403. Nevertheless, this stepped portion may be done without. Also, the annular mask conductor 411, like the mask conductors according to the fourth and fifth embodiments, can be formed by insert molding or integral molding. Further, the shielding function can be attached in similar fashion (by grounding).

The characteristic graph is not shown. Also in this sixth embodiment, however, the variation width of the detection characteristic due to the different materials of the body case 405 is much smaller than that of the detection coil assembly according to the prior art 2 having no mask conductor. This is estimated to result from the fact that the conductor detection sensitivity in the area where the case body 405 is present is reduced by forming the annular mask conductor 411.

Figure 37:
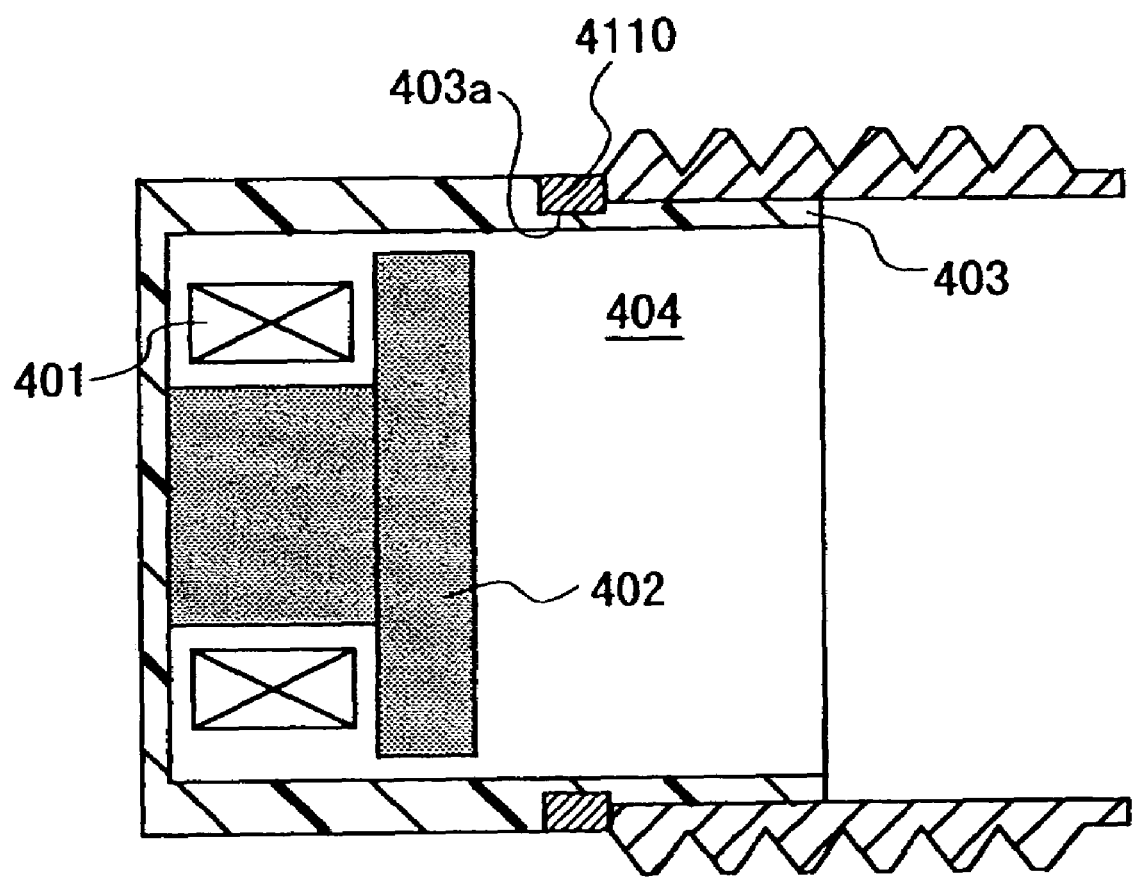
FIG. 37 is a diagram showing the detection coil assembly according to a modification of the sixth embodiment.

FIG. 37 shows the detection coil assembly according to a modification of the sixth embodiment. As shown in this diagram, also in the sixth embodiment, the annular mask conductor 4110 can be formed on the outside of the coil case 403.

The annular mask conductor 4110 according to this modification is fitted on the stepped portion (fitting portion 403a) formed on the outer peripheral surface of the coil case 403. The body case 405, on the other hand, is fitted under pressure on the outer periphery of the detection coil assembly 404 without covering the outer peripheral surface of the annular mask conductor 4110.

By the way, the detection characteristic of the detection coil assembly according to this embodiment is substantially the same as that of the sixth embodiment described above. Also, the effects of and the applications derived from the fact that the mask conductor is formed on the outer periphery of the coil case are considered similar to those described above with reference to the modification of the first embodiment.

Figure 11:
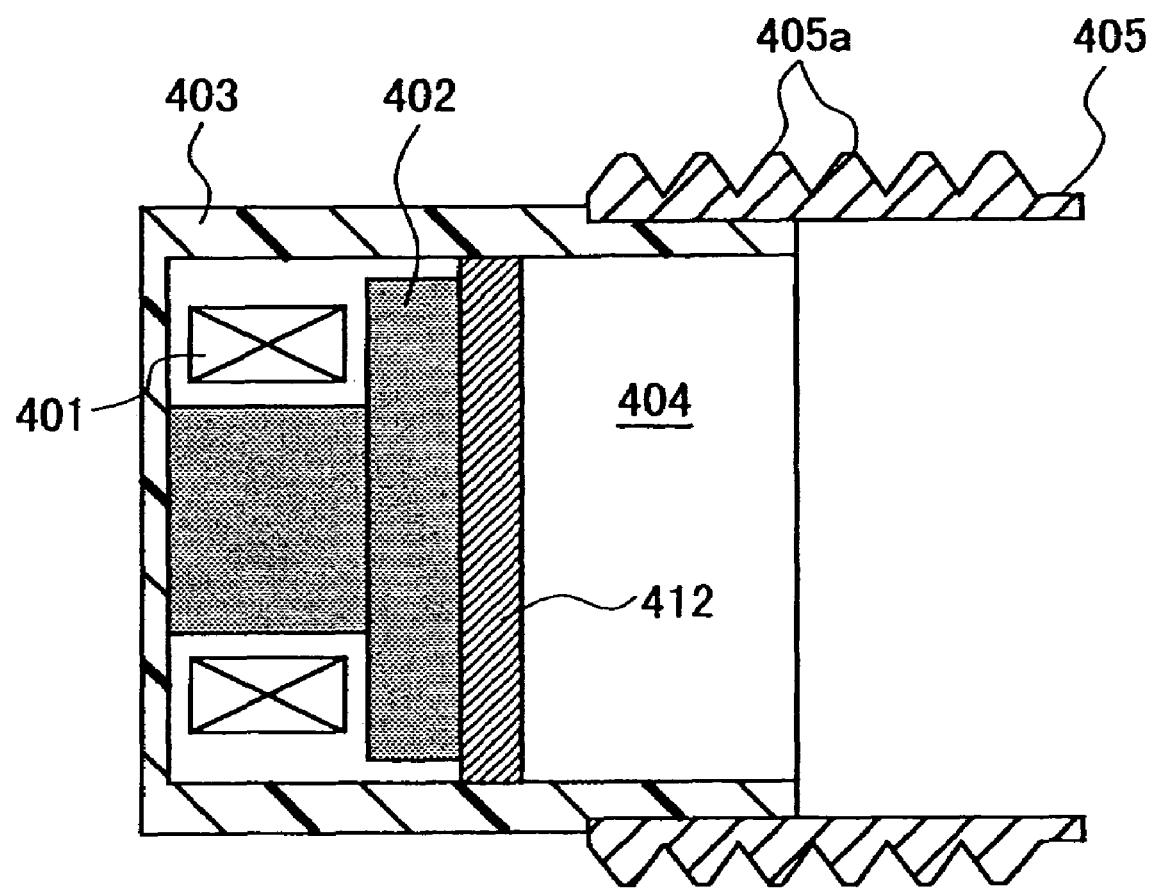
FIG. 11 a diagram for explaining the structure of the detection coil assembly according to a seventh embodiment.

FIG. 11 shows the detection coil assembly 404 according to a still further embodiment (seventh embodiment) together with the body case 405. This detection coil assembly, like the fourth to sixth embodiments, is intended for unshielded type. The difference of this embodiment from the fourth to sixth embodiments lies in the mask conductor 412. The mask conductor 412 according to this embodiment is in the shape of disk, and arranged in close contact with the back of the ferrite core 402 in such a manner as to close the rear opening of the coil case 403.

By the way, the material of this discal mask conductor 412 is similar to those of the mask conductors 406 to 411 described above. Also, the shielding effect can be obtained against external noises by grounding the discal mask conductor 412 to a steady potential (ground).

The characteristic graph is not shown. It has been confirmed, however, that according to this seventh embodiment, too, the range of variations of the detection characteristic due to different materials of the body case 405 is much smaller than that for the detection coil assembly according to the prior art 2 having no mask conductor.

Next, the detection circuit assembly 500 making up another component part of the detection end module according to the invention and the configuration of the whole proximity sensor circuits comprising the detection circuit assembly 500 and the output circuit assembly will be explained with reference to several examples.

Figure 12:
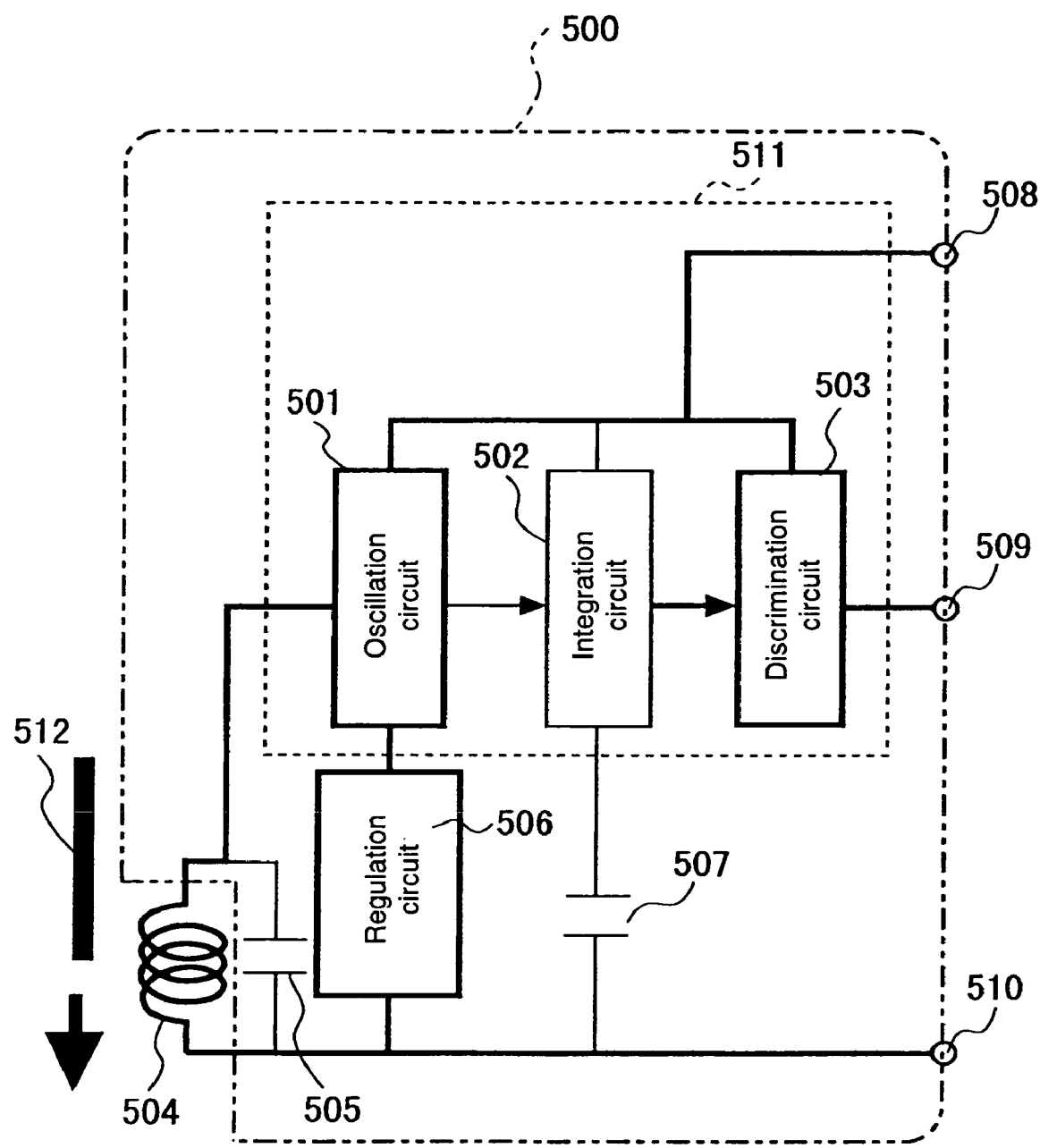
FIG. 12 is a circuit diagram showing the detection circuit assembly according to the first embodiment.
Figure 27:
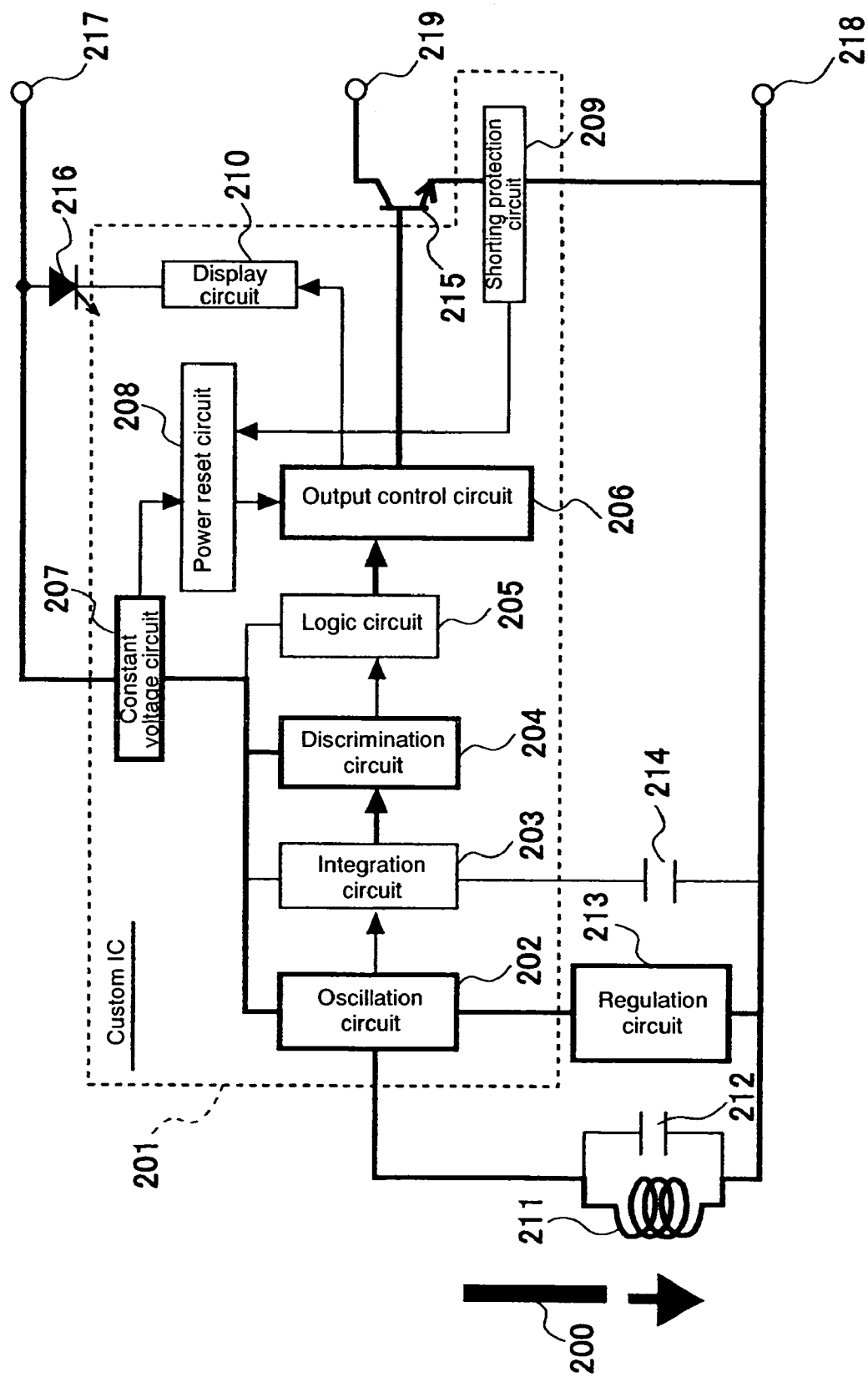
FIG. 27 is a block diagram showing a circuit configuration of the proximity sensor of DC three-line type corresponding to the prior art 1.
Figure 28:
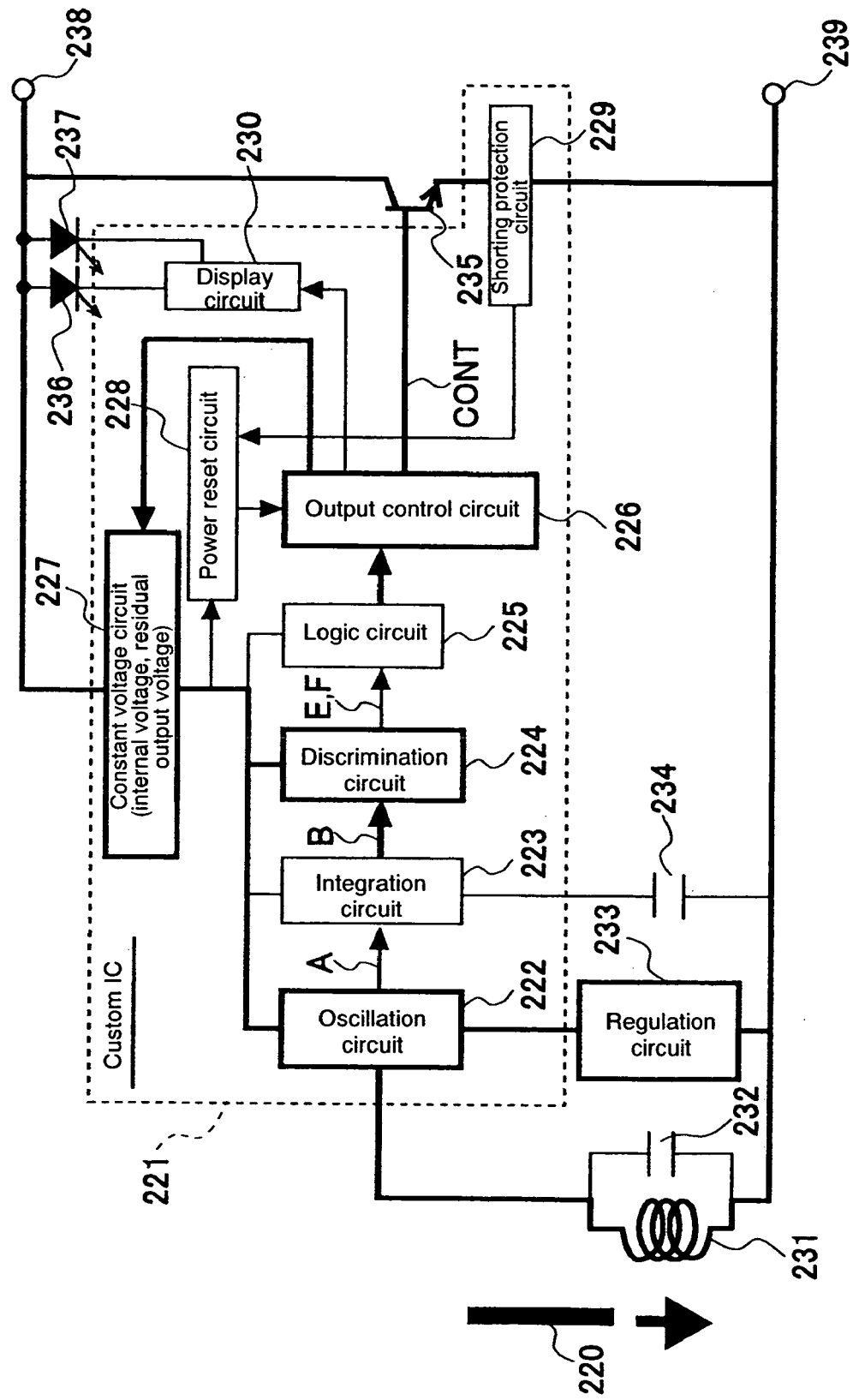
FIG. 28 is a block diagram showing a circuit configuration of the proximity sensor of DC two-line type corresponding to the prior art.
Figure 29:
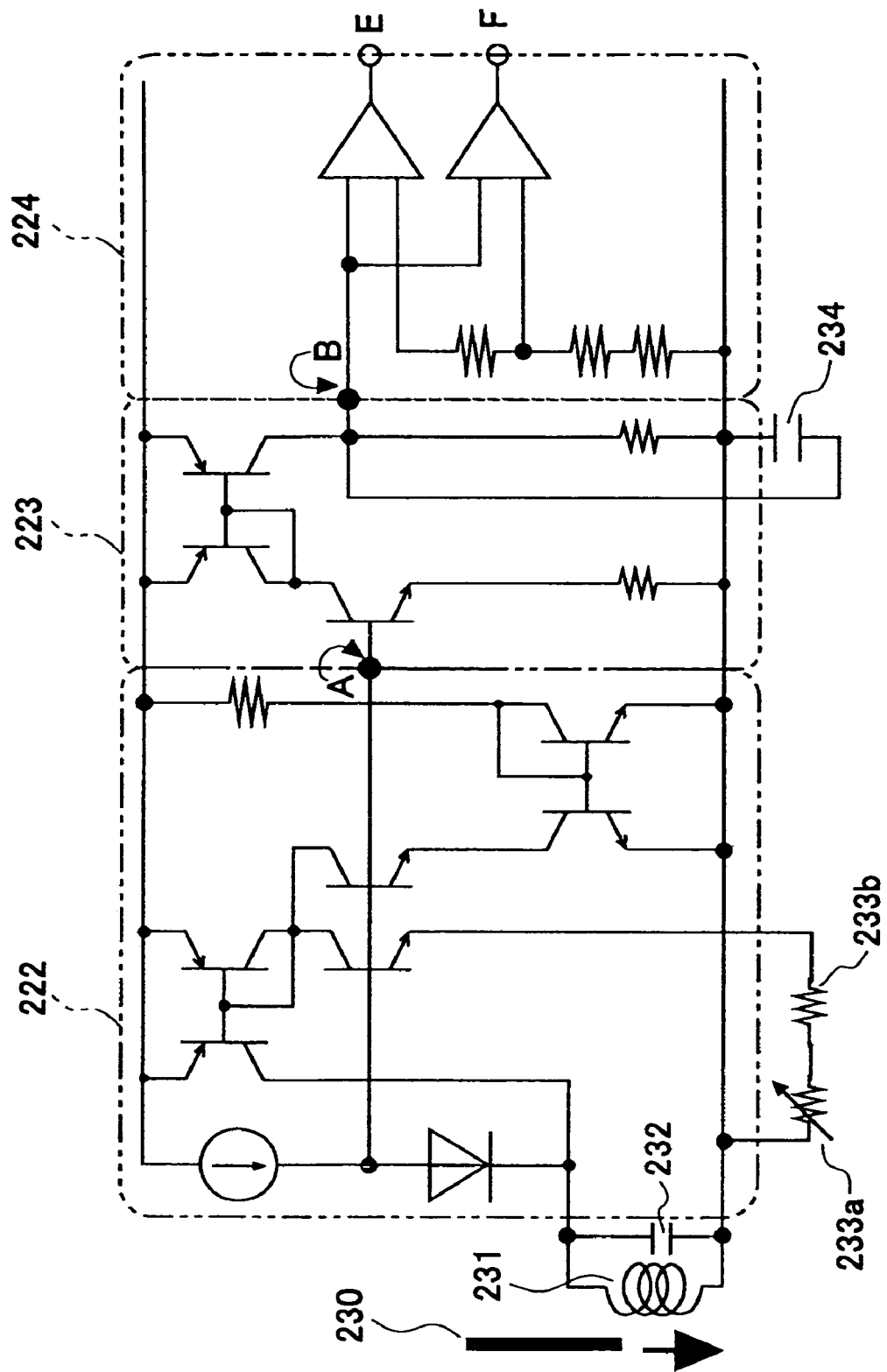
FIG. 29 is a circuit diagram showing a specific configuration of the oscillation circuit, integration circuit and the discrimination circuit according to the prior art.

FIG. 12 shows a circuit configuration of the detection circuit assembly making up the detection end module according to an embodiment (first embodiment) of the invention. In this drawing, numeral 501 designates an oscillation circuit, numeral 502 an integration circuit, numeral 503 a discrimination circuit, numeral 504 a detection coil, numeral 505 a resonance capacitor, numeral 506 a regulation circuit, numeral 507 an integration capacitor, and numeral 509 an output terminal. Each of these component parts performs the same operation as the corresponding circuit elements, respectively, of the prior art shown in FIG. 27. These circuit elements are appropriately integrated, and as described later, mounted on a circuit board not shown to make up a detection circuit assembly 500.

Numerals 508, 510 designate power supply terminals supplied from an external source (output circuit module) with the constant voltage for driving the detection circuit assembly 500. Numeral 509 designates a detection signal output terminal of the detection circuit assembly 500. Numeral 511 designates a custom IC (integrated circuit) having the main circuit elements of the detection circuit assembly 500 built in one chip.

The oscillation voltage of the oscillation circuit 501 is smoothed by the integration circuit 502 and then compared with a reference voltage at the discrimination circuit 503, so that a binarized detection signal appears at the detection signal output terminal 509.

The regulation circuit 506 supplies a predetermined constant voltage (the constant voltage value supplied by the output circuit module described later) to the power supply terminals 508, 510, and sets the detection circuit assembly 500 in a state ready for operation. In this way, the regulation circuit 506 is used for replacing a part of a plurality of resistors to attain a predetermined detection sensitivity or for adjusting the gain of the oscillation circuit 501 by laser trimming or otherwise.

By the way, the oscillation circuit 501 may be either a circuit in which the oscillation stops/starts with the approach of a metal object or a circuit in which the oscillation frequency changes but the oscillation amplitude. The circuit block built in the custom IC 511 is not limited to the example shown but a part thereof may be taken out of the IC as required. The regulation circuit 506 is not necessarily built in unless the variations of the detection sensitivity are considerable. A temperature correcting circuit having a thermistor or the like may be incorporated in the regulation circuit.

The detection coil assembly making up the detection circuit assembly 500 may be the detection coil assembly 404 according to any one of the first to seventh embodiments (including the modifications) described above with reference to FIGS. 1 to 11. This detection coil assembly 404 includes the coil 401 and the core 402. The coil 401 corresponds to the detection coil 504 shown in FIG. 12. The coil 504 included in the detection coil assembly 404 constitutes a resonance circuit element of the oscillation circuit 501 included in the detection circuit assembly 500.

As explained with reference to FIGS. 1 to 11, the detection coil assembly 404 incorporates the mask conductor for reducing the conductor detection sensitivity in a specific peripheral area where the body case 405 is assumed to exist.

A signal in a predetermined form corresponding to the oscillation condition of the oscillation circuit 501 is output from the output terminal 509 of the detection circuit assembly 500 as an external object detection signal for the proximity sensor. This detection signal is a binarized signal.

An output stage circuit is configured by appropriately utilizing the object detection signal output from the output terminal 509 of the detection circuit assembly 500, thereby making it possible to output a predetermined desired form of signal from the proximity sensor. This will be described in detail later.

In the detection circuit assembly described above and shown in FIG. 12, (1) the detection function of the proximity sensor is separated from the output circuit portion, and therefore the same detection circuit assembly 500 can be shared by different power specifications and output status of the proximity sensor. In addition, a detection end module high in shareability can be realized by setting the oscillation and regulation circuit constants corresponding to the specification of the coil connected and adjusting the detection distance according to each specific distance.

Further, as compared with the conventional method of integrating the whole circuits of the proximity sensor, only circuits of very small size can be integrated satisfactorily. Also, the number of different ICs required for different detection specifications can be reduced (the amount of each type of devices is increased considerably). As a result, the acquisition cost of IC is greatly reduced. Also, even in case of the need for IC design change or quality improvement, the fact that one type of IC can be shared by many types of proximity sensors often makes it possible to meet the requirements simply by changing the IC or the detection end module without taking the measure individually for a great variety of commodities.

Figure 13:
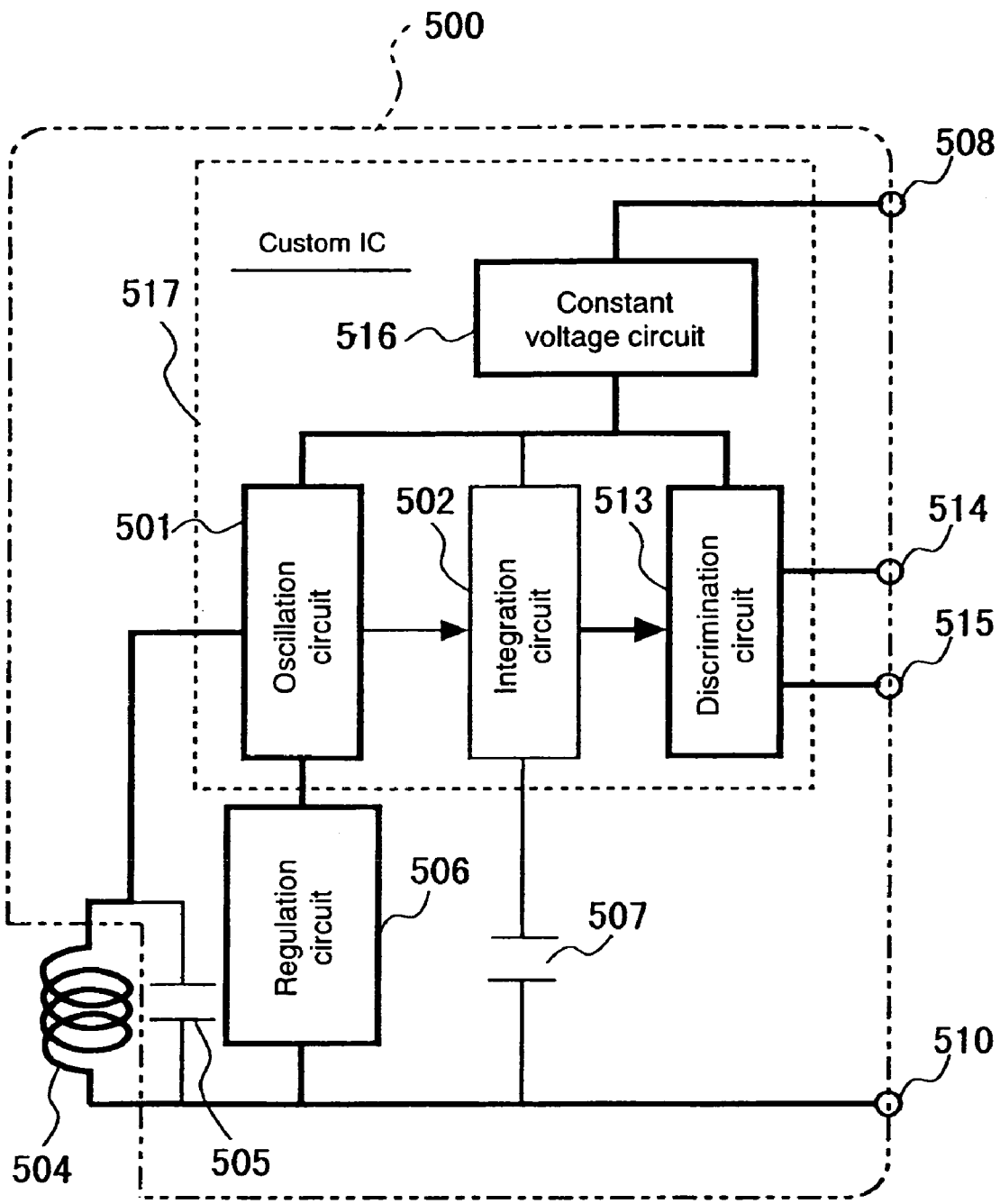
FIG. 13 is a circuit diagram showing the detection circuit assembly according to the second embodiment.

FIG. 13 shows a circuit configuration of a detection circuit assembly making up a detection end module according to still another embodiment (second embodiment) of the invention. In this drawing, numeral 501 designates an oscillation circuit, numeral 502 an integration circuit, numeral 513 a discrimination circuit for outputting two types of binarized signals with different reference threshold values, numeral 504 a detection coil, numeral 505 a resonance capacitor, numeral 506 a regulation circuit, numeral 507 an integration capacitor, numerals 514, 515 output terminals, and numeral 516 a constant voltage circuit. Each of these component parts operates the same way as the corresponding circuit elements according to the prior art shown in FIG. 27. These circuit elements are appropriately integrated, and as described later, mounted on a circuit board not shown, thereby making up a detection circuit assembly 500.

According to this second embodiment, the provision of the constant voltage circuit 516 in he detection circuit assembly (first embodiment) 500 produces a stable internal constant voltage against even a slight variation of the external constant voltage supplied from an external source and therefore can improve the detection sensitivity to a higher accuracy.

In addition, in view of the fact that two types of binarized signals having different reference threshold values are obtained from the discrimination circuit 513, the oscillation condition of the oscillation circuit can be recognized more accurately. Thus, the presence of an object to be detected (not only the presence or absence, but also whether the object is located far or near) with higher accuracy.

The custom IC 517 has built therein the oscillation circuit 501, the integration circuit 502, the discrimination circuit 513 and the constant voltage circuit 516. The other parts of the configuration are similar to those of the first embodiment shown in FIG. 12, and by designating them with the same reference numerals, respectively, the particular parts will not be described again.

The detection sensitivity of the oscillation circuit is very high against the change of the driving voltage. With the detection circuit assembly according to the second embodiment, however, the provision of the constant voltage circuit 516 in the detection circuit assembly 500 can maintain a stable detection sensitivity with high accuracy even against the change in the constant voltage supplied as power to the detection circuit assembly 500 (In other words, the output circuit module can be configured with a constant voltage not so high in accuracy).

As a result, the accuracy of the driving power can be made rough (lower in cost) for adjusting the detection sensitivity in the detection end module production line, and the adjusted detection sensitivity is prevented from being displaced by the variations of the constant voltage output of the output circuit module subsequently connected.

Figure 14:
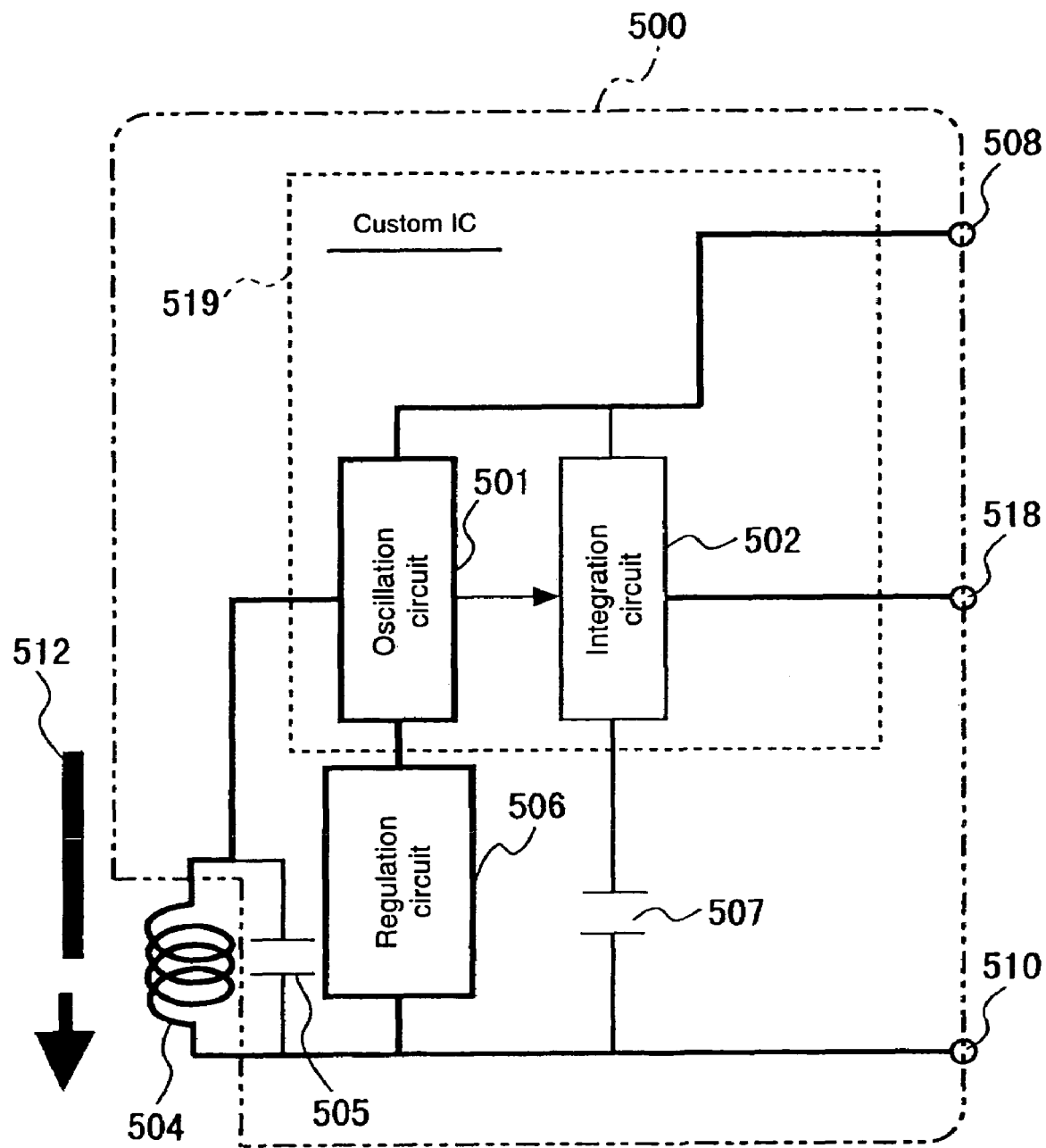
FIG. 14 is a diagram showing the detection circuit assembly according to the third embodiment.

FIG. 14 shows a circuit configuration of a detection circuit assembly making up a detection end module according to yet another embodiment (third embodiment) of the invention. In this drawing, numeral 501 designates an oscillation circuit, numeral 502 an integration circuit, numeral 504 a detection coil, numeral 505 a resonance capacitor, numeral 506 a regulation circuit, numeral 507 an integration capacitor, and numeral 518 an output terminal for outputting an analog signal corresponding to the oscillation condition of the oscillation circuit 501, each performing a similar operation to the corresponding circuit elements of the prior art shown in FIG. 27. These circuit elements are appropriately integrated and, as described later, mounted on a circuit board not shown thereby to make up a detection circuit assembly 500.

According to this third embodiment, the output of the integration circuit 502 is produced as it is from the output terminal 518 without being binarized. The oscillation circuit 501 employed has such a characteristic that the oscillation amplitude changes substantially linearly in accordance with the distance from an approaching metal object. Therefore, the detection signal obtained from the output terminal 518 exhibits a substantially linear output voltage characteristic against the distance from the metal object. Also, this configuration in which the output of the integration circuit 502 is output outside as it is makes it possible to execute the discrimination process with reference to an arbitrary threshold value by a device external to the detection circuit assembly 500, thereby correspondingly increasing the design altitude for the detection distance, etc.

By the way, the custom IC 519 has built therein the oscillation circuit 501 and the integration circuit 502. The other parts of the configuration are similar to those of the first embodiment shown in FIG. 12, and by designating them with the same reference numerals as in the first embodiment, will not be described again.

In the detection circuit assembly (third embodiment) 500 described above and shown in FIG. 14, the detection signal output of the detection end module is an analog output (substantially linear), and therefore the detection sensitivity can be arbitrarily adjusted (set) on the output circuit module side. As a result, the oscillation circuit constant is not required to be changed, and therefore a great variety of commodities can be offered to meet a variety of user needs. Also, the proximity sensor can produce an analog output.

Figure 15:
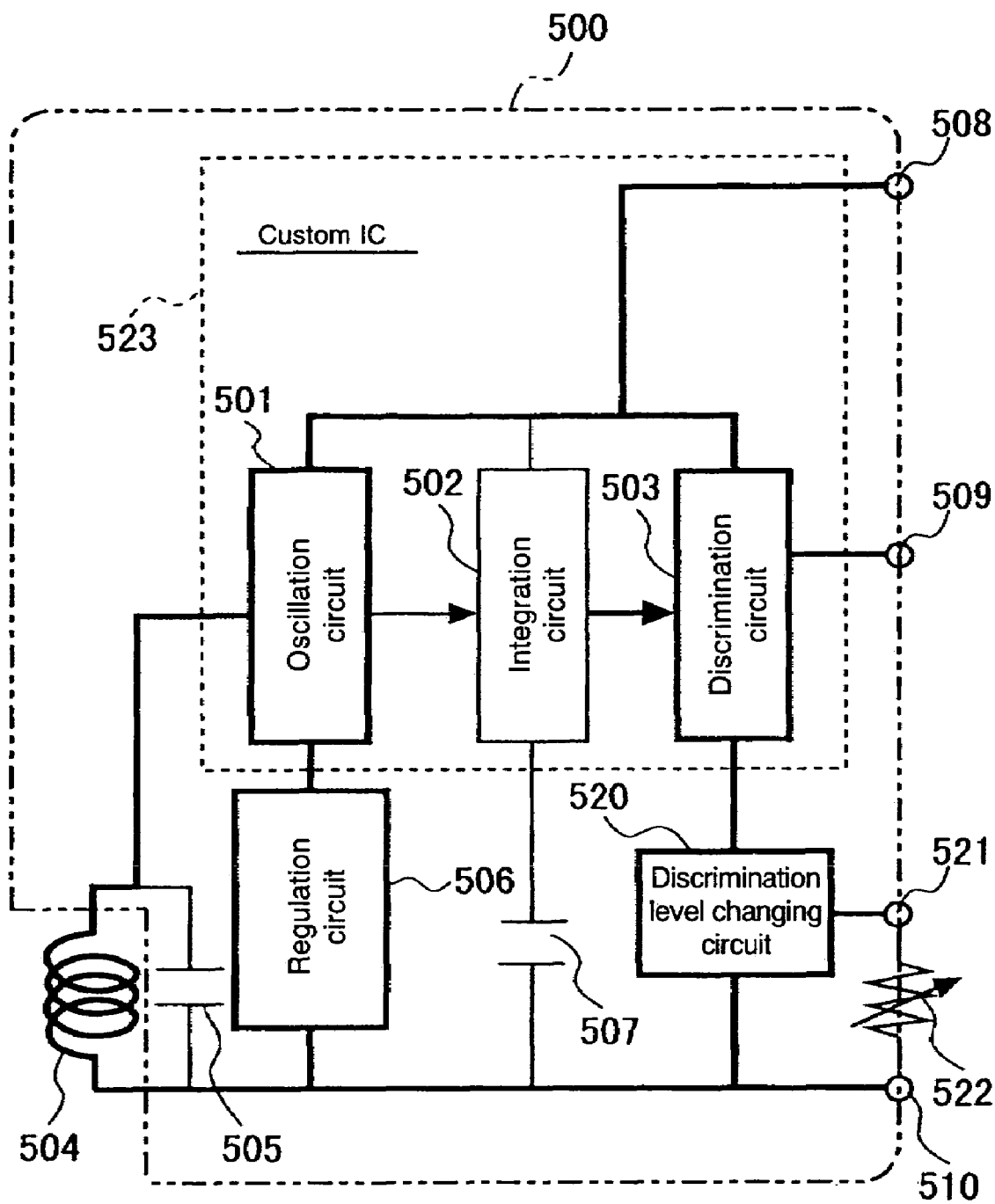
FIG. 15 is a circuit diagram showing the detection circuit assembly according to the fourth embodiment.

FIG. 15 shows a circuit configuration of the detection circuit assembly making up a detection end module according to a further embodiment (fourth embodiment) of the invention. In this drawing, numeral 501 designates an oscillation circuit, numeral 502 an integration circuit, numeral 503 a discrimination circuit, numeral 504 a detection coil, numeral 509 an output terminal for outputting the binary output of the discrimination circuit 503 as a detection signal, numeral 505 a resonance capacitor, numeral 506 a regulation circuit, numeral 507 an integration capacitor, numerals 508, 510 power supply terminals, numeral 520 a discrimination level change circuit for adjusting the discrimination level of the discrimination circuit 503, numeral 521 a connecting terminal for an external resistor for regulation, and numeral 522 a variable resistor for regulation. Of all these component parts, those already explained operate similarly to the corresponding circuit elements, respectively, of the prior art shown in FIG. 27. These circuit elements are appropriately integrated and as described later, mounted on a circuit board not shown, thereby making up a detection circuit assembly 500.

According to this fourth embodiment, the detection sensitivity can be finely adjusted by inserting a variable resistor 522 having a variable range corresponding to the predesigned resistance value characteristic variable against the detection sensitivity, between the external terminals 521, 510 of the detection circuit module 500 once adjusted.

The method of inputting data from the external terminal 521 is not limited to the connection of a variable resistor, but a microcomputer is incorporated in the discrimination level change circuit 520, for example, thereby to input a predetermined data.

With the detection circuit assembly (fourth embodiment) 500 described above and shown in FIG. 15, the detection sensitivity is adjusted by the detection end module. In the case where it is desired to finely correct the detection sensitivity in keeping with the user needs, for example, commodities can be offered (designed or produced) easily without taking the trouble of configuring a discrimination circuit on the output circuit module side and adjusting the detection sensitivity.

Figure 16:
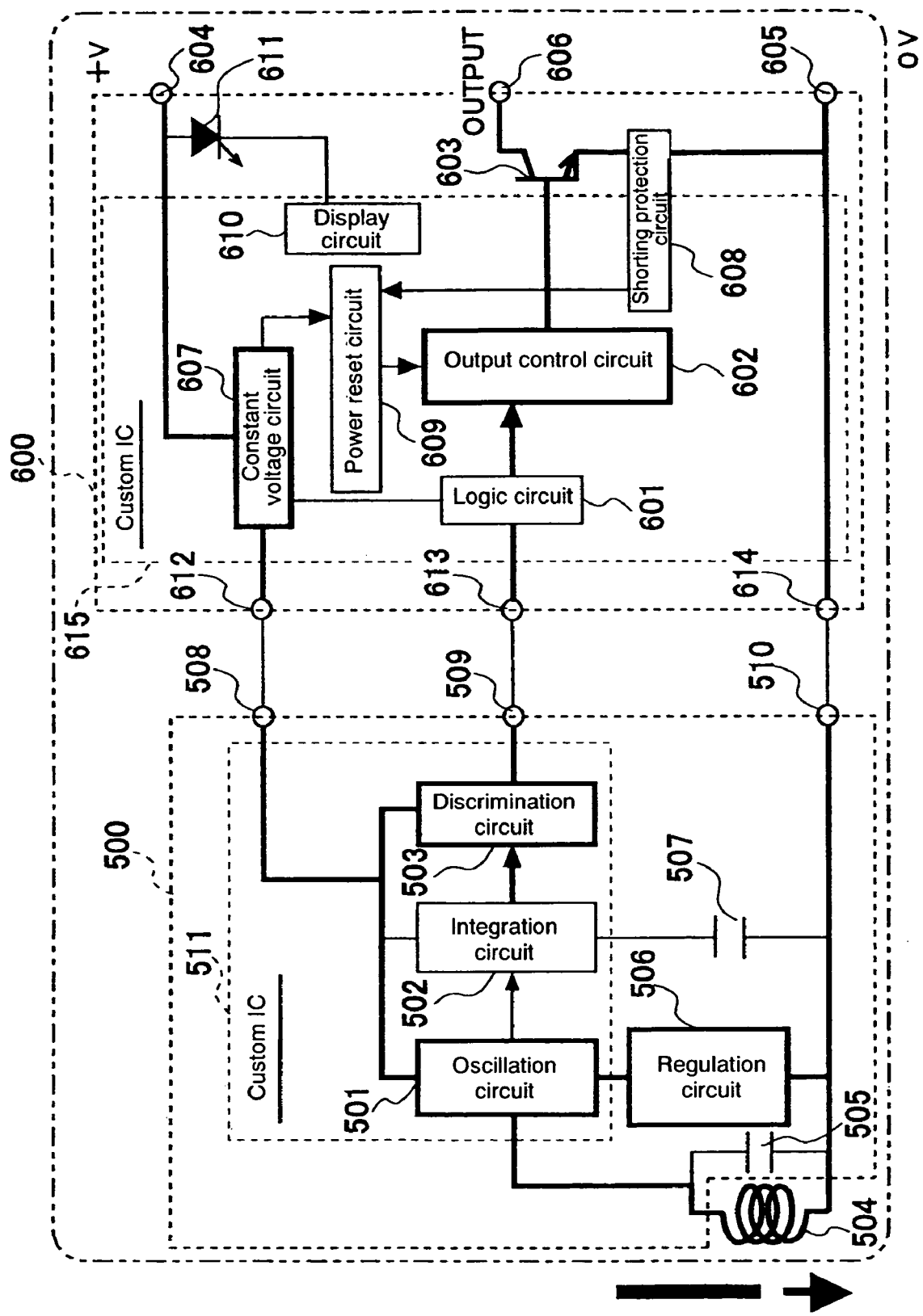
FIG. 16 is a circuit diagram (No. 1) showing a general configuration of a proximity sensor circuit including a combination of the detection circuit assembly (first embodiment) and the output circuit assembly (first embodiment).

FIG. 16 shows the whole electrical circuits of the proximity sensor configured of the detection circuit assembly (first embodiment) 500 shown in FIG. 12 and the output circuit module (also called the output circuit assembly) (first embodiment) separately produced.

The detection circuit assembly (first embodiment) 500 was explained in detail already with reference to FIG. 12, and therefore the configuration and the operation thereof will not be explained again.

The output circuit assembly 600 according to the first embodiment corresponds to the three-line output system. Specifically, in the drawing, numeral 601 designates a logic circuit, numeral 602 an output control circuit, numeral 603 an output transistor, numerals 604, 605 power supply terminals to the output circuit assembly 600, numeral 606 an output terminal of the proximity sensor, numeral 607 a constant voltage circuit, numeral 608 a shorting protection circuit, numeral 609 a power reset circuit, numeral 610 a display circuit, numeral 611 an operation indication lamp, numerals 612, 614 constant voltage terminals for supplying the driving power to the detection circuit assembly 600, and numeral 613 a detection signal input terminal for receiving the signal from the detection signal output terminal 509 of the detection circuit assembly. Numeral 615 designates a custom IC (integrated circuit) having the main circuits of the output circuit assembly 600 built therein in one chip.

In the drawing, the detection signal received by the output circuit assembly 600 through the detection signal input terminal 613 is logically processed in the logic circuit 601 (inverted or not inverted in accordance with whether the operation status is normally open or normally closed), and then supplied to the output control circuit 602. Then, the output control circuit 602 functions to activate the output transistor 603, thereby driving the load connected to the output terminal 606. At the same time, the display circuit 610 is activated to drive the operation indication lamp 611.

When an overcurrent flows in the output transistor 603, the shorting protection circuit 608 is activated and the power reset circuit 609 is driven thereby to turn off the output transistor 603 through the output control circuit 602.

The constant voltage circuit 607 supplies a constant voltage to each circuit of the output circuit assembly 600 and the detection circuit assembly 500.

In the drawing, the output status of the output stage switching element is indicated as NPN open collector type output. As an alternative, the PNP open collector type or voltage output type can be employed.

Figure 17:
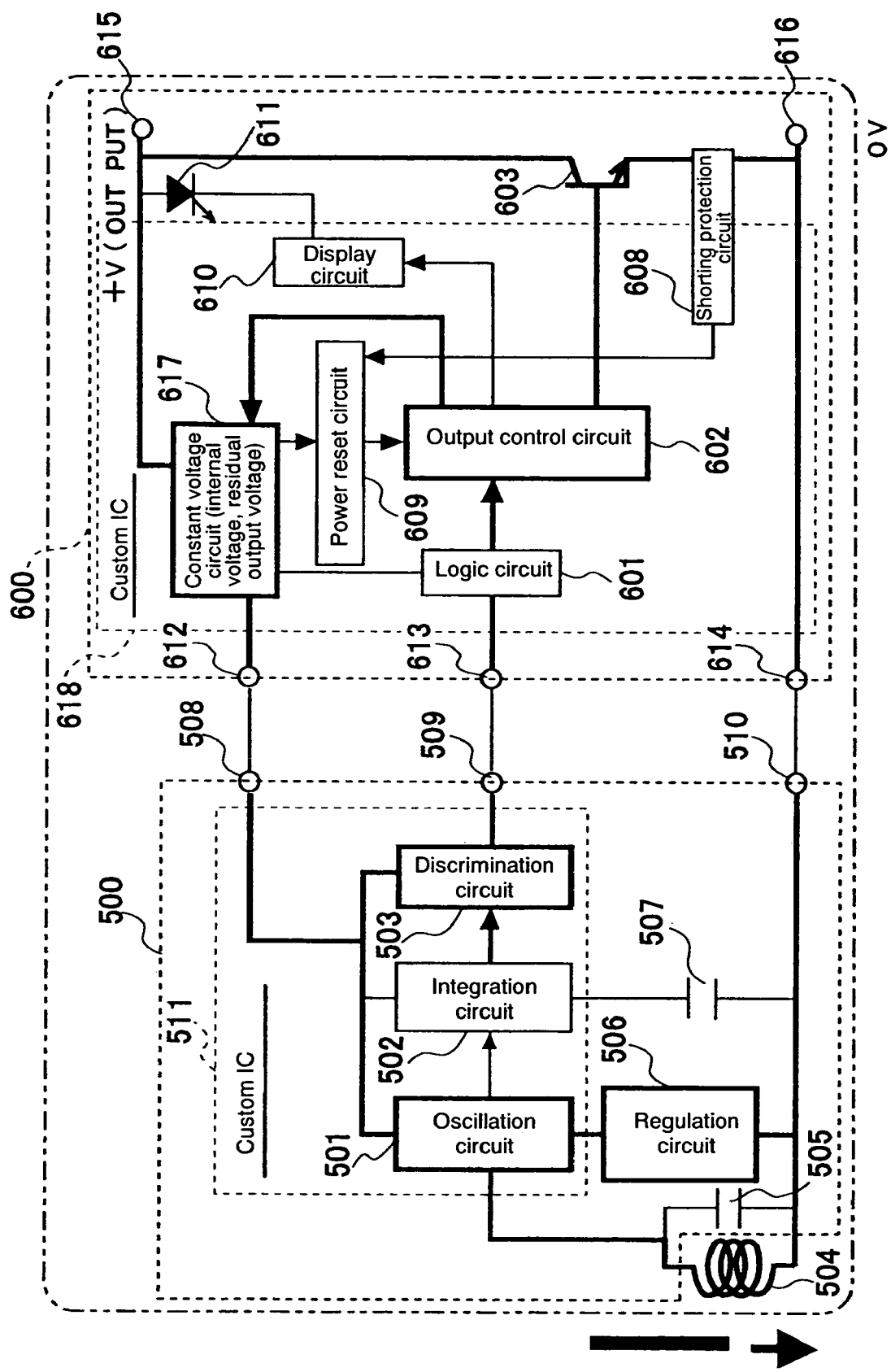
FIG. 17 is a circuit diagram (No. 2) showing a general configuration of a proximity sensor circuit including a combination of the detection circuit assembly (first embodiment) and the output circuit assembly (second embodiment).

FIG. 17 shows the whole electrical circuits of the proximity sensor configured of the detection circuit assembly (first embodiment) 500 shown in FIG. 12 and the output circuit assembly (second embodiment) fabricated separately.

By the way, the detection circuit assembly (first embodiment) 500 has already been explained in detail with reference to FIG. 12, and therefore the configuration and operation thereof will not be explained again below.

The output circuit assembly 600 according to the second embodiment corresponds to the DC two-line output system. Specifically, in the drawing, numeral 601 designates a logic circuit, numeral 602 an output control circuit, numeral 603 an output transistor, numeral 608 a shorting protection circuit, numeral 609 a power reset circuit, numeral 610 a display circuit, numeral 611 an operation indication lamp, numerals 615, 616 a power terminal/output terminal for the output circuit assembly 600, numerals 612, 614 constant voltage terminals for supplying the drive power for the detection circuit assembly 500, numeral 613 a detection signal input terminal for receiving a signal from the detection signal output terminal 509 of the detection circuit assembly 500, and numeral 617 a constant voltage circuit. Numeral 618 designates a custom IC (integrated circuit) having the main circuits of the output circuit assembly 600 built in one chip.

In the drawing, the detection signal received by the output circuit assembly 600 through the detection signal input terminal 613 is logically processed by the logic circuit 601, and then supplied to the output control circuit 602. The output control circuit 602 operates to turn on the output transistor 603, so that the load connected to the output terminal 615 is driven. At the same time, the display circuit 610 is activated thereby to drive the operation indication lamp 611.

The constant voltage circuit 617 supplies a constant voltage to each circuit of the output circuit assembly 600 and the detection circuit assembly 500. In the drawing, the output status of the output stage switching element is shown as the DC two-line system, the AC two-line system may alternatively employed.

Figure 18:
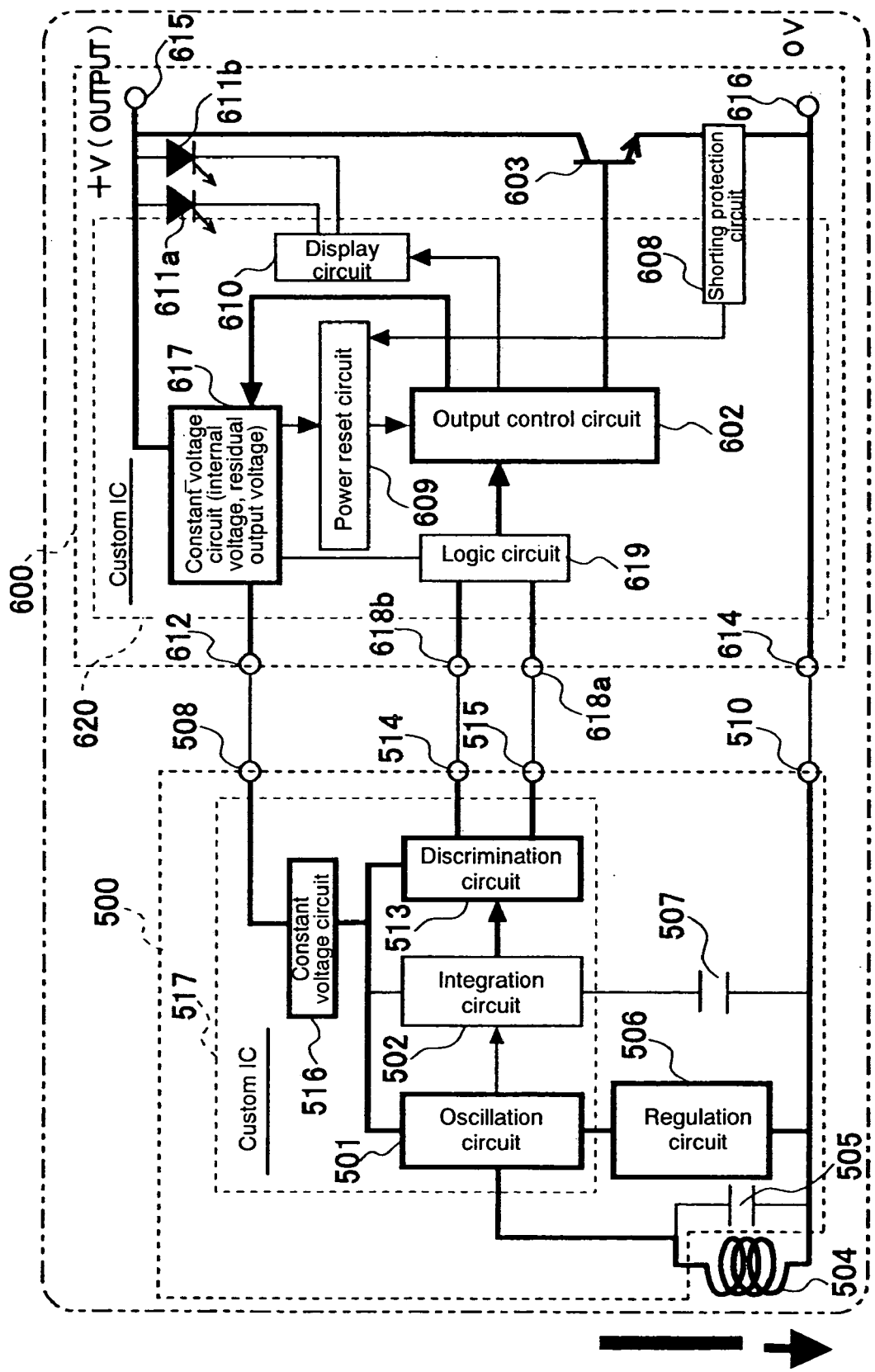
FIG. 18 is a circuit diagram (No. 3) showing a general configuration of a proximity sensor circuit including a combination of the detection circuit assembly (second embodiment) and the output circuit assembly (third embodiment).

FIG. 18 shows the whole electrical circuits of the proximity sensor configured of the detection circuit assembly (second embodiment) 500 shown in FIG. 13 and the output circuit assembly (third embodiment) separately fabricated.

The detection circuit assembly (second embodiment) 500 has been described already in detail with reference to FIG. 13, and therefore the configuration and operation thereof will not be explained again.

The output circuit assembly 600 according to the third embodiment corresponds to the DC two-line output system. Specifically, in the drawing, numeral 602 designates an output control circuit, numeral 603 an output transistor, numeral 608 a shorting protection circuit, numeral 609 a power reset circuit, numeral 610 a display circuit, numerals 612, 614 constant voltage terminals for supplying the drive power for the detection circuit assembly 500, numerals 615, 616 power supply terminal/output terminal for the output circuit assembly 600, numeral 617 a constant voltage circuit, and numeral 619 a logic circuit. Numerals 618a, 618b designate detection signal input terminals for receiving the detection signals from the detection signal output terminals 514, 515 of the detection circuit assembly 500. Numeral 611a designates an output operation indication lamp for indicating the output operating condition of the proximity sensor. Numeral 611b designates a setting indication lamp for indicating a set position where detection is secured without regard to the variations in the detection distance depending on the operating environment. Numeral 620 designates a custom IC (integrated circuit) having the main circuits of the output circuit assembly 600 built in one chip.

Figure 30:
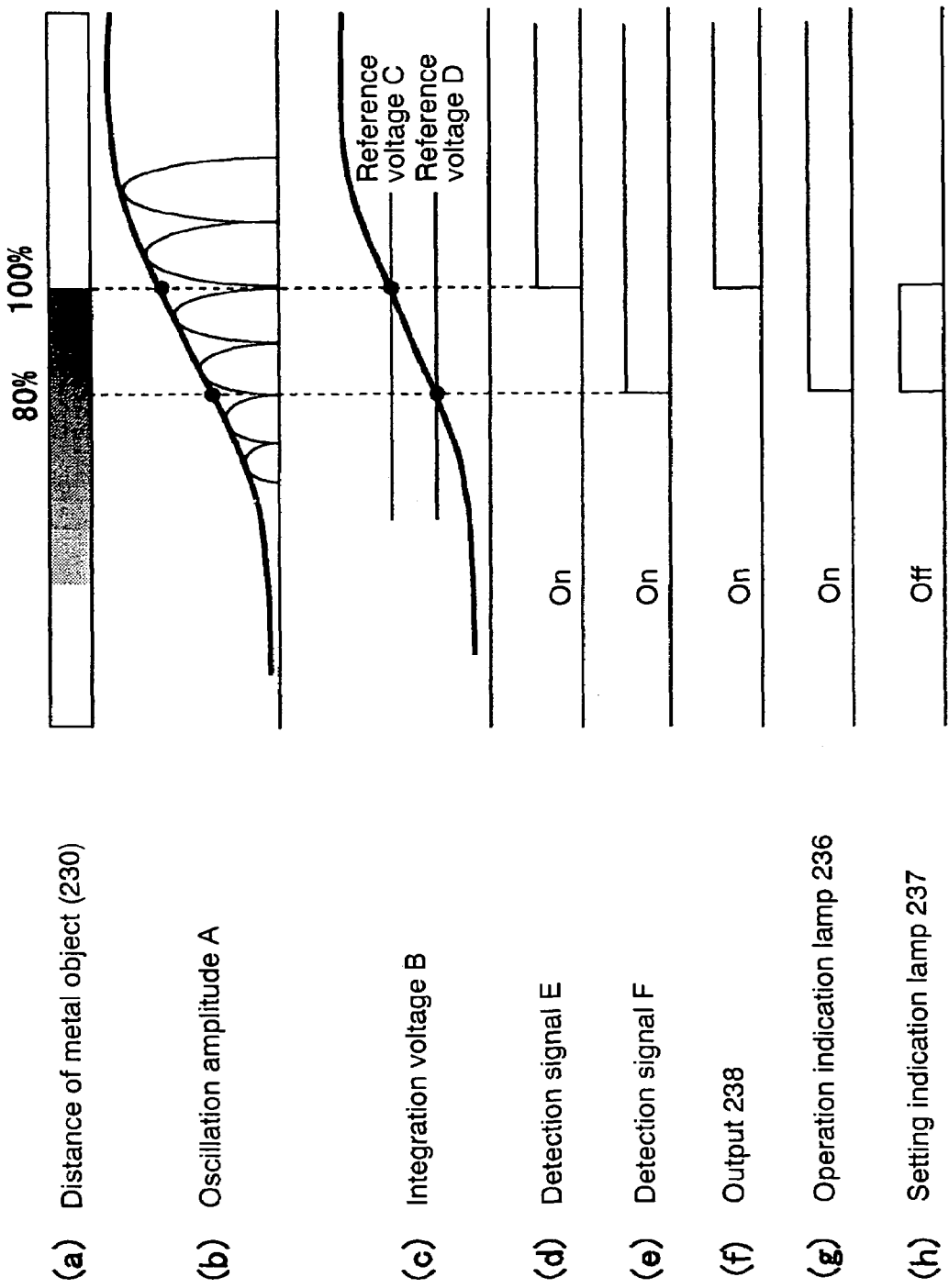
FIG. 30 is an operation time chart according to the prior art.
Figure 31:
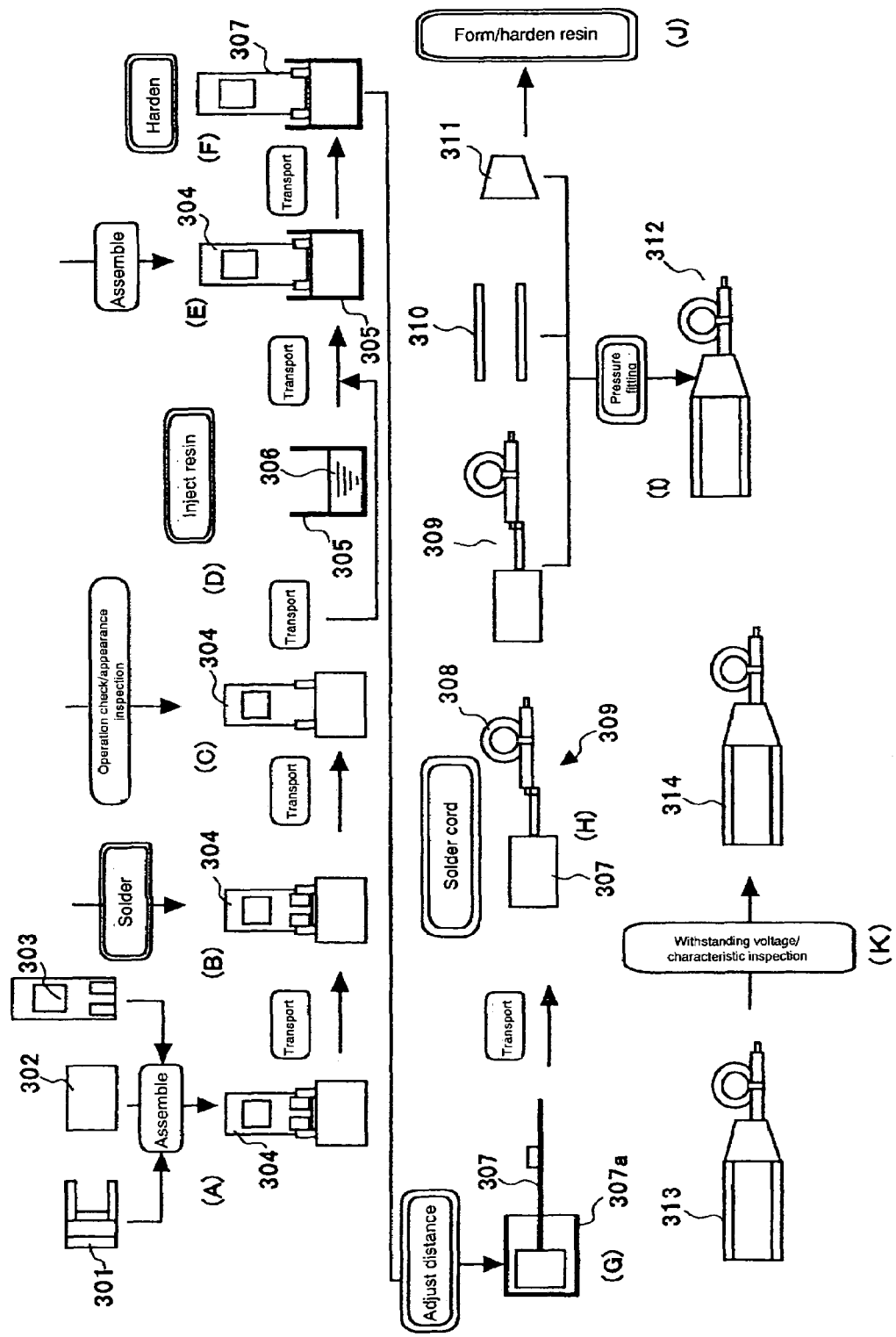
FIG. 31 is a diagram showing the conventional fabrication steps.

In the drawing, the detection signals received by the output circuit assembly 600 through the detection signal input terminals 618a, 618b are logically processed by the logic circuit 619, and then supplied to the output control circuit 602. The output control circuit 602 operates to turn on the output transistor 603, so that the load connected to the output terminal 615 is driven. At the same time, the output operation indication lamp 611a is driven. Also, the output control circuit 602 operates to drive the setting indication lamp 611b. The change in the output, the output operation indication lamp 611a and the setting indication lamp 611b with the approach of an object to be detected is the same as in the case of FIG. 30. The constant voltage circuit 617 supplies a constant voltage to each circuit of the output circuit assembly 600 and the detection circuit assembly 500.

Figure 19:
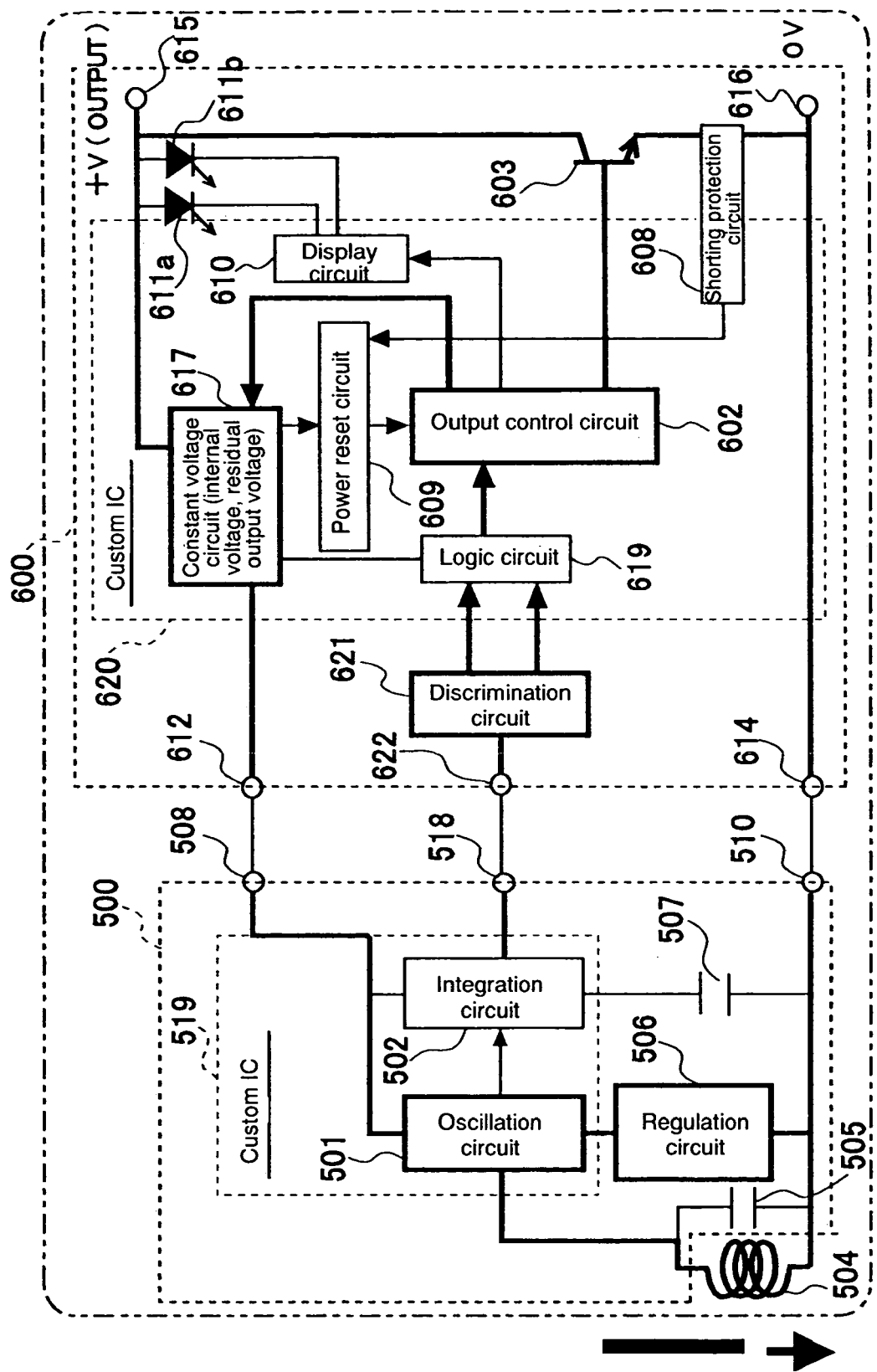
FIG. 19 is a circuit diagram (No. 4) showing a general configuration of a proximity sensor circuit including a combination of the detection circuit assembly (third embodiment) and the output circuit assembly (fourth embodiment).

FIG. 19 shows the whole electrical circuits of the proximity sensor configured of the detection circuit assembly (third embodiment) 500 shown in FIG. 14 and the output circuit assembly (fourth embodiment) separately fabricated.

The detection circuit assembly (third embodiment) 500 has been described in detail already with reference to FIG. 14, and therefore the configuration and operation thereof will not be explained again.

The output circuit assembly 600 according to the fourth embodiment corresponds to the DC two-line output system. Specifically, in the drawing, numeral 602 designates an output control circuit, numeral 603 an output transistor, numeral 608 a shorting protection circuit, numeral 609 a power reset circuit, numeral 610 a display circuit, numerals 612, 614 constant voltage terminals for supplying the drive power for the detection circuit assembly 500, numerals 615, 616 a power supply terminal/output terminal for the output circuit assembly 600, numeral 617 a constant voltage circuit, and numeral 619 a logic circuit. Numeral 622 designates a detection signal input terminal for receiving an analog detection signal from the detection signal output terminal 518 of the detection circuit assembly 500. Numeral 611a designates an output operation indication lamp for indicating the output operating condition of the proximity sensor. Numeral 611b designates a setting indication lamp for indicating a set position where detection is assured without regard to the variations in the detection distance depending on the operating environment. Numeral 620 designates a custom IC (integrated circuit) having the main circuits of the output circuit assembly 600 built in one chip.

In the drawing, the analog detection signal received by the output circuit assembly 600 through the detection signal input terminal 622 is binarized with reference to a predetermined threshold value by the discrimination circuit 621, and further after being logically processed by the logic circuit 619, supplied to the output control circuit 602. Then, the output control circuit 602 operates to turn on the output transistor 603, so that the load connected to the output terminal 615 is driven. At the same time, the output operation indication circuit 611a is driven. Also, the output control circuit 602 operates to drive the setting indication lamp 611b. The constant voltage circuit 617 supplies a constant voltage to each circuit of the output circuit assembly 600 and the detection circuit assembly 500.

Figure 20:
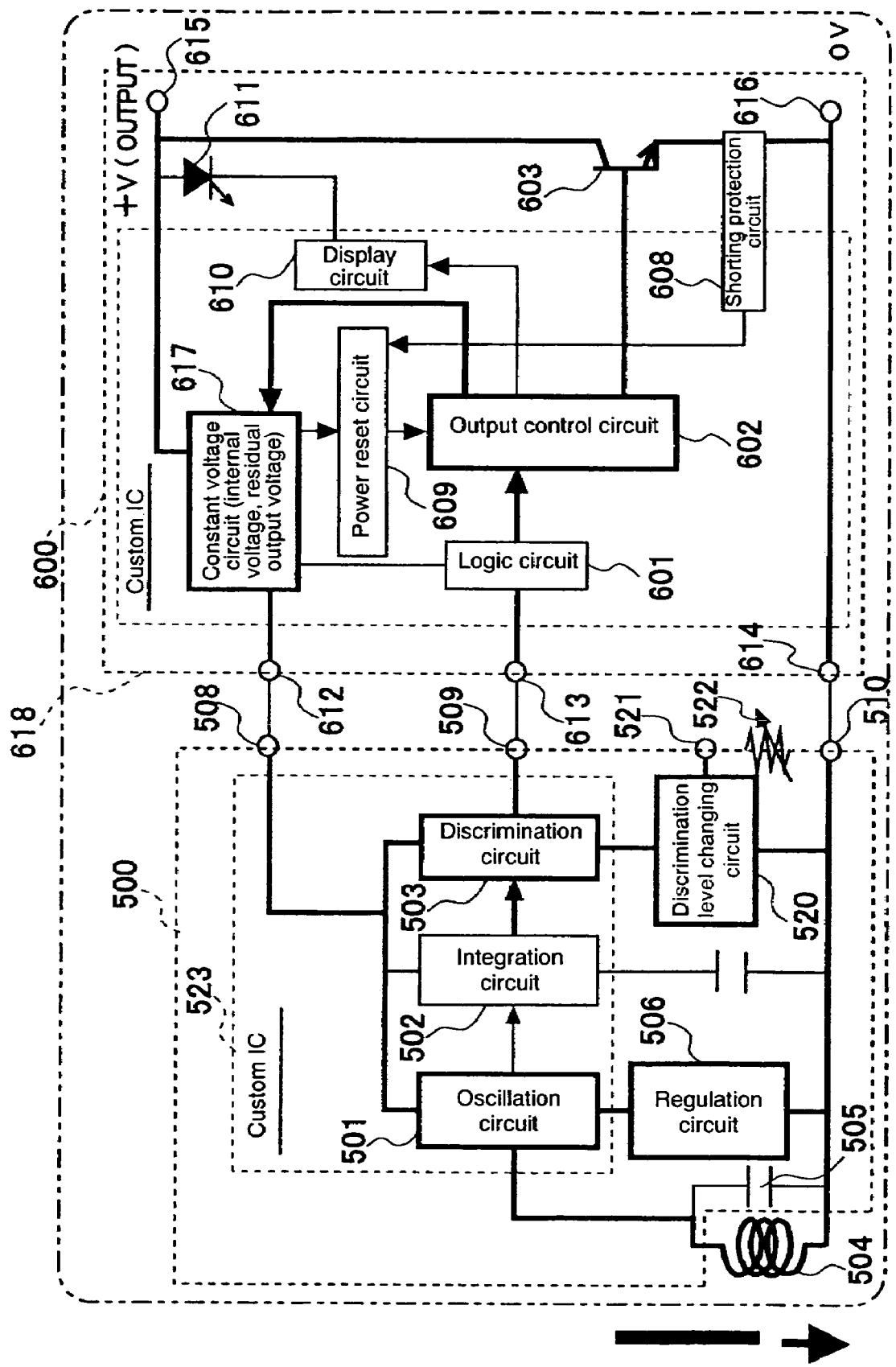
FIG. 20 is a circuit diagram (No. 5) showing a general configuration of a proximity sensor circuit including a combination of the detection circuit assembly (fourth embodiment) and the output circuit assembly (second embodiment).

FIG. 20 shows the whole electrical circuits of the proximity sensor configured of the detection circuit assembly (fourth embodiment) 500 shown in FIG. 15 and the output circuit assembly (second embodiment) separately fabricated.

The detection circuit assembly (fourth embodiment) 500 has been described in detail already with reference to FIG. 15, and therefore the configuration and operation thereof will not be explained again.

The output circuit assembly 600 according to the second embodiment corresponds to the DC two-line output system. Specifically, in the drawing, numeral 601 designates a logic circuit, numeral 602 an output control circuit, numeral 603 an output transistor, numeral 608 a shorting protection circuit, numeral 609 a power reset circuit, numeral 610 a display circuit, numeral 611 an operation indication lamp, numerals 615, 616 a power supply terminal/output terminal for the output circuit assembly 600, numerals 612, 614 constant voltage terminals for supplying the drive power for the detection circuit assembly 500, numeral 613 a detection signal input terminal for receiving a signal from the detection signal output terminal 509 of the detection circuit assembly 500, and numeral 617 a constant voltage circuit. Numeral 618 designates a custom IC (integrated circuit) having the main circuits of the output circuit assembly 600 built in one chip.

In the drawing, the detection signal received by the output circuit assembly 600 through the detection signal input terminal 613 is logically processed by the logic circuit 601 and then supplied to the output control circuit 602. In the process, the discrimination level of the discrimination circuit 503 can be finely adjusted by the operation of the variable resistor 522. By use of this adjusting function, therefore, the detection distance can be set optimally by fine adjustment even for the detection circuit assembly 500 that has already been adjusted. When the detection signal obtained by this fine adjustment is received by the terminal 613, the output control circuit 602 operates to turn on the output transistor 603, so that the load connected to the output terminal 615 is driven. At the same time, the display circuit 610 is activated thereby to drive the operation indication lamp 611. The constant voltage circuit 617 supplies a constant voltage to each circuit of the output circuit assembly 600 and the detection circuit assembly 500.

As apparent from FIGS. 16 to 20 described above, according to this invention, the same detection circuit assembly 500 can be used for commodities of different power specifications and different output forms, and therefore commodity development, the parts acquisition and the production are facilitated. As a result, various effects are achieved, including the reduced development cost, the shortened lead time, the reduced number of types of parts, the reduced delivery management cost and the reduced parts cost due to mass purchase of a small number of items, the centralized production equipment due to the use of a far smaller number of types of detection end modules and output circuit modules than the models of the proximity sensor, and the shortened production lead time and the reduced production cost due to the reduced set-up frequency.

Figure 21:
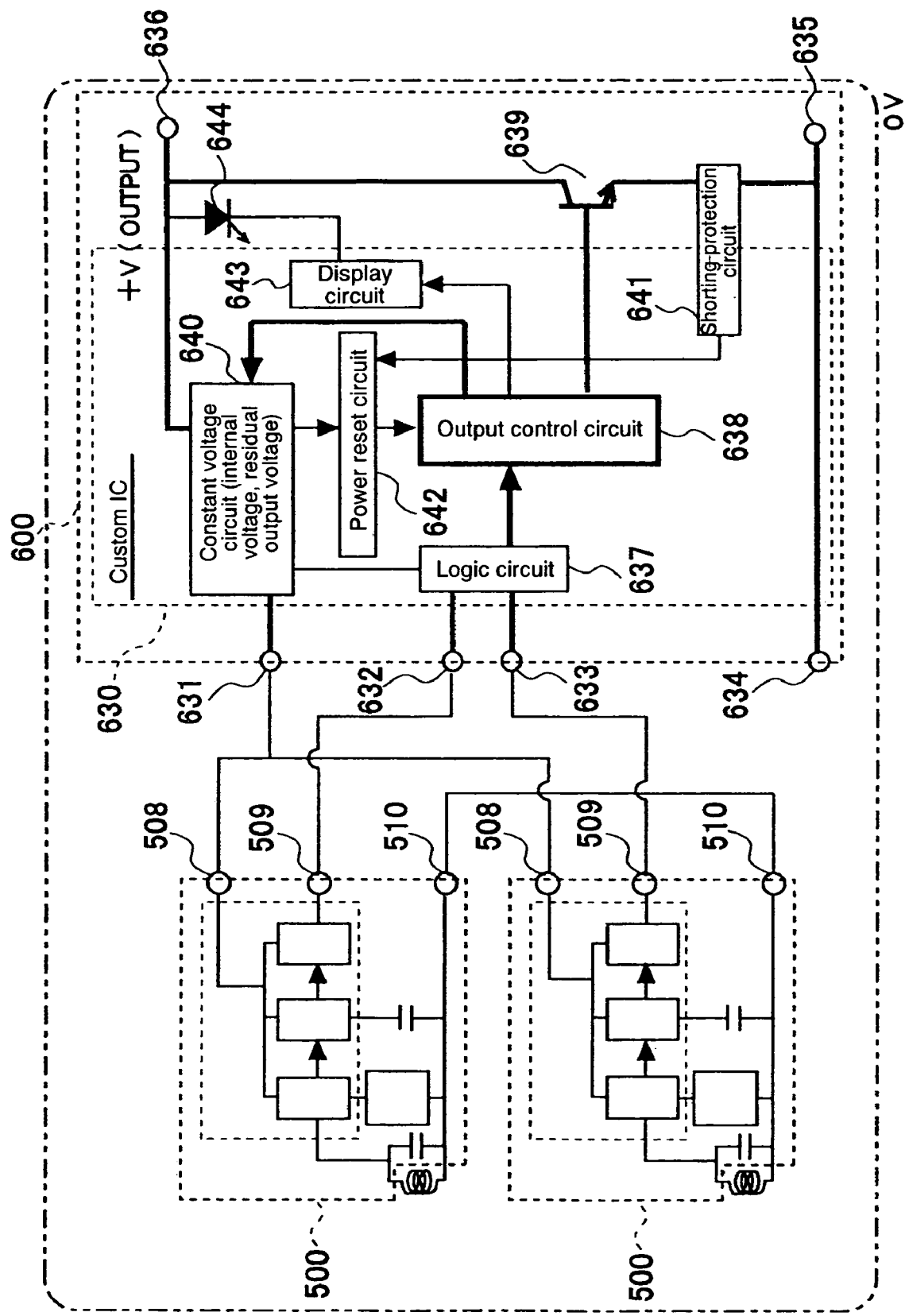
FIG. 21 is a circuit diagram (No. 6) showing a general configuration of a proximity sensor circuit including a combination of two detection circuit assemblies (first embodiment) and an output circuit assembly (third embodiment).

FIG. 21 shows the whole electrical circuits of the proximity sensor configured of two detection circuit assemblies (first embodiment) 500 shown in FIG. 12 and one output circuit assembly (third embodiment) 600 fabricated separately.

By the way, the detection circuit assembly (first embodiment) 500 was already described in detail with reference to FIG. 12, and therefore the configuration and operation thereof will not be explained again.

In the drawing, numeral 630 designates a custom IC, numerals 631, 634 terminals for supplying the stabilized power to the detection circuit assemblies 500, numerals 632, 633 detection signal input terminals for receiving the detection signals from the detection circuit assemblies 500, respectively, numerals 635, 636 a DC power supply terminal/output terminal for the output circuit assembly 600, numeral 637 a logic circuit for logically processing the detection signals of two systems, numeral 638 an output control circuit, numeral 639 an output transistor, numeral 640 a constant voltage circuit for supplying a stabilized DC power to both the output circuit assembly 600 and the detection circuit assemblies 500, numeral 641 a shorting protection circuit, numeral 642 a power reset circuit, numeral 643 a display circuit, and numeral 644 an operation indication lamp.

As shown in the drawing, this proximity sensor circuit is such that the two detection circuit assemblies (first embodiment) 500 are connected in parallel, the respective constant voltage power supply terminals 508, 510 are connected to the constant voltage terminals 631, 634 of the output circuit assembly 600, and the detection signal output terminal 509 is connected to the detection signal input terminals 632, 633 of the output circuit assembly 600. Then, the detection signals applied to the input terminals 632, 633 are logically processed (a signal is output in the case where an object is detected by any one of the detection circuit assemblies, for example), and the detection signal is sent to the output control circuit 638. The subsequent operations are the same as those explained above with reference to FIG. 18.

With the circuit configuration described above with reference to FIG. 21, unlike in the conventional configuration in which two proximity sensors are used to meet the user need for multi-point detection, the fact that the detection function is separated from the output circuit function makes it possible to reduce the circuits corresponding to one output block by connecting a combination of a plurality of detection circuit assemblies 500 to a single output circuit assembly 600, thereby reducing the production cost. Also, the simple process of combining the detection circuit assemblies with the detection sensitivity thereof adjusted eliminates the need of the complicated process in which multi-point heads built in are adjusted with equal detection sensitivity.

Next, the features of the proximity sensor according to this invention will be explained more specifically from the viewpoint of commercialization. From the foregoing description, it will be understood that the proximity sensor according to the invention comprises a detection coil assembly 404 with completed characteristics including a coil 401, a core 402, mask conductors 406 to 412, a detection circuit assembly 500 including an oscillation circuit with the coil 401 of the detection coil assembly 404 as a resonance circuit element, and an output circuit assembly 600 including a power element for driving the load.

The term "assembly" means an arrangement in which magnetic parts, circuit parts, structural parts, etc. are integrally assembled. In the production system according to the invention, these assemblies are preferably modularized into several units to further facilitate the handling.

Specifically, the detection coil assembly 404 and the detection circuit assembly (the circuit board on which the detection circuit is mounted) 500 are physically integrated with each other using the resin mold technique or the like thereby to provide a detection end module.

The output circuit assembly 600, in contrast, can be called an output circuit module itself. In the case where the members for fixing the output circuit assembly in the case are mounted on the output circuit assembly, the output circuit assembly including the particular members can be referred to as the output circuit module.

In consideration of the need of satisfying many commodity variations in versatile way, the circuits mounted in the detection end module may include at least oscillation circuit parts. Also, the circuits mounted in the output circuit module may include a power element.

As to other circuit elements (especially, the integration circuit, the discrimination circuit, the constant voltage circuit and the logic circuit), however, it is not always easily concluded which module these circuits are to be included in. This will be understood easily by referring to the circuit variations shown in FIGS. 12 to 21. By the way, the circuit functions may be divided into the output circuit module and the control circuit module as independent modules.

In other words, according to this invention, a proximity sensor production system described below can be realized. The component parts prepared for this production system include a detection coil assembly having a coil and a core, a detection circuit assembly having an oscillation circuit with the coil of the detection coil assembly as a resonance circuit element, an output circuit module having a power element for driving the load, and a control circuit assembly for controlling the operation of the output stage circuit in accordance with the oscillation condition of the oscillation circuit.

The detection coil assembly and the detection circuit assembly are integrated with each other and make up a detection end module. In the process, a mask conductor is desirably incorporated in the detection coil assembly of the detection end module in order that the detection output may not be changed greatly by any type of the case body mounted on the detection coil assembly.

The output circuit module is prepared by the specification such as the source voltage and the output form.

The control circuit assembly is collectively built in the detection end module or the output circuit module, or dividedly appropriately between the detection end module and the output stage module, or constitutes a control circuit module by itself.

As a result, one detection end module is combined with one output circuit module corresponding to the particular detection end module selected from a plurality of output circuit modules thereby to prepare a product.

Figure 22:
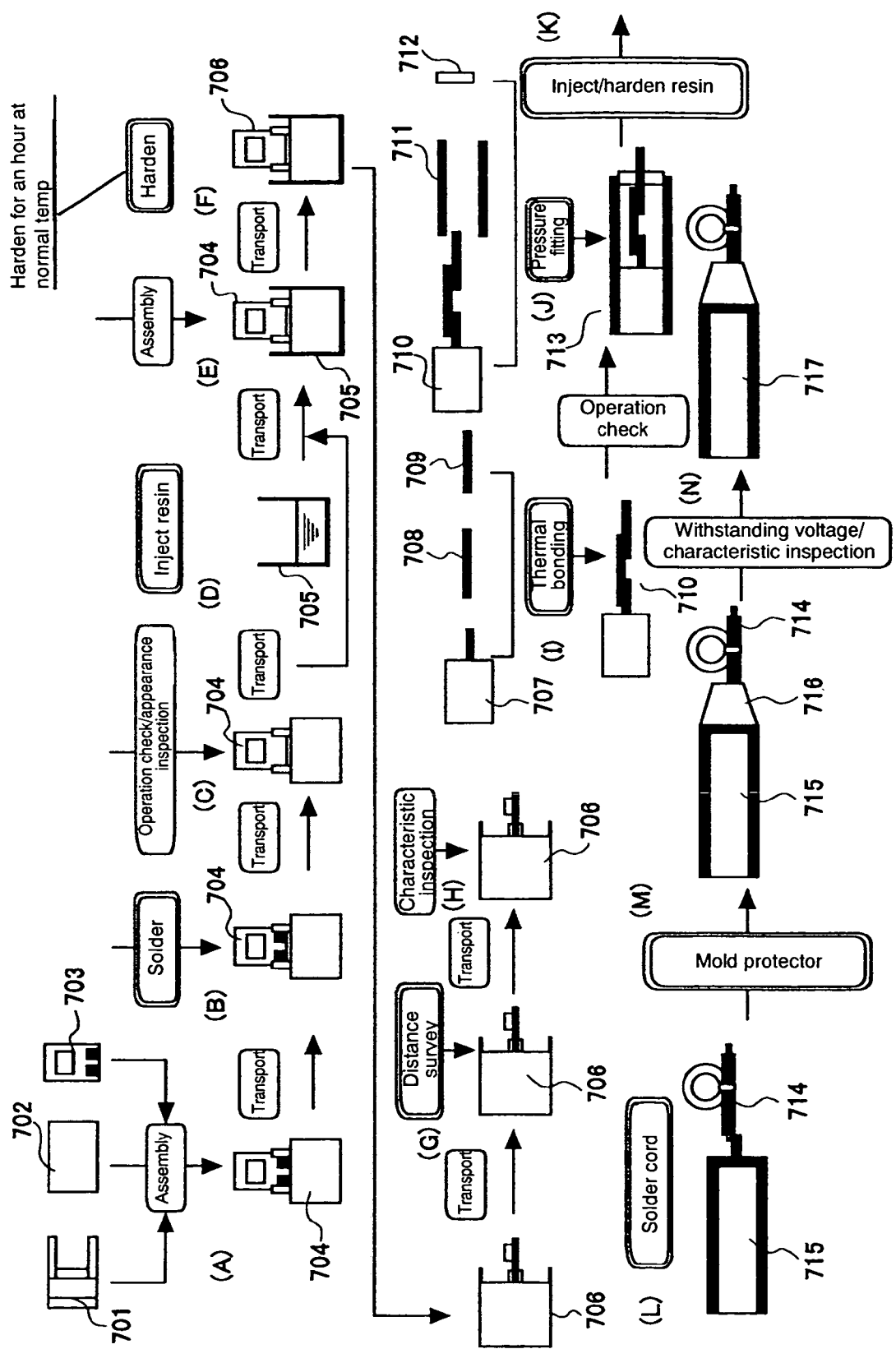
FIG. 22 is a diagram showing the fabrication steps of the proximity sensor using the detection end module according to the invention.

The production steps for a specific example of a proximity sensor production system according to the invention are shown in FIG. 22. In the first step (A) of the process shown in the drawing, the coil 701, the ferrite core 702 and the detection circuit package board 703 with the circuit parts such as the oscillation circuit packaged on a small rectangular board are assembled integrally to produce an assembly-in-process 704.

In the next step (B), the portions of the assembly-in-process 704 requiring electric connection are irradiated with a laser beam thereby to solder the particular portions of the assembly-in-process 704.

In the next step (C), the assembly-in-process 704 completely soldered are subjected to an operation check test and an appearance test.

In the next step (D), a coil case 705 to accommodate the assembly-in-process 704 is prepared, and filled with polyurethane resin, for example, in preparation for integration molding. In this case, a mask conductor (such as a flanged cylindrical mask conductor 407 shown in FIG. 3) of brass, copper or aluminum is mounted in advance along the outer periphery of the coil case 705.

In the next step (E), the assembly-in-process 704 is arranged in the coil case 705 filled up with resin.

In the next step (F), the assembly-in-process is left to stand for about one hour at normal temperature, for example, thereby to hard the resin and produce a detection end module 706.

In the next step (G), the distance is adjusted to assure accurate operation over a specified distance by utilizing the laser trimming technique. In the process, the adjustment can be carried out without the body case and the various problems which otherwise might occur due to the dummy case need not be taken into consideration unlike in the prior art. This is by reason of the fact that the mask conductor is built in the detection end module 706 and therefore the detection characteristic is not substantially changed regardless of the presence or absence of the body case.

In this way, the detection end module 706 is completed in which the presence or absence of the body case has no great effect on the detection characteristic, i.e. of which the characteristics are completed.

In the next step (H), the characteristic inspection is further conducted to assure the reliability thereby to produce an inspected detection end module 707.

This detection end module 707 is suitably shipped as a part completed for use with the proximity sensor. As an alternative, the production of the proximity sensor may be started from the next step (I) by acquiring the detection end module 707 of other makes.

In step (I), the inspected detection end module 707 obtained as described above, the connecting member 708 used to connect the detection circuit and the output circuit, and the output circuit packaging board (output circuit module) 709 separately fabricated are prepared, and integrated by thermal bonding using a solder or a conductive adhesive thereby to produce an assembly-in-process with the whole circuits 710.

In the next step (J), the assembly-in-process with the whole circuits 710, the cylindrical body case (metal or resin) 711 and the output circuit module support member (cord clamp) 712 for holding the output circuit packaging bord 709 (output circuit module) and leading out the light of the display lamp (LED) are prepared and integrated under pressure thereby to produce an assembly-in-process with the case 713.

In the next step (K), the assembly-in-process with the case 713 obtained as above is injected with resin and hardened thereby to integrate the case and the parts with each other.

In the next step (L), the cord 714 is soldered to the assembly-in-process with the case 713 integrated by resin injection thereby to complete an assembly-in-process with the cord 715.

In the next step (M), a protector is molded by covering the lead end portion of the cord 714 with the cord holder (protector) 716, thereby protecting the cord 714 securely.

In the last step (N), the withstanding voltage test and the characteristic test are conducted to complete a proximity sensor product 717.

A specific example of the proximity sensor fabricated through the steps (A) to (N) will be explained with reference to FIGS. 38 to 44.

Figure 38:
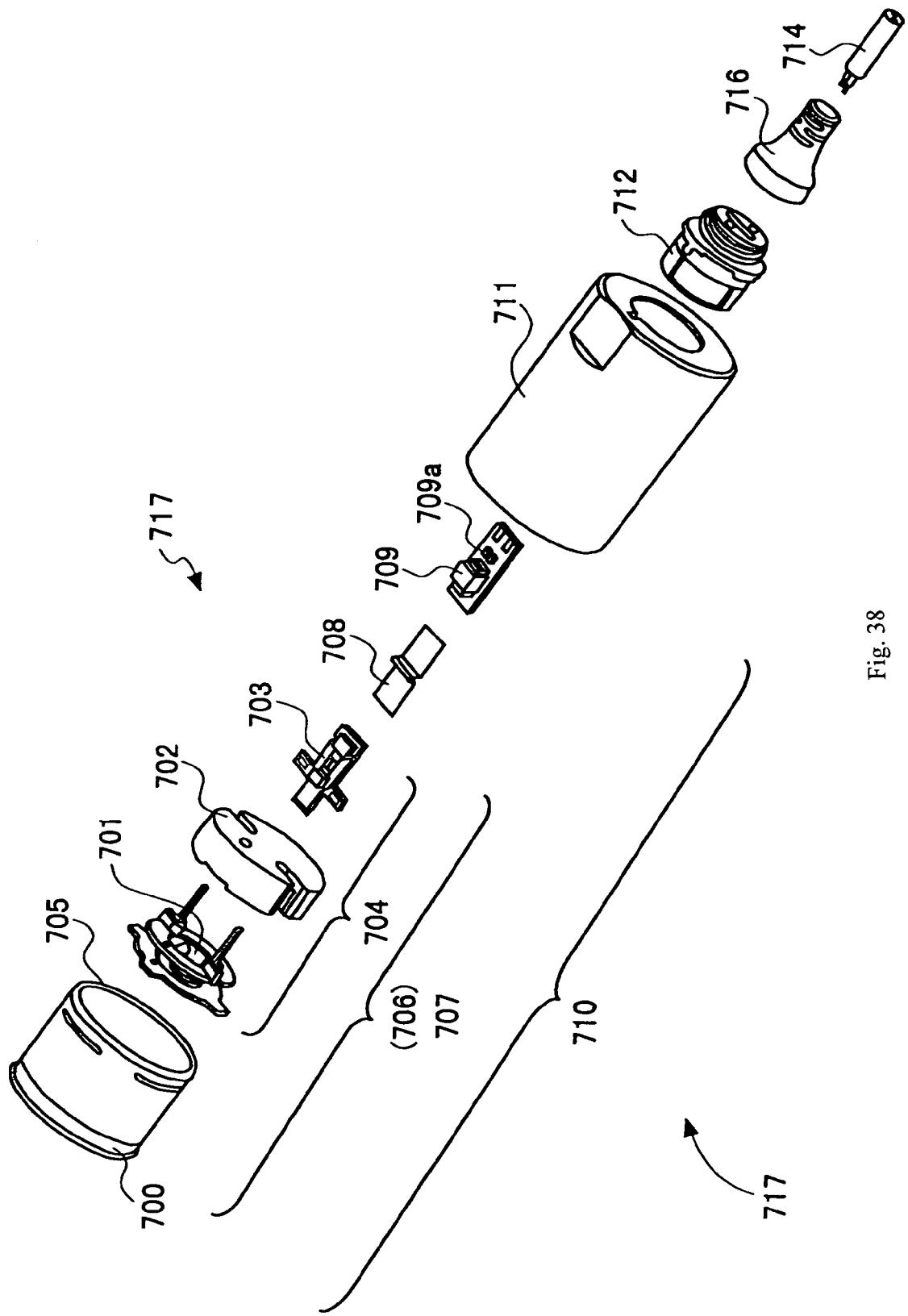
FIG. 38 is an exploded perspective view showing a proximity sensor of shielded type fabricated by a proximity sensor production method according to the invention.

FIG. 38 is an exploded perspective view showing a proximity sensor of shielded type produced through the steps (A) to (N). By the way, the reference numerals shown in the drawing correspond to those shown in FIG. 22, respectively.

This proximity sensor comprises the coil (spool) 701, the ferrite core 702 and the detection circuit assembly 703 making up the assembly-in-process 704 in steps (A) to (C), the coil case 705 mounted on the assembly-in-process 704 and having mounted thereon the mask conductor 700 making up the detection end module 707 (706) in steps (D) to (H), the output circuit module 709 electrically connected to the detection circuit assembly 703, and the connecting member 708 for bridging and electrically connecting the detection circuit assembly 703 and the output circuit module 709 in step (I), the cylindrical body case 711 integrated with the coil case 705, and the cord clamp (output circuit module support member) 712 holding the output circuit module 709 and integrated with the body case 711 in steps (J) to (K), the cord 714 soldered to the cord clamp 712 in step (L), and the cord holder 716 mounted as a protector on the cord 714 in step (M).

Figure 39:
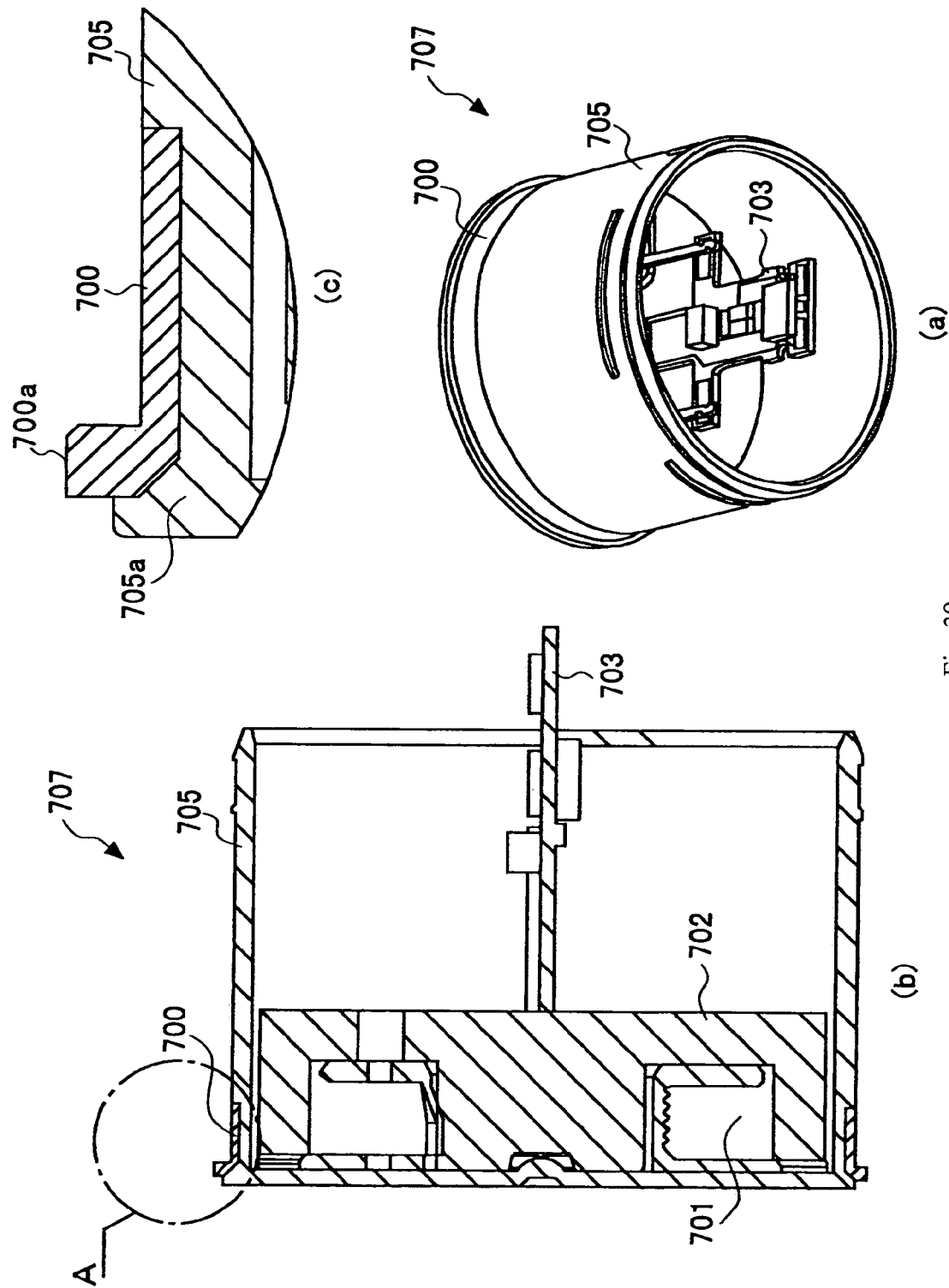
FIG. 39 is a diagram showing a detailed configuration of the detection end module of shielded type fabricated by the proximity sensor production method according to the invention.

A detailed configuration of the detection end module 707 of FIG. 38 is shown in FIG. 39. In the drawing, (a) is a perspective view of the detection end module 707, (b) a central sectional view of the detection end module 707, and (c) an enlarged view of the part "A" indicated in (b).

In the drawing (b), the coil winding is not shown. Also, the detection circuit assembly 703 is shown only by hatching the sectional view of the board, and the parts on the board are shown schematically only by the cross section thereof. This is also the case with FIGS. 40 to 44 described later.

As shown in FIG. 39, a mask conductor 700 is arranged at the forward end portion on the outer peripheral surface of the coil case 705 in the shape of bottomed cylinder. This mask conductor 700 is of the type (flanged cylinder) shown in FIG. 33 (modification of the second embodiment) described above. As shown in (b) of the drawing, the flanged forward end 700a of the mask conductor 700 is projected outward. By arranging the mask conductor outside the coil case 705 in this way, discharge is avoided between the mask conductor and the internal circuits of the sensor.

Also, as shown in (a) of the drawing, it can be confirmed that the cross-shaped detection circuit assembly 703 is arranged in erected form at the central portion in the coil case 705.

Figure 40:
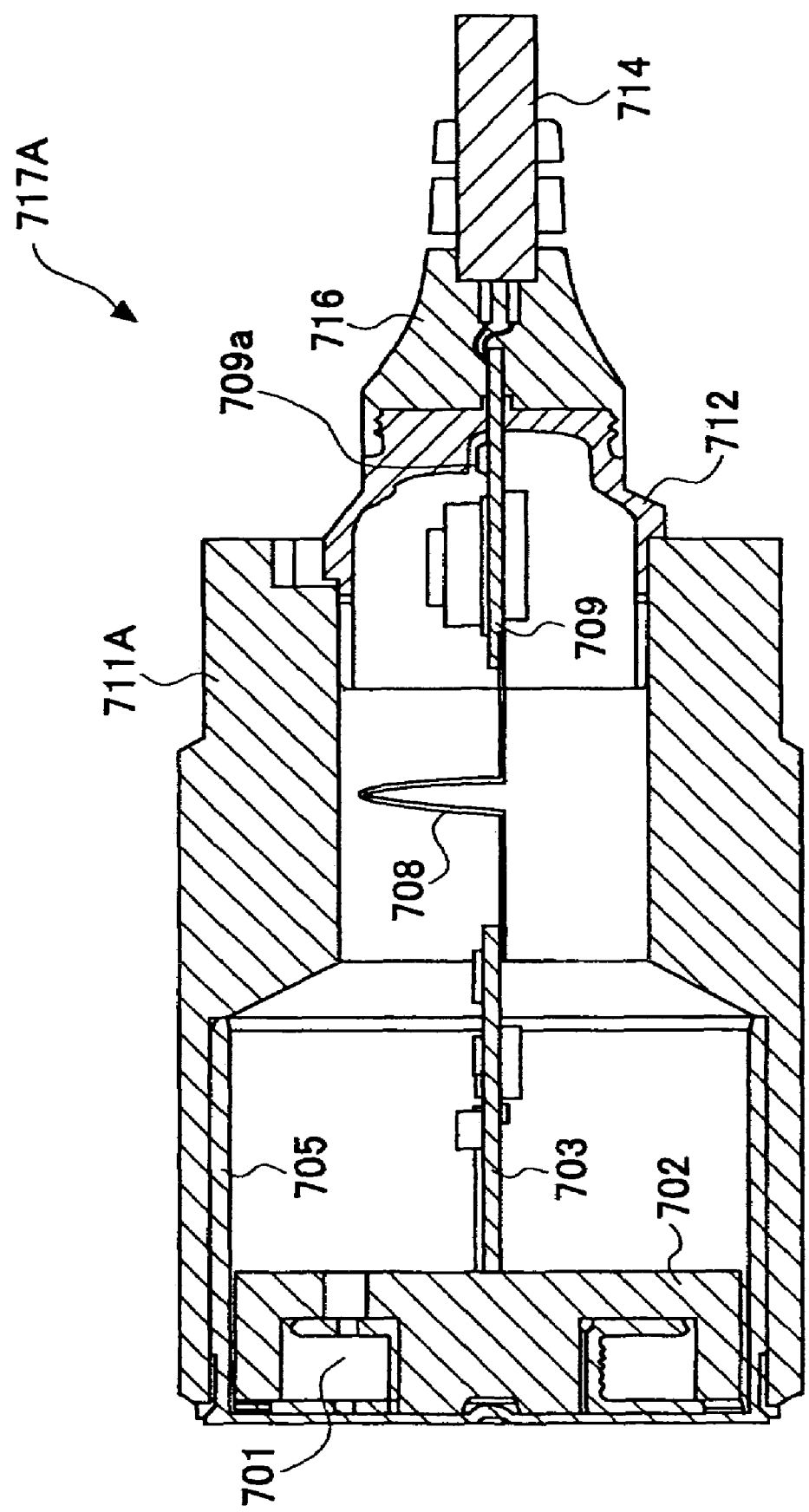
FIG. 40 is a sectional view of a proximity sensor of shielded type having mounted thereon the body case of short type.
Figure 41:
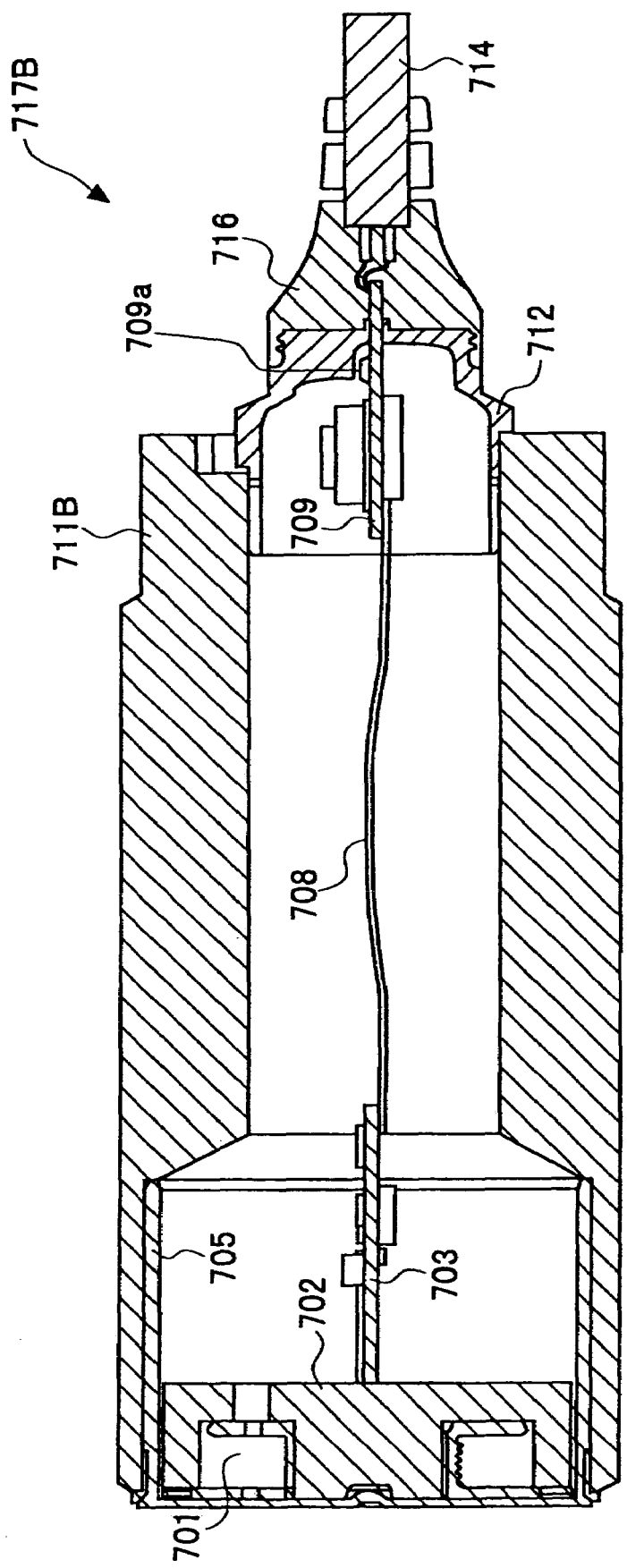
FIG. 41 is a sectional view of a proximity sensor of shielded type having mounted thereon the body case of long type.

FIGS. 40 and 41 are sectional views of the proximity sensor 717 shown in FIG. 38.

In these diagrams, the output circuit module 709 is shown by hatching only the cross section of the board, and the parts on the board (including the LED 709a) are schematically shown only by a sectional view thereof. Also, the cord clamp (output circuit module support member) 712 is schematically shown by a partly cutaway sectional view. This is also the case with FIGS. 43 and 44 described later.

In this example, two types of the body case 711 are prepared, including a short body case 711A (See FIG. 40) and a long body case 711B (See FIG. 41). FIG. 40 shows a proximity sensor 717A having the short body case 711A, and FIG. 41 a proximity sensor 717B having the long body case 711B.

As apparent from comparison between FIGS. 40 and 41, the use of a common flexible connecting member (such as a harness of variable connection length) 708 makes it possible to mount the body case of any type, short or long, without changing the other parts configuration. Which type of the body case is to be used is determined appropriately taking the operating environment, etc. of the proximity sensor.

More specifically, the connecting member 708 is a harness (flexible board) having a variable connection length comprised of a polyimide base formed thereon with the required number of parallel wirings to electrically connect the detection end module 707 and the output circuit board module 709 to each other. The connecting member 708 may alternatively be formed of a simple lead wire or a rigid glass epoxy board, etc.

In this embodiment, the central portion of the connecting member 708 is formed as a mount. When mounting the short body case 711A, as shown in FIG. 40, the connecting member 708 assembled is maintained in the same shape as it is formed. When mounting the long body case 711B, on the other hand, the formed portion of the connecting member 708 is extended in a gentle curve. By the way, in an application of this embodiment to the short body case 711A, the connecting member 709 is arranged out of contact with the inner surface of the body case 711A.

As described above, the whole length of the connecting member 708 and the shape in which the connecting member 708 is formed are prescribed in such a manner as to be applicable to both short body case 711A and the long body case 711B. Regardless of the length of the body case 711, therefore, one type of connecting member can be used, thereby facilitating the stock management and cost reduction of the connecting member.

The connecting members of optimum length for each of the long body case 711A and the short body case 711B may be prepared separately from each other. As an example, a connecting member of appropriate length for the body case used for assembling the sensor may be cut out each time from a long roll of flexible board.

The cord clamp 712 will be explained. The cord clamp 712 is formed of a transparent resin, and in the case under consideration, so configured that the light emitted from the LED 709a arranged on the circuit board of the output circuit module 709 is led outward. Specifically, the cord clamp 712 is formed with a rectangular hole (through hole) from which a part of the circuit board (the portion for soldering the electrical cord 714) is exposed. By the way, the circuit board is fixed by heat caulking to the cord clamp 712.

Figure 42:
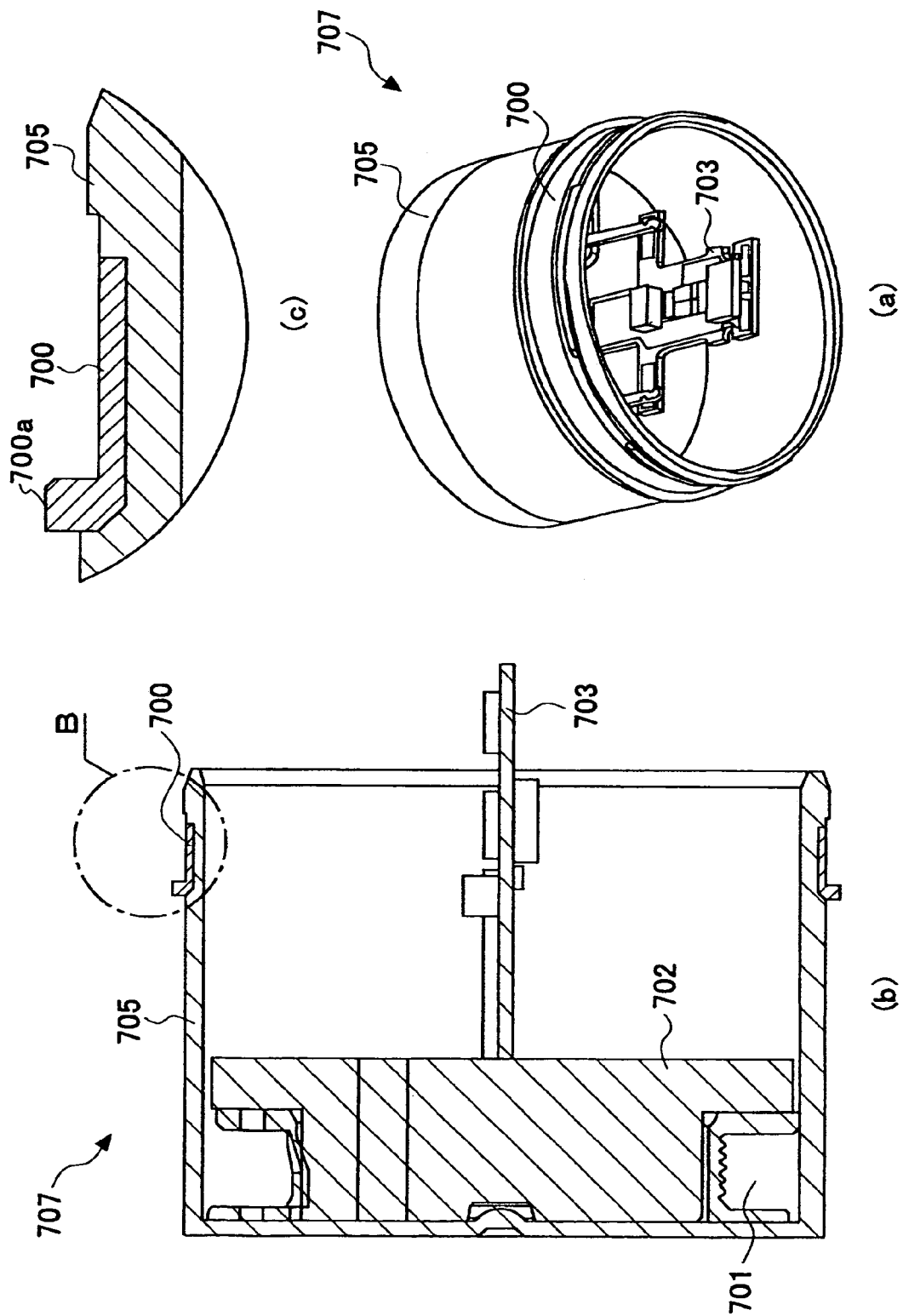
FIG. 42 is a diagram showing a configuration of a detection end module of unshielded type fabricated by the proximity sensor production method according to the invention.
Figure 43:
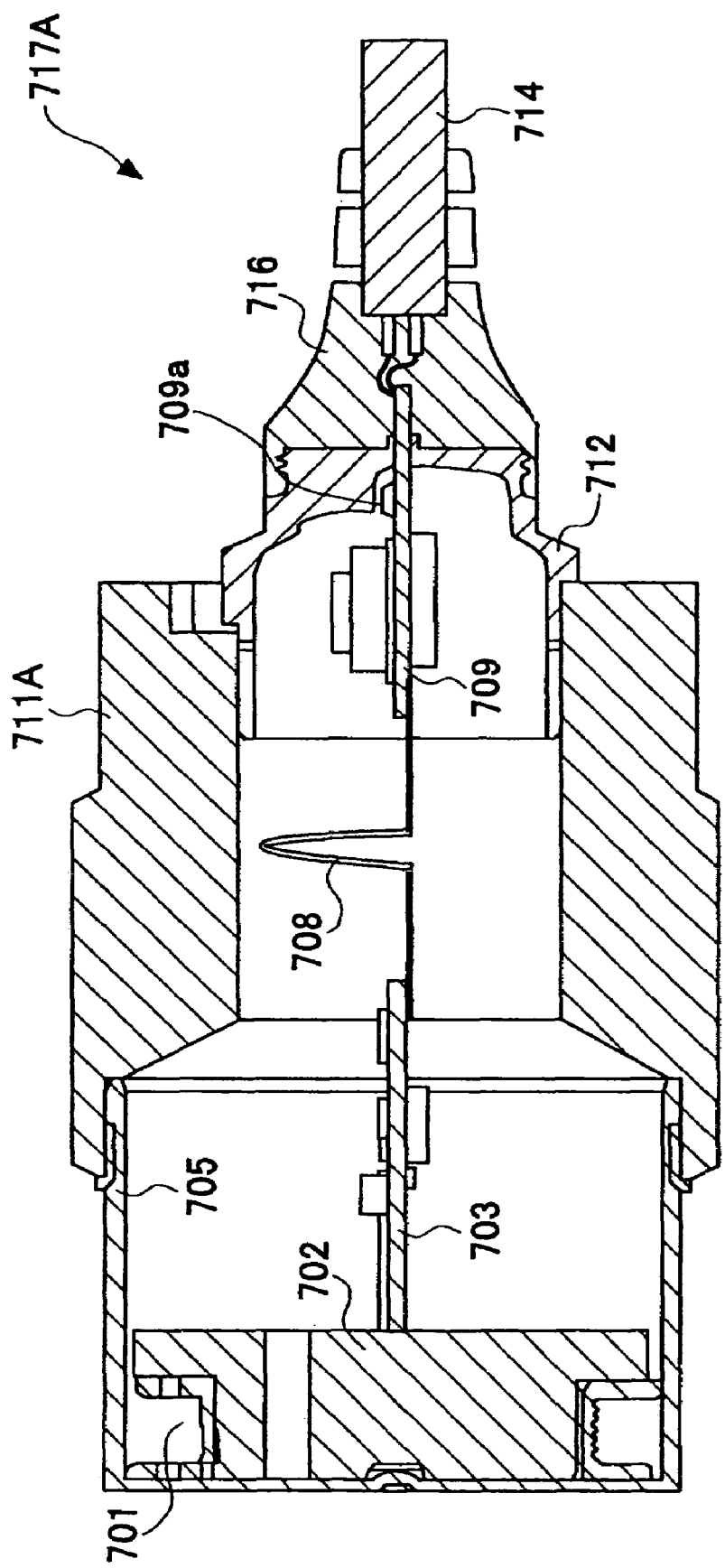
FIG. 43 is a sectional view of a proximity sensor of unshielded type having mounted thereon the body case of short type.
Figure 44:
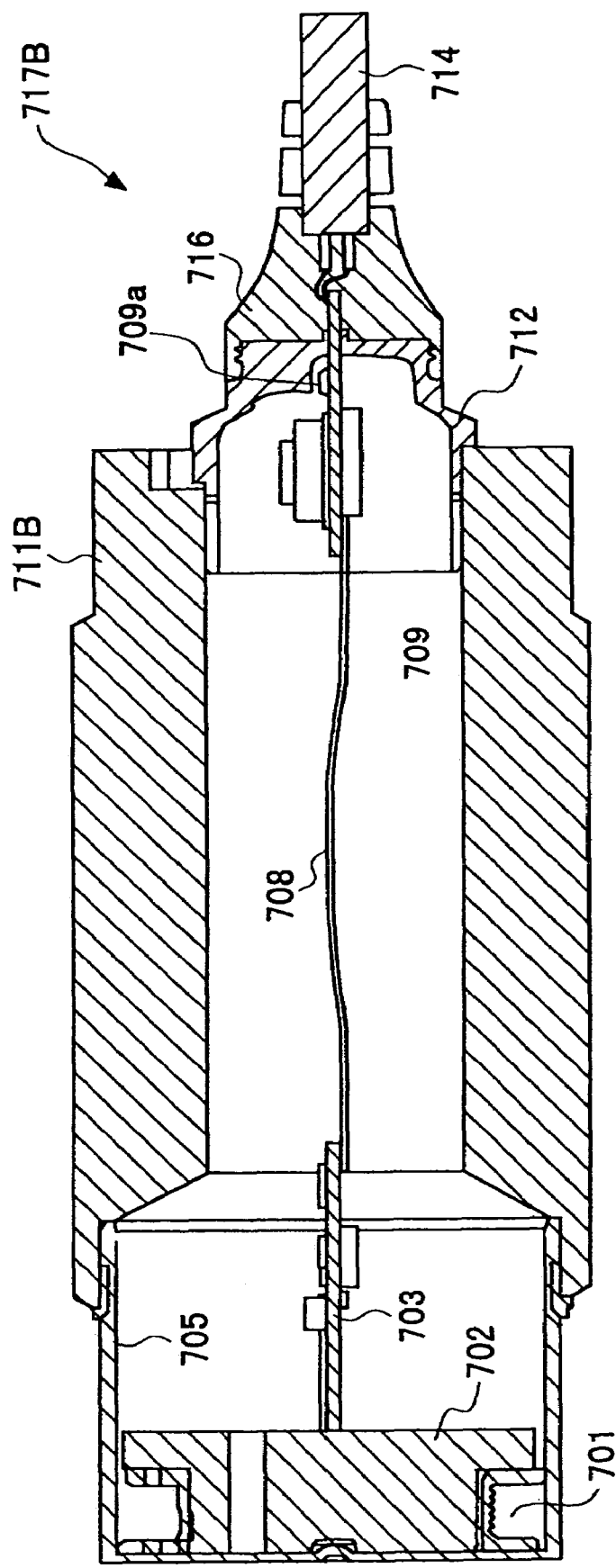
FIG. 44 is a sectional view of a proximity sensor of unshielded type having mounted thereon the body case of long type.

Next, the proximity sensor of unshielded type fabricated through steps (A) to (N) shown in FIG. 22 is shown in FIGS. 42 to 44.

FIG. 42 is a diagram showing the detail of the detection end module 707 of the proximity sensor of unshielded type. The configuration of the assembly parts (700 to 716) are similar to those of the shielded-type proximity sensor shown in FIG. 38.

In FIG. 42, (a) is a perspective view of the detection end module 707 of unshielded type, (b) a central sectional view of the detection end module 707, and (c) an enlarged view of the portion "B" indicated in (b).

The ferrite core 702 used in this case has a T-shaped cross section, and in the absence of the ferrite core 702 outside the coil spool 701, the shielding effect is lower, although the detection distance (detection performance) is improved over the shielded-type proximity sensor. Also in this case, a mask conductor 700 of the (flanged cylinder) type shown in FIG. 36 (modification of the fifth embodiment) above is arranged at the rear end portion of the outer peripheral surface of the coil case 705.

Sectional views of the proximity sensor of unshielded type in assembled form are shown in FIGS. 43 and 44. FIG. 43 represents a case in which the short body case 711A is used and FIG. 44 a case in which the long body case 711B is used. As apparently understood from these drawings, the proximity sensor of unshielded type has the forward end surface of the coil case 705 projected forward of the body case 711 as compared with the proximity sensor of shielded type.

Also in the proximity sensor of unshielded type, the body case of either long or short type can be mounted without changing the remaining parts configuration by using a common flexible connecting member 708. The connecting member 708 is similar to that used with the shielded-type proximity sensor and therefore will not be described in detail.

A model selection support method according to the invention will be explained as a business technique for sale of the proximity sensor described above.

Figure 45:
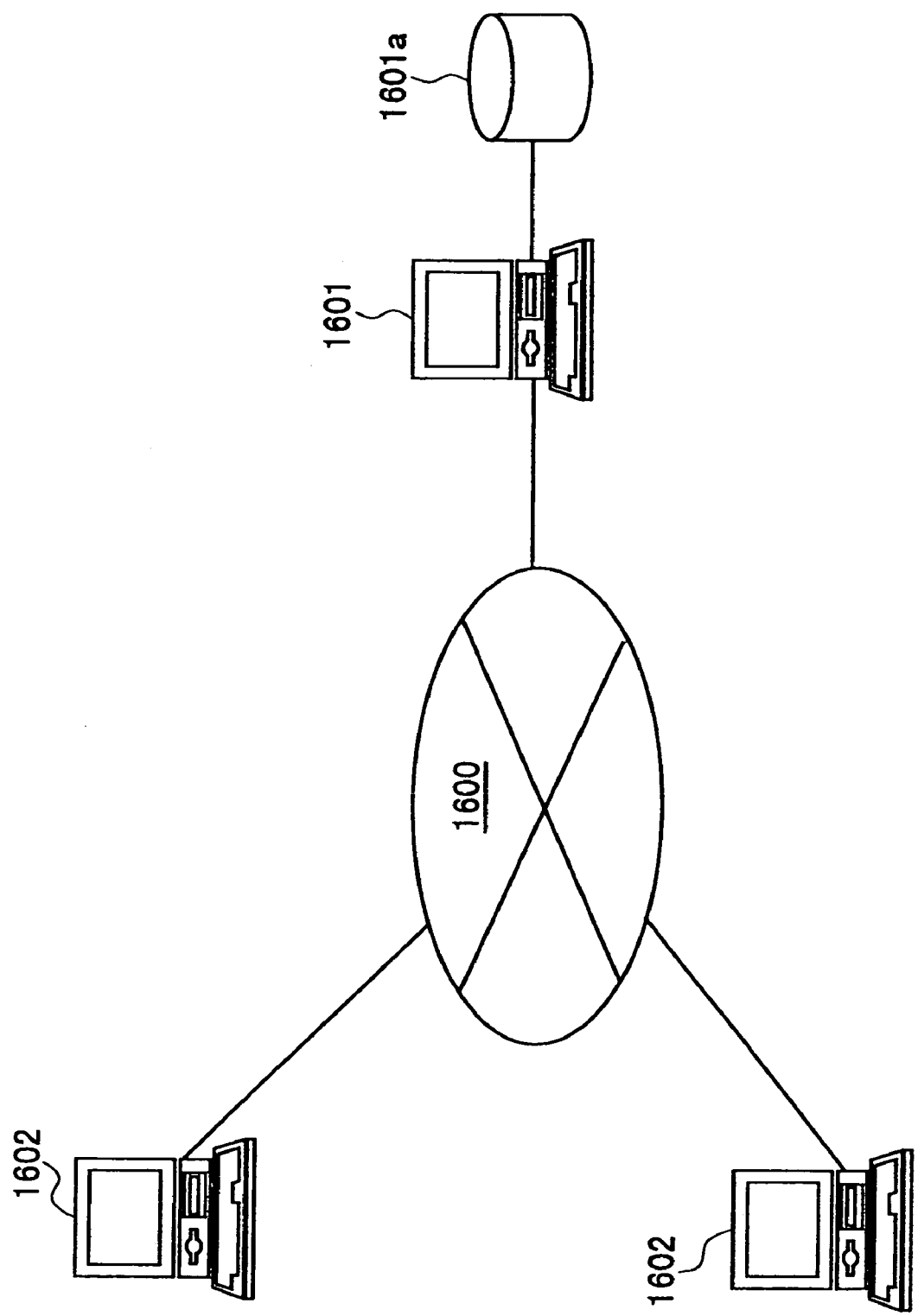
FIG. 45 is a diagram showing a general configuration of a model selection support system for realizing the model selection supporting method according to the invention.

FIG. 45 is a diagram showing a general configuration of a model selection support system for realizing a model selection support method according to an embodiment. First, an outline will be explained. This model selection support system is intended to support the customer in selecting the model of the sensor through the internet and to provide a proximity sensor of a model satisfying the specifications required by the customer by combining one each of a plurality of types of detection end modules, output circuit modules and the body cases.

As shown in the drawing, this model selection support system comprises a customer's computer terminal unit 1602, a support server 1601 for providing various Web pages described later to the customer's computer terminal unit 1602 to support the model selection, and a communication network (internet) 1600 connecting the customer's computer 1602 and the support server 1601.

The support server 1601 includes a model specification data base 1601a. This data base 1601a stores various specification data required to construct the contents of various Web pages for supporting the model selection.

The customer's computer terminal unit 1602 is a commercially available personal computer and displays the Web page supplied from the server by the customer's browsing operation.

FIG. 46 is a table showing a list of specifications of the detection end module prepared in the model selection support system according to this embodiment. In this embodiment, detection end modules (42 types in all) having the specification corresponding to the circle marks in the drawing are prepared.

In the drawing, "M8", "M12", "M18" and "M30" designate the types of outer diameter, and "distance range X1", "distance range X1.5" and "distance range X2" designate the types of detection distance, respectively. Each type of detection distance is further classified into four types of shielded, unshielded, reference frequency and different frequency.

The circle mark at the left upper corner, for example, indicates a detection end module having such a specification that the coil outer diameter is M8, the distance range is X1, shielded with reference frequency.

"M8" indicates that the size is suitable for the body case of specification M8. The same can be said of each of M12, M18 and M30.

"Shielded" indicates that the combination is possible with the body case of shield specification (shielded). "Unshielded" indicates that the combination is possible with the body case of non-shield specification (unshielded).

"Reference frequency" and "different frequency" concern the oscillation frequency of the detection circuit. Normally, a proximity sensor has the oscillation frequency specification corresponding to the reference frequency. In the case where it is desired to avoid the interference with other proximity sensors, however, a proximity sensor is used which has the oscillation frequency specification corresponding to a different frequency.

FIG. 47 is a diagram showing, in table form, the correspondence between the distance range magnification (X1, X1.5, X2) and the detection distance (mm).

"Distance range magnification" is a simple expression of the detection distance. As shown in FIG. 47, the three types of detection distance including magnifications expressed as X1, X1.5 and X2.0 in distance range are determined for each combination of outer diameter and shielded/unshielded type.

FIG. 48 is a diagram showing, in table form, a list of body case specifications usable for the model selection support system according to this embodiment. In this example, a plurality of body cases (22 types in all) having the specification corresponding to mark 0 in the drawing are made available.

In the drawing, "M8", "M12", "M18" and "M30" are types of outer diameter, "short body" and "long body" are specification types for the length of the body case. Each specification type is classified into four categories including "stainless steel", "brass", "shielded" and "unshielded".

"M8" indicates that the metric screw of M8 is formed on the outer surface of the body case. The same can be said also of "M12", "M18" and "M30".

"Stainless steel" and "brass" indicate the types of material of the body case.

"Shielded" indicates a body case for shielded type so shaped that the side surface portion of the coil case is covered. "Unshielded" indicates a body case for unshielded type so shaped that the side surface portion of the detection coil is exposed.

FIG. 49 is a diagram showing, in table form, a list of specifications of the output circuit module usable for the model selection support system according to this embodiment. In the drawing, output circuit modules are available each having a specification corresponding to mark ○. The marks ○ in vertical columns indicate the same types of output circuit modules. In other words, the same output circuit module is used for any outer diameter (M8 to M30). Therefore, the number of types of the output circuit modules is represented by the number of columns in the table, which is 15 in all as shown in the drawing.

In the drawing, "PNP open collector output", "NPN open collector output", "DC two-line", "NPN voltage output" and "PNP voltage output" indicate the specification types of the output status. By the way, the specifications other than "DC two-lines" are the output status of DC three-lines.

Further, the specification types based on the output status described above are each classified into four categories including "NO (normally open)"/"NC (normally closed)", "DC10-30V"/"DC10-55V", and "not self-diagnosed"/"self-diagnosed".

"NO (normally open)", "NC (normally closed)" are the specifications of the operating status, and "DC10-30V", "DC10-55V" are the specifications of the operating voltage range. "Self-diagnosed", "not self-diagnosed" indicate the presence or absence of the function to diagnose whether the device itself (proximity sensor) has developed a malfunction of a predetermined sort and report the result to external devices.

According to this embodiment, a proximity sensor can be constructed by further selecting one of a plurality of connection methods available. FIG. 50 shows, in table form, a list of specifications of the connection methods available for the model selection support system according to this embodiment.

In the drawing, the connection methods (22 types) having the specifications corresponding to marks ○ are available. The specification of the connection method can be designated by the outer diameter (M8 to M30) and includes "prewire 2 m", "prewire 5 m", "special cable 2 m", "connector relay M12", "M12 connector 4 pin", "connector relay M8" and "M8 connector 4 pin".

"Prewire 2 m" and "prewire 5 m" indicate cord lead methods having cords of 2 m and 5 m, respectively. "Special cable 2 m" indicates a cord lead method having a special cable 2 m long. "Connector relay M12" and "M12 connector 4 pin", "connector relay M8" and "M8 connector 4 pin" indicate connector connection methods in terms of the types of connector used.

The contents of the data by sensor model stored in the model specification data base 1601a are shown, in table form, in FIG. 51.

In the drawing, "sensor 1", "sensor 2" and "sensor 3" indicate the serial numbers of the available models of the proximity sensors by the combinations of the specifications for each part described above. By the way, the same drawing shows only up to "sensor 3". Actually, however, there are more than ten thousand sensor models. The contents of the specifications (detection method, shape, etc. indicated in the column "item" in the drawing) for each sensor model are registered in this data base. In addition to the specifications, the type (model name, expressed as "catalog type" in FIG. 51), standard price, standard model in stock or order production model are also registered in the column of "item".

The contents of the detection end module specification data, the body case specification data and the output circuit module specification data for producing the data base (model specification data base) of FIG. 51 are shown in the table of FIG. 52.

As shown by (a) in this drawing, according to this embodiment, the specification data are prepared for each type of the detection end module. This is also the case with the body case and the output circuit module (See (b) and (c) in the drawing). Though not shown, the specification data are prepared similarly for the connection methods. These specification data will hereinafter be referred to collectively as the module specification data. The module specification data are stored in the storage unit of a given computer (not limited to the server shown in FIG. 1) on the part of the proximity sensor supplier.

The model specification data base shown in FIG. 51 is produced by combining the module specification data using the computer in correspondence with the available combinations of the detection end module, the body case, the output circuit module and the connection method. A method of producing the model specification data base according to the invention will be explained below.

The combinations of the module specification data are varied depending on the "item" of the model specification data base. For many items of the model specification data base, the contents of the items of the specification data for any of the detection end module, the body case, the output circuit module and the connection method are copied as they are.

For a part of the items of the model specification data base, the specification value of the proximity sensor may be determined by calculating the numerical values of a plurality of specification data. The current consumed by the proximity sensor, for example, is determined by adding the consumed current of the detection end module and the consumed current of the output circuit module. In such a case, rules are laid down in advance as to which item of the model specification data base is copied from which item of the module specification data, and which item of the model specification data is determined by what calculations.

The contents of some items of the model specification data base are input separately without being determined based on the specification data. The standard price and the standard model in stock or the order production model described above are examples. The type, on the other hand, is automatically produced from the specification data by laying down the naming rule based on the specifications of the proximity sensor.

The availability of a specific combination of the detection end module, the body case, the output circuit module and the connection method is determined by referring to the prohibit information stored in the storage unit of the computer on the part of the supplier.

One of the prohibit information concerns a combination of the detection end module and the body case. The prohibit information in this case include, for example, the following conditions, and a given combination that meets the conditions is "prohibited":

"Outer diameter (size) is different"

"Different in shielded type or unshielded type"

The prohibit information are also prepared as required for the combination of the detection end module and the output circuit module, the combination of the body case and the connection method, and the combination of the body case and the output circuit module.

The computer program for executing the above-mentioned method of producing the model specification data base is prepared in the storage unit of the proximity sensor supplier, and by executing this program, the model specification data base 1601a is produced.

Figure 53:
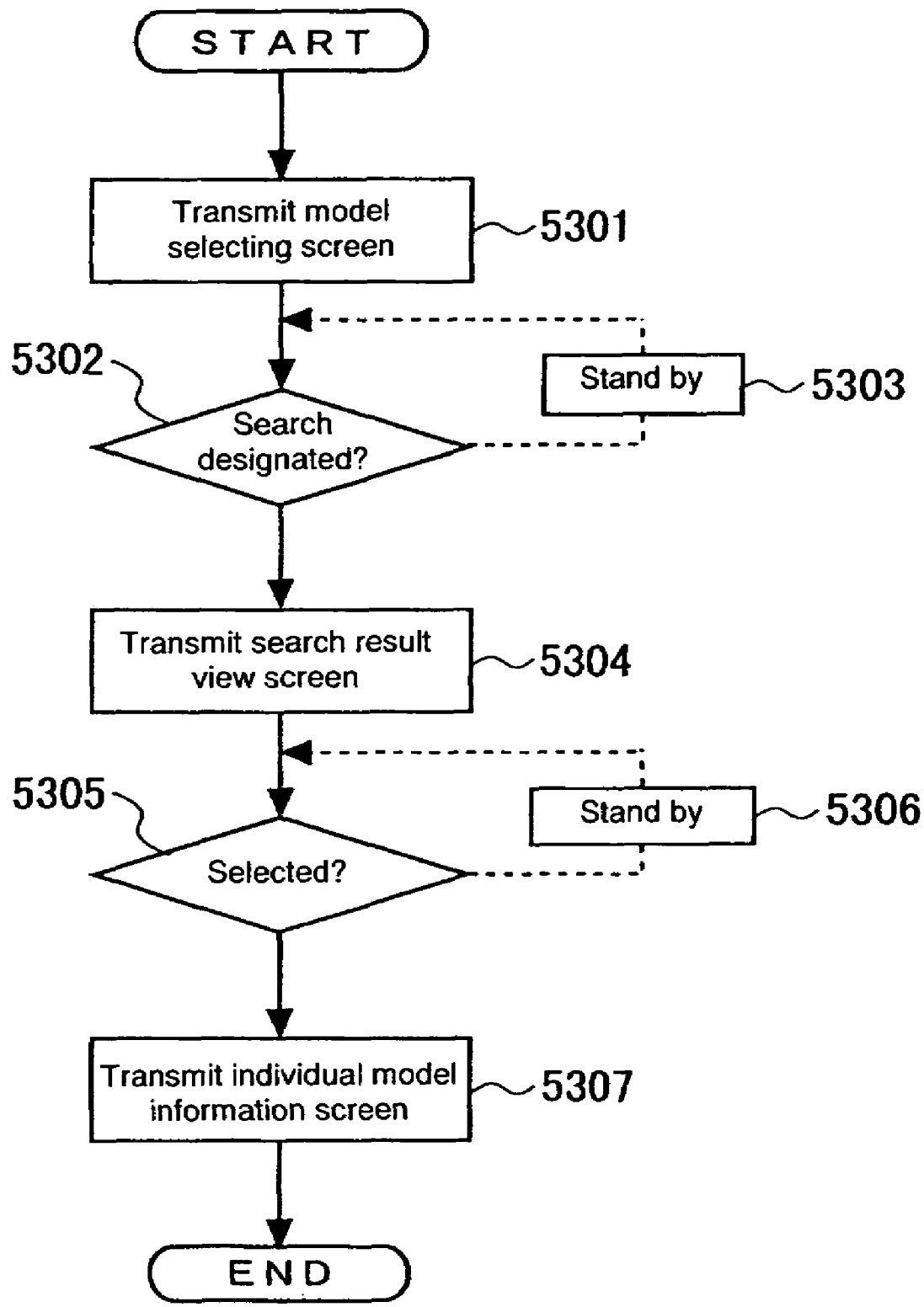
FIG. 53 is a flowchart showing an outline of the contents of the operation of a server making up the model selection support system.

An outline of the detailed operation of the server 1601 for supporting the model selection is shown in the flowchart of FIG. 53. The server 1601, at the request of the customer's computer, transmits the Web screen for model selection to the customer's computer first of all (step 5301).

Figure 54:
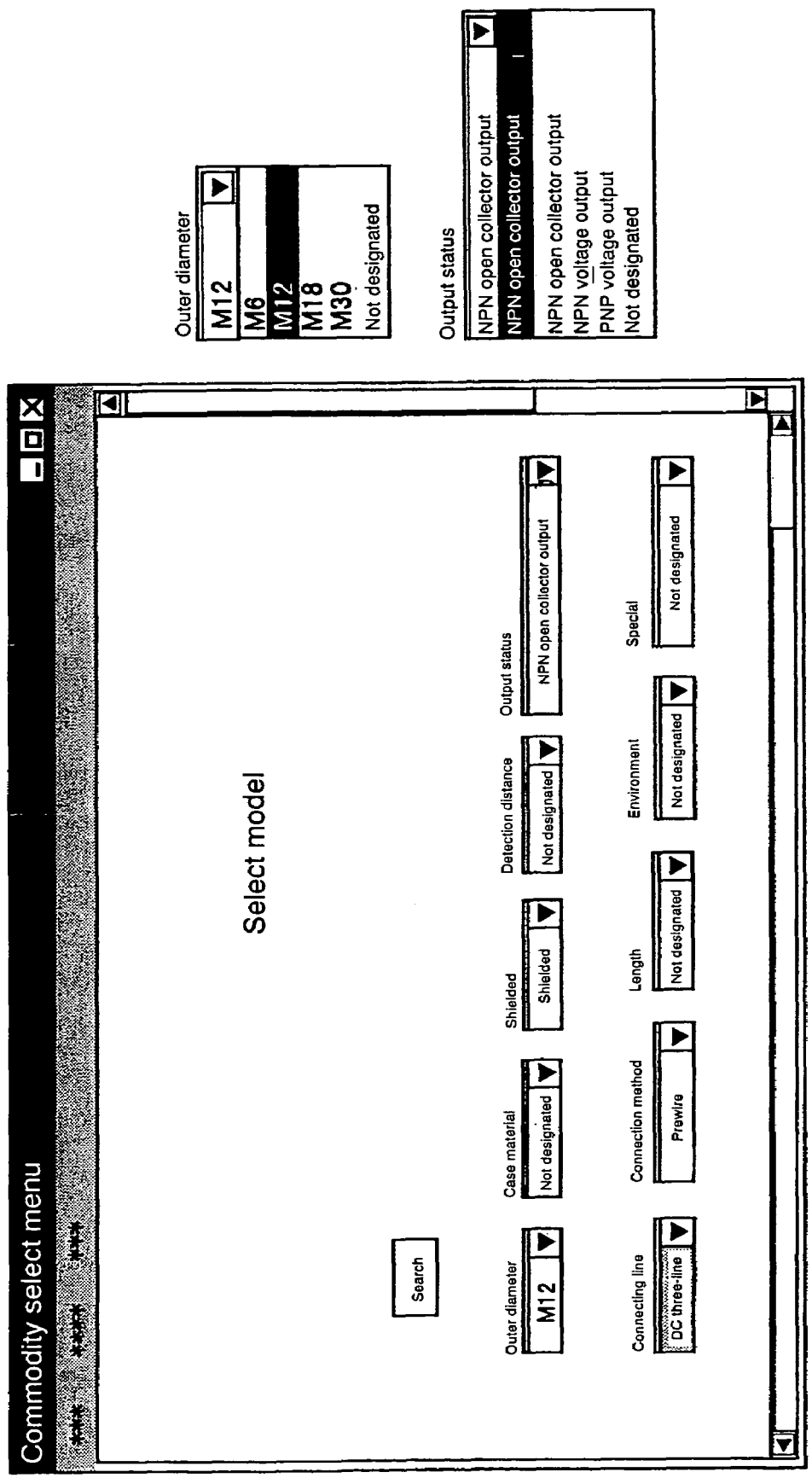
FIG. 54 is a diagram showing an example of the model select screen displayed on the customer's computer.

An example of the model selection screen displayed on the customer's computer 1602 is shown in FIG. 54. A plurality of specification items (outer diameter, case material, shield, detection distance, etc.) are displayed on the model selection screen. The customer selects the desired contents of the specification from the pull-down menu prepared for each specification item. The specification items "outer diameter" and "output status" are displayed in vertical arrangement on the right side of the drawing as display examples of the pull-down menu. Also, a list of the specification contents prepared for each specification item are shown as a table in FIG. 55.

By the way, "detection distance" constituting one of the specification items in FIG. 55 is designated with the distance range. In this case, the proximity sensor located in the range for which the detection distance specification is designated is retrieved.

In the example under consideration, "not designated" is first displayed for every specification item. The customer can input only the specification item considered important for his/her applications, and upon complete input operation, clicks the "retrieve" button on the model selection screen shown in FIG. 54 thus giving an instruction to execute the retrieval (step 5302 in the flowchart of FIG. 53). As a result, the server 1601 searches the model specification data base 1601a for the sensor model meeting the specifications/conditions thus input, and transmits the search result screen to the customer's computer 1602 (step 5304).

An example of the search result screen displayed on the customer's computer 1602 is shown in FIG. 56. This example represents a case in which the input specifications/conditions are met by four sensor models. The type name (E2E-X7D1, etc.) is displayed on the left side of the screen as identification information for the sensor model.

The operation status (NO, NC) cannot be input on the model selection screen shown in FIG. 54 (fails to correspond to a part of the specifications/conditions that can be input). As shown in FIG. 56, however, the operation status (NO, NC) is indicated on the specifications/conditions search result screen. In the case where the sensor model is the standard model in stock, the item "standard stock" is marked (by ◎ in this example) and displayed on the upper stage of the list preferentially. The model carrying no mark of standard model in stock, which is an order production model, is displayed at a lower stage than the standard model in stock. Also, the delivery time of each model is also displayed in the case under consideration.

In the present case, a ordering method (purchase method) is guided through the search result screen in such a way as "Place your commodity order at ○○ Co., Ltd.". The portion "○○ Co., Ltd." is set in the link to the Web page of the particular company.

The customer clicks the portion where the type name such as "E2E-X7D1" is displayed on the search result screen. Then, the server 1601 transmits the individual information of the model specified by the selected type name (step 5307 in the flowchart of FIG. 53). As a result, the customer's computer displays the individual model information screen. In the case where the "return" button is clicked by the customer on the search result screen, on the other hand, the model selection screen (FIG. 54) is displayed again on the customer's computer terminal unit 1602.

Figure 57:
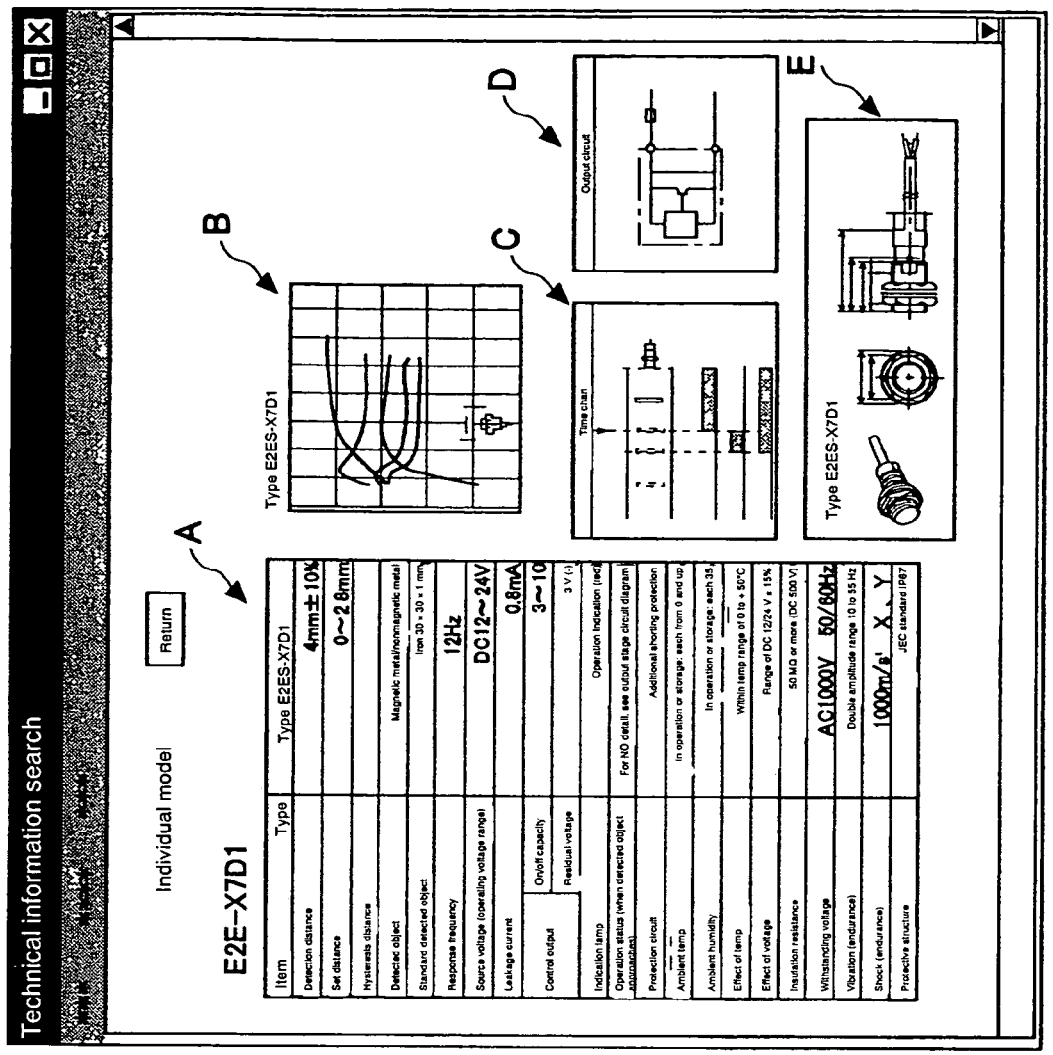
FIG. 57 is a diagram showing an example of the individual model information screen displayed on the customer's computer.

An example of the individual model information screen is shown in FIG. 57. The information displayed on the aforementioned screen A in the drawing include a specification table designated by character A, a detection characteristic graph designated by character B (a graph in which the abscissa represents the length of one side of the detection distance and the ordinate the distance, with the object material as a parameter), a time chart designated by character C (a graph in which the abscissa represents the distance to the detection distance for indicating the on/off state of the setting indication lamp and the operation indication lamp and the on/off state of the control output), a circuit diagram showing an output circuit method designated by character D and dimensions designated by character E. In the case where the "return" button is selected (clicked) on this screen, the search result screen shown in FIG. 54 is displayed again.

The customer can easily select the desired model of the proximity sensor through this model selection support system. Also, the model selection support system according to this embodiment uses the internet, and therefore can be utilized by every person freely at any time. It is of course possible to set a system which can be operated using a password or the like only by those who have signed an agreement.

Various methods of commodity purchase proposal after model selection are applicable. A purchase proposal may be submitted through the model selection support system, for example, by electronic mail, telephone, facsimile or ordinary mail. As another example, a model meeting the specifications/conditions is submitted through the customer's computer 1602, and then the particular purchase proposal for the submitted model is accepted on the internet. Various other methods may be conceivable by those skilled in the art.

Finally, the details (contents) of the detection characteristic graphs for the proximity sensors (detection coil assembly) shown in FIGS. 2, 4, 7 and 9 will be explained. To facilitate the understanding of the invention further, some of the foregoing description may be repeated. The detection characteristic graphs based on actual measurements are shown for both the conventional proximity sensor (See FIG. 58(a)) and the proximity sensor according to the invention, and by comparing them with each other, the practical applicability of the invention will be verified in the form of embodiments.

Figure 59:
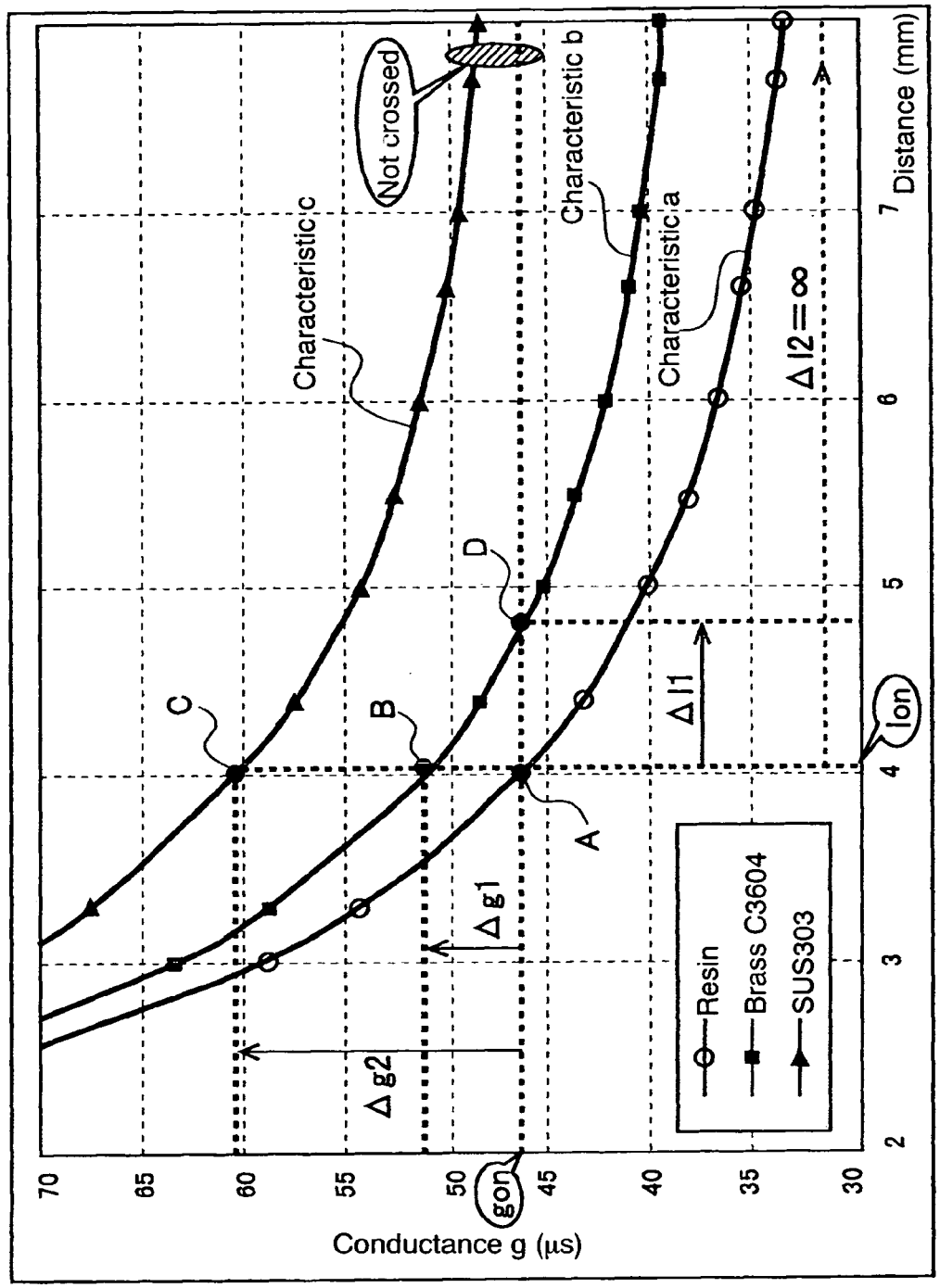
FIG. 59 is a graph showing the detection characteristic obtained using the conventional proximity sensor.
Figure 60:
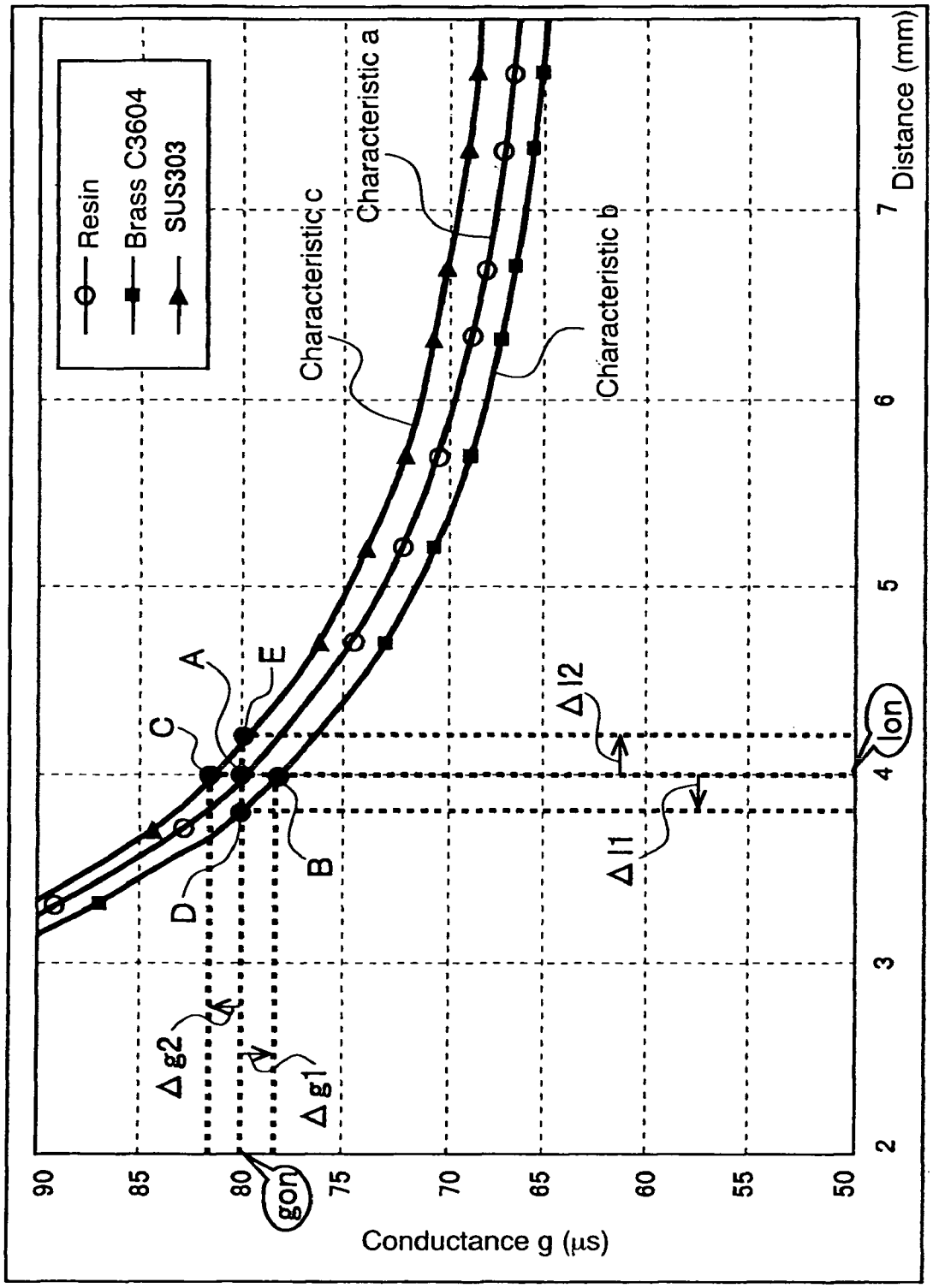
FIG. 60 is a graph showing the detection characteristic obtained using the proximity sensor according to the invention.

FIG. 59 is a detection characteristic graph obtained using the conventional proximity sensor, and FIG. 60 is the detection characteristic graph obtained using the proximity sensor according to the invention. The conventional proximity sensor employs the detection coil assembly 1000 schematically shown in FIG. 58(a). The proximity sensor according to the invention, on the other hand, uses the detection coil assembly 404 shown in FIG. 36. Both detection coil assemblies are of unshielded type, the only difference being the presence or absence of the mask conductor 4100.

The terms used in the detection characteristic graph are defined as follows: "In": Distance (abscissa in graph (mm)) from the detection surface of the proximity sensor to an arbitrary object of detection (character M1 in FIG. 58) "Ion": In the yes-or-no (binary) type proximity sensor, the distance (rated detection distance) to the object of detection (character M2 in the drawing) when output is inverted "g": Conductance value (ordinate in graph (g)) across the LC resonance circuit configured by connecting the coil 1001 (401) of the detection coil assembly to the resonance capacitor 1006 (505) as shown in FIG. 58(*b*) "gon": In the yes-or-no type proximity sensor, the conductance value (threshold value) when the output is inverted In the detection characteristic graph (FIGS. 59, 60), the curve indicated as "characteristic a" represents the change in the conductance value (g) when measurement is taken using the body case of resin, the curve indicated as "characteristic b" the change in the conductance value (g) when measurement is taken using the body case of brass C3604, and the curve indicated as "characteristic c" the change in the conductance value (g) when measurement is taken using the body case of stainless steel SUS303.

The point A on the curve of characteristic a, the point B on the curve of characteristic b and the point C on the curve of characteristic c represent the crossing points between a straight line In=4 (mm) and the respective characteristic curves. The point D on the curve of characteristic b and the point E on the curve of characteristic c, on the other hand, represent the crossing points between a straight line g=gon and the respective characteristic curves.

Take as an example a case in which the threshold value gon is set in such a manner that the rated detection distance Ion is 4 mm for the body case of resin.

As shown in FIG. 59, with the conventional proximity sensor having the body case of brass, the detection distance is 4.8 mm as indicated by the point D on the curve of characteristic b for the same threshold value gon. Specifically, as compared with the body case of resin, the detection distance is 0.8 mm ($\Delta$I1) longer. With the conventional proximity sensor having the body case of stainless steel, on the other hand, the curve of characteristic c and the straight line "(g) =gon" fail to cross each other for the same threshold value gon. Specifically, the detection distance become longer by $\infty$mm ($\Delta$I2) than when the body case of resin is used.

As described above, with the conventional proximity sensor, the variation $\Delta$I of the detection distance due to the difference of the body case is as large as ±20% (0.8 mm to $\infty$/4.0 mm) or more. The rated detection distance Ion (4 mm) is required to be adjusted by increasing the threshold value gon by $\Delta$g1 (difference of conductance value between points A and B) in the case where the body case of brass is used, and by increasing the threshold value gon by $\Delta$g2 (difference of conductance value between points C and A) in the case where the body case of stainless steel is used.

In the proximity sensor according to this invention, by contrast, as shown in FIG. 60, the detection distance for the body case of brass is 3.8 mm (point D) and the detection distance for the body case of stainless steel is 4.2 mm (point E in FIG. 60), the threshold value gon being constant. It is thus seen that as compared with the figure of 4 mm for the body case of resin, the difference is as small as ±0.2 mm ($\Delta$I1, $\Delta$I2). Specifically, the detection distance variation $\Delta$I of ±5% (one fourth of the value for the prior art) due to the difference of the material of the body case is achieved. This substantiates the fact that the detection characteristic of the proximity sensor according to the invention is not substantially affected by the material of the body case as compared with the conventional proximity sensor having no mask conductor.

According to the invention, therefore, the bothersome labor of readjusting the rated detection distance Ion by changing the threshold value gon after mounting the body case is eliminated, with the result that as described above, various effects are produced. For example, (1) the cost and number of design steps are reduced, (2) the parts can be concentrated and therefore the parts cost can be reduced, (3) the proximity sensors of different models can be produced on the same production line and through the same steps, (4) the variations of the detection distance can be reduced, (5) relative positions of the sensor portion and the body case can be set easily for assembly, and (6) the method of adjusting the detection distance can be simplified.

INDUSTRIAL APPLICABILITY

It will thus be understood from the foregoing description that according to the invention, there is provided a useful induction-type proximity sensor for detecting the approach of a metal object or the like in contactless fashion through a magnetic field. Especially, the proximity sensor according to the invention is suitable for offering a wealth of product lines in keeping with the user needs in versatile way while at the same time suppressing the production cost.

The invention claimed is:

1. A proximity sensor comprising:
   a detection end module constituting an integrated arrangement including a detection coil assembly having a coil and a core, a detection circuit assembly having an oscillation circuit with said coil as a resonance circuit element for outputting an object detection signal corresponding to the oscillation condition of said oscillation circuit, and a conductor mask for reducing the effect of an outer shell case on the detection characteristic; and
   an output circuit module having built therein an output circuit for driving an output element based on said object detection signal,
   wherein a detection characteristic of said detection coil assembly is self-completed with said mask conductor.

2. The detection end module used for a proximity sensor according to claim 1, wherein said conductor mask is arranged in a coil case for accommodating said coil and said core and constitutes selected one of a conductive cylindrical member and a conductive annular member surrounding said coil and said core.

3. The detection end module used for a proximity sensor according to claim 1, wherein said conductor mask is arranged in a coil case and constitutes a conductive closing plate for accommodating said coil and said core and partitioning the back of said coil and said core.

4. The detection end module used for a proximity sensor according to claim 1, wherein said conductor mask is arranged outside of a coil case for accommodating said coil and said core and constitutes selected one of a conductive cylindrical member and a conductive annular member surrounding said coil and said core.

5. The proximity sensor according to claim 1, further comprising:
   an output circuit module support member for supporting said output circuit module;
   a cylindrical outer shell case with said detection end module mounted at one end thereof and with said output circuit module support member mounted at the other end thereof, thereby holding said detection end module and said output circuit module in spaced relation with each other; and a connecting member interposed between said detection end module and said output circuit module for electrically connecting said two modules.

6. A method of producing a proximity sensor, comprising:

a step of selecting one of a plurality of types of detection end modules each constituting an integrated arrangement including a detection coil assembly having a coil and a core, a detection circuit assembly having an oscillation circuit with said coil as an oscillation circuit element for outputting an object detection signal corresponding to the oscillation condition of said oscillation circuit and a conductor mask for reducing the effect of an outer shell case on the detection characteristic;

a step of selecting one of a plurality of types of outer shell cases adapted to be combined with said detection end module; and a step of mounting said one of said outer shell cases on said detection end module, wherein a product is shipped without adjusting the sensitivity of said detection end module for adaptation to said selected outer shell case.

7. A proximity sensor comprising:

a detection end module constituting an integrated arrangement including a detection coil assembly having a coil and a core, a detection circuit assembly having an oscillation circuit with said coil as a resonance circuit element for outputting an object detection signal corresponding to the oscillation condition of said oscillation circuit, a coil case providing a housing for the coil and the core of the detection end module, and a body case providing a housing for all components of the detection end module, and a conductor mask for reducing the effect of an outer shell case on the detection characteristic, the conductor mask having an annular shape and being sandwiched between the coil case and the body case; and an output circuit module having built therein an output circuit for driving an output element based on said object detection signal.

8. The proximity sensor according to claim 7, wherein the conductor mask has a flanged end and a non-flanged end, the flanged end being disposed at a location further from the output circuit module than the non-flanged end.

9. The proximity sensor according to claim 7, wherein the conductor mask is made of brass, copper or aluminum.

10. The proximity sensor according to claim 7, further comprising:

a variable resistor provided between the detection end module and the output circuit module, wherein a resistance of the variable resistor is controlled by the detection end module, to provide for sensitivity adjustment of the proximity sensor.

11. The proximity sensor according to claim 7, wherein the coil case is made of epoxy resin.

12. The proximity sensor according to claim 7, wherein the conductor mask is sandwiched between the coil case and the body case, with no air space provide therebetween.

13. A method of producing a proximity sensor, comprising:

a step of selecting one of a plurality of types of detection end modules each constituting an integrated arrangement including a detection coil assembly having a coil and a core, a detection circuit assembly having an oscillation circuit with said coil as an oscillation circuit element for outputting an object detection signal corresponding to the oscillation condition of said oscillation circuit and a conductor mask for reducing the effect of an outer shell case on the detection characteristic, a coil case providing a housing for the coil and the core of the detection end module, and a body case providing a housing for all components of the detection end module, the conductor mask having an annular shape and being sandwiched between the coil case and the body case;

the step of selecting one of a plurality of types of output circuit modules each having built therein an output circuit for driving an output element based on the object detection signal; and the step of connecting said two modules electrically to each other.

14. The method according to claim 13, wherein the conductor mask has a flanged end and a non-flanged end, the flanged end being disposed at a location further from the output circuit module than the non-flanged end.

15. The method according to claim 13, wherein the conductor mask is made of brass, copper or aluminum.

16. The method according to claim 13, further comprising:

a step of providing a variable resistor between the detection end module and the output circuit module, wherein a resistance of the variable resistor is controlled by the detection end module, to provide for sensitivity adjustment of the proximity sensor.

17. The method according to claim 13, wherein the coil case is made of epoxy resin.

18. The method according to claim 13, wherein the conductor mask is sandwiched between the coil case and the body case, with no air space provided therebetween.

* * * * *